(12) United States Patent
Shimomura

(10) Patent No.: US 9,450,086 B2
(45) Date of Patent: Sep. 20, 2016

(54) SEMICONDUCTOR DEVICE

(71) Applicant: Renesas Electronics Corporation, Kanagawa (JP)

(72) Inventor: Saya Shimomura, Kanagawa (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 14/642,793

(22) Filed: Mar. 10, 2015

(65) Prior Publication Data

US 2015/0270385 A1    Sep. 24, 2015

(30) Foreign Application Priority Data

Mar. 24, 2014  (JP) ................. 2014-059846

(51) Int. Cl.
| | |
|---|---|
| H01L 29/78 | (2006.01) |
| H01L 29/06 | (2006.01) |
| H01L 29/10 | (2006.01) |
| H01L 29/417 | (2006.01) |
| H01L 29/66 | (2006.01) |

(52) U.S. Cl.
CPC ....... *H01L 29/7813* (2013.01); *H01L 29/0696* (2013.01); *H01L 29/1095* (2013.01); *H01L 29/41766* (2013.01); *H01L 29/66727* (2013.01); *H01L 29/66734* (2013.01)

(58) Field of Classification Search
CPC ........... H01L 29/7813; H01L 29/0696; H01L 29/1095; H01L 29/36; H01L 29/4236
See application file for complete search history.

(56) References Cited

U.S. PATENT DOCUMENTS

| | | | |
|---|---|---|---|
| 7,910,439 B2* | 3/2011 | Darwish ........... | H01L 29/41766 438/197 |
| 8,859,365 B2* | 10/2014 | Okumura ............ | H01L 21/2257 257/326 |
| 9,219,148 B2* | 12/2015 | Shin .................... | H01L 29/7827 |
| 2008/0246081 A1 | 10/2008 | Li et al. | |

FOREIGN PATENT DOCUMENTS

JP    2010-534921 A    11/2010

* cited by examiner

*Primary Examiner* — Fernando L Toledo
*Assistant Examiner* — Neil Prasad
(74) *Attorney, Agent, or Firm* — Mattingly & Malur, P.C.

(57) ABSTRACT

To enhance a semiconductor device. A semiconductor device has a plurality of $p^+$-type semiconductor regions disposed between the mutually adjacent two gate trenches, in a cell region. The $p^+$ type semiconductor regions are disposed spaced apart from each other, in plan view, in a p-type body layer in a portion positioned between the mutually adjacent two gate trenches. Any of a p-type impurity concentration in each of the $p^+$ type semiconductor regions is higher than the p-type impurity concentration in the p-type body layer.

19 Claims, 26 Drawing Sheets

SEMICONDUCTOR DEVICE

CROSS-REFERENCE TO RELATED APPLICATION

The disclosure of Japanese Patent Application No. 2014-059846 filed on Mar. 24, 2014 including the specification, drawings and abstract is incorporated herein by reference in its entirety.

BACKGROUND

The present invention relates to a semiconductor device, for example, relates to one capable of being preferably utilized for a semiconductor device including a vertical MISFET (Metal Insulator Semiconductor Field Effect Transistor).

A transistor for high-power use that can treat electric power of several watts or more is referred to as a power transistor, and, as such power transistors, there are transistors having various structures such as a power MISFET. Furthermore, as the power MISFET, a so-called vertical MISFET in which an electric current flows in the thickness direction of a semiconductor substrate and a so-called horizontal MISFET in which an electric current flows along the upper surface of a semiconductor substrate are used.

As the above-described vertical MISFET, there exist a vertical MISFET of a trench gate type having a gate electrode embedded in the inside of a gate trench and a vertical MISFET of a planar type having a gate electrode formed along the upper surface of a semiconductor substrate. Among these, the vertical MISFET of a trench gate type is advantageous as compared with the vertical MISFET of a planar type in that a so-called parasitic JFET (Junction Field Effect Transistor) resistance component can be made smaller, and the development of it is being advanced.

In Published Japanese translation of PCT patent application No. 2010-534921 (Patent Literature 1), a vertical MISFET of a trench gate type including a drain region, a body region, a gate region, a gate insulator region, a source region, and a source/body contact plug is disclosed. In the vertical MISFET disclosed in Patent Literature 1, a body contact region is disposed in the body region adjacent to the source/body contact plug.

SUMMARY

In a semiconductor device including a vertical MISFET, due to the increase in the intensity of an electric field in the periphery of the bottom portion of a gate trench, a breakdown voltage lowers easily. Generally, in semiconductor devices provided with a PN junction, the enhancement of a breakdown voltage and the reduction of ON resistance have a trade-off relation mutually. Accordingly, in semiconductor devices including a vertical MISFET, there is a risk that ON resistance may increase in order to obtain a necessary breakdown voltage, and thus the performance of the semiconductor device lowers.

The other subjects and the new feature will become clear from the description of the present specification and the accompanying drawings.

According to one embodiment, the semiconductor device has a plurality of $p^+$-type semiconductor regions disposed between mutually adjacent two gate trenches, in a cell region in which a vertical MISFET of a trench gate type is formed. The $p^+$-type semiconductor regions are disposed, in plan view, spaced apart from each other in a p-type body layer of a portion positioned between the mutually adjacent two gate trenches. Any of p-type impurity concentrations in each of the $p^+$-type semiconductor regions is higher than the p-type impurity concentration in the p-type body layer.

In addition, according to another embodiment, the semiconductor device has a $p^+$-type semiconductor region disposed in the periphery of the outermost peripheral gate trench in a gate wiring-lead-out region from which gate wiring of a vertical MISFET of a trench gate type is lead out. The $p^+$-type semiconductor region is formed, in plan view, in a p-type well layer of a portion positioned in the periphery of the outermost peripheral gate trench. The p-type impurity concentration in the $p^+$-type semiconductor region is higher than the p-type impurity concentration in the p-type well layer.

According to one embodiment, the performance of the semiconductor device can be enhanced.

DETAILED DESCRIPTION

Figure 1:
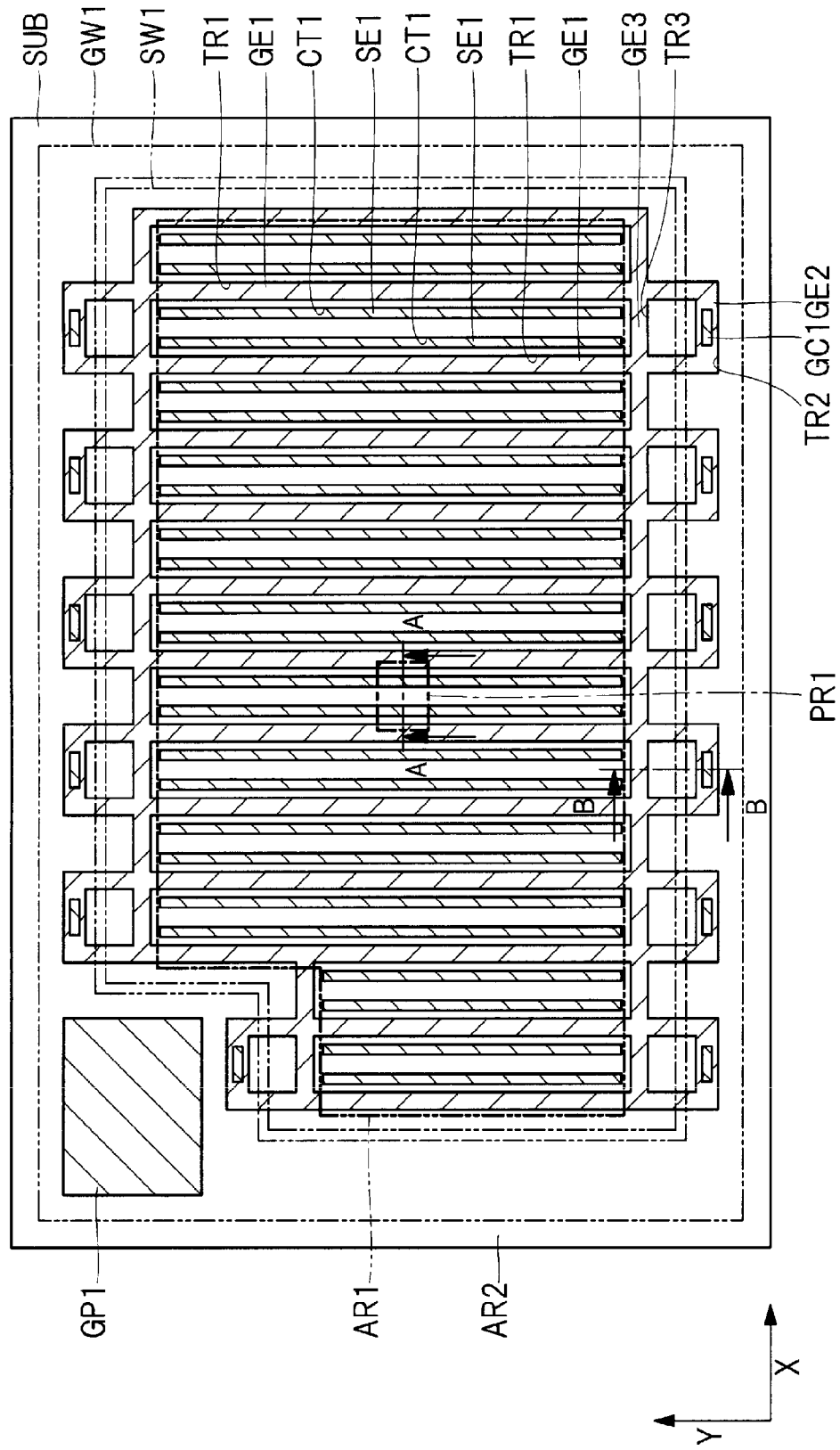
FIG. 1 is a top view of a semiconductor chip in which the semiconductor device of a First Embodiment is formed.

The following embodiments will be explained, divided into plural sections or embodiments, if necessary for convenience. Except for the case where it shows clearly in particular, they are not mutually unrelated and one has relationships such as a modification, details, and supplementary explanation of the whole or part of another.

In the following embodiments, when referring to the number of elements, etc. (including the number, a numeric value, an amount, a range, etc.), they may be not restricted to the specific number but may be greater or smaller than the specific number, except for the case where they are clearly specified in particular and where they are clearly restricted to a specific number theoretically.

Furthermore, in the following embodiments, it is needless to say that an element (including an element step etc.) is not necessarily indispensable, except for the case where it is clearly specified in particular and where it is considered to be clearly indispensable from a theoretical point of view, etc. Similarly, in the following embodiments, when shape, position relationship, etc. of an element etc. is referred to, what resembles or is similar to the shape substantially shall be included, except for the case where it is clearly specified in particular and where it is considered to be clearly not right from a theoretical point of view. This statement also applies to the above-described numeric value and range.

Hereinafter, representative embodiments will be explained in detail based on the drawings. Meanwhile, in all the drawings for explaining embodiments, the same symbol is attached to the members having the same function and the repeated explanation thereof is omitted. Further, in the following embodiments, the explanation of the same or similar portions will be not repeated as a principle, unless it is particularly necessary.

Furthermore, in the drawings for use in the embodiments, in order to make a drawing intelligible, hatching may be omitted even if it is a cross-sectional view. In order to make a drawing intelligible, hatching may be attached even if it is a plan view.

First Embodiment

Semiconductor Device

The semiconductor device of a First Embodiment of the present invention will be explained while referring to the drawings. The semiconductor device of the First Embodiment is, for example, a vertical MISFET of an n-channel type trench gate type.

Figure 2:
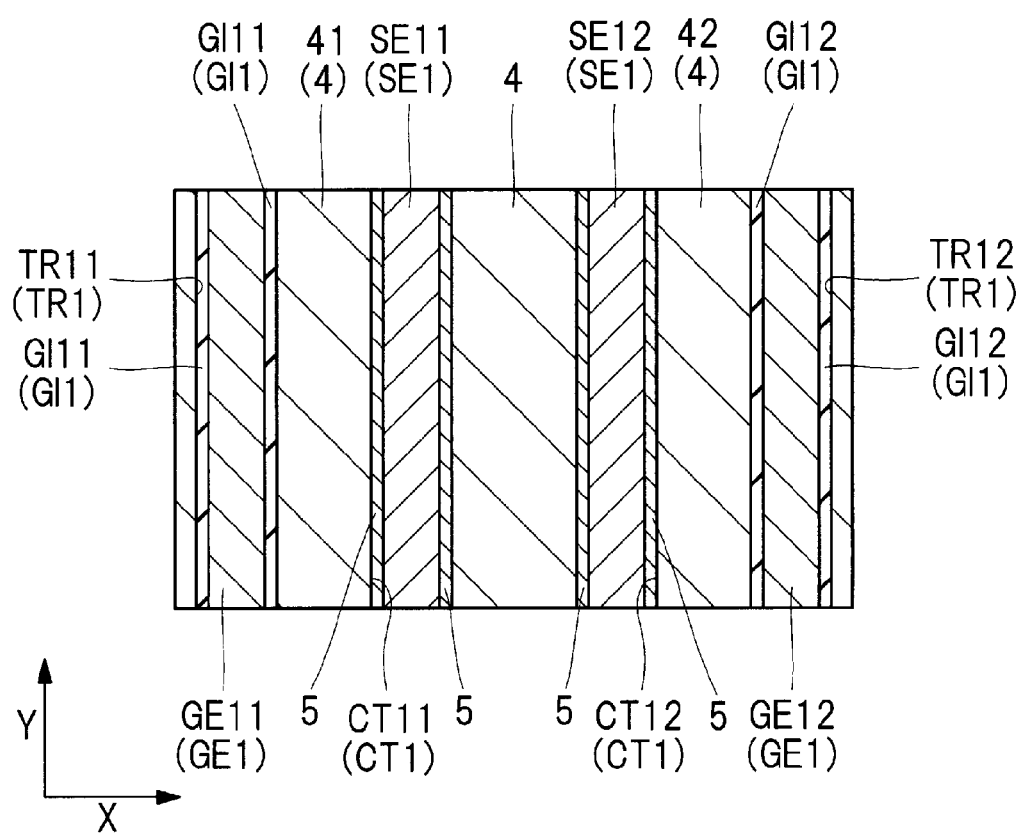
FIG. 2 is a principal part plan view of the semiconductor device of the First Embodiment.
Figure 3:
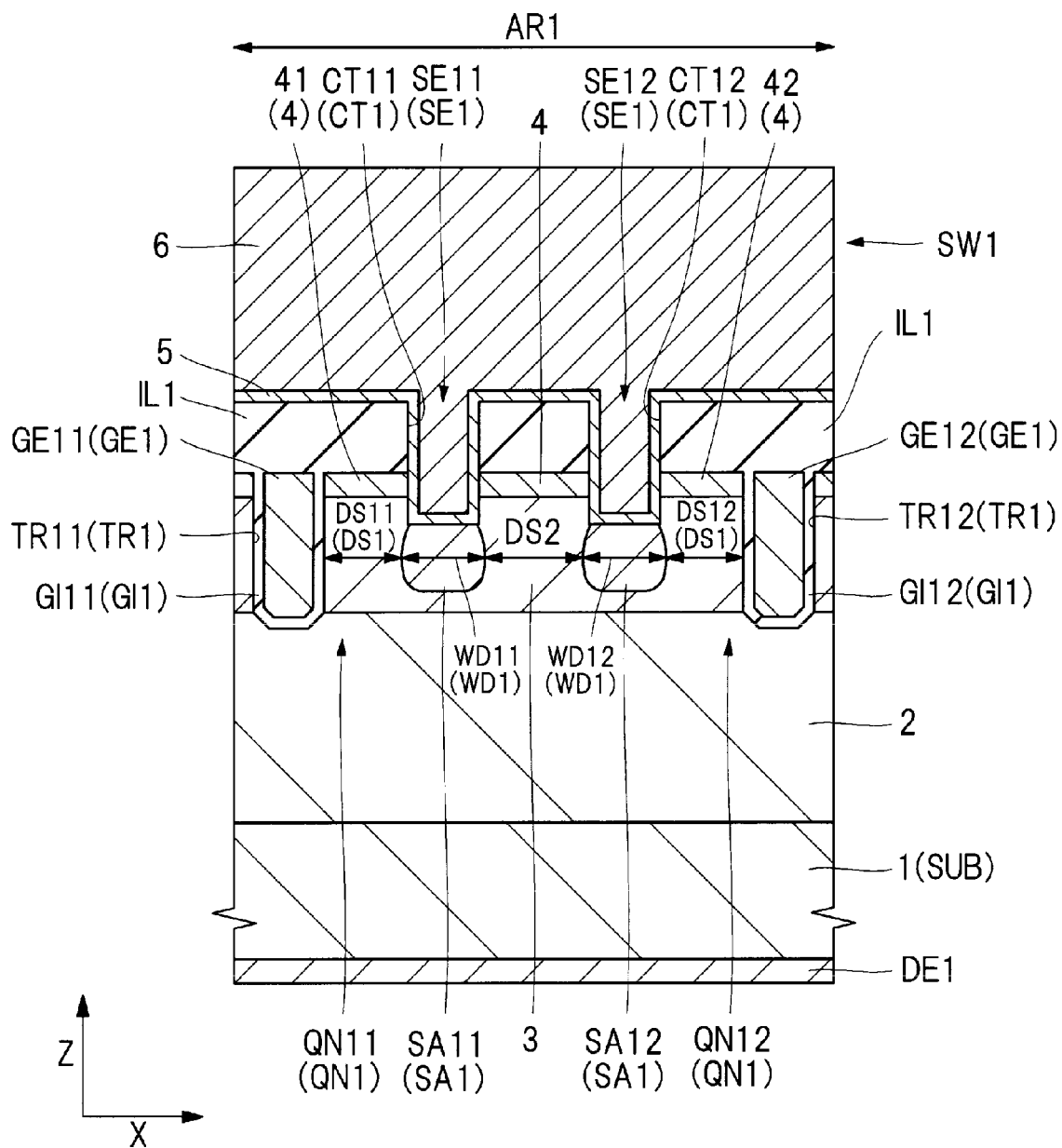
FIG. 3 is a principal part cross-sectional view of the semiconductor device of the First Embodiment.

FIG. 1 is a top view of a semiconductor chip in which the semiconductor device of the First Embodiment is formed. FIG. 2 is a principal part plan view of the semiconductor device of the First Embodiment. FIG. 3 is a principal part cross-sectional view of the semiconductor device of the First Embodiment. FIG. 2 is a drawing enlarging and showing a portion PR1 surrounded by a dashed one-dotted line in FIG. 1. FIG. 3 is a cross-sectional view along an A-A line in FIG. 1. Note that, in order to make understanding easy, FIG. 1 shows a state viewed through while removing a gate wiring GW1, a source wiring SW1 and an interlayer insulating film IL1 is shown, and shows the peripheries of the gate wiring GW1 and the source wiring SW1 by dashed two-dotted lines. Furthermore, in order to make understanding easy, FIG. 2 shows a state viewed through while removing the interlayer insulating film IL1 and the portions positioned above the interlayer insulating film IL1.

As shown in FIGS. 1 to 3, the semiconductor device of the First Embodiment has a semiconductor substrate SUB. The semiconductor substrate SUB has an upper surface as one main surface and a lower surface as another main surface. Furthermore, the semiconductor substrate SUB has a cell region AR1 as a part of a region of the upper surface and a gate wiring-lead-out region AR2 as another part of a region of the upper surface.

The semiconductor substrate SUB is constituted of an n$^{++}$-type drain layer 1. The n$^{++}$-type drain layer 1 is constituted of, for example, silicon (Si) in which an n-type impurity such as phosphorus (P) or arsenic (As) is diffused, and is constituted of a semiconductor having a conductivity type of an n-type. The n-type impurity concentration in the n$^{++}$-type drain layer 1 is higher than the n-type impurity concentration in an n$^-$-type drift layer 2 to be described later. Note that various n-type semiconductors other than silicon can be used as the n$^{++}$-type drain layer 1.

As shown in FIG. 3, a vertical MISFET QN1 of a trench gate type is formed in the cell region AR1. Namely, the cell region AR1 is a region in which the vertical MISFET QN1 of a trench gate type is formed. The configuration of a semiconductor device in the cell region AR1 will be described later.

Furthermore, a source electrode SE1, a source wiring SW1 and a source pad are formed in the cell region AR1. In FIG. 1, the source wiring SW1 and the source pad are shown collectively as the source wiring SW1. The source wiring SW1 is electrically coupled to an n$^+$-type source layer 4 of the vertical MISFET via the source electrode SE1. The source electrode SE1 and the source wiring SW1 are constituted of, for example, aluminum (Al).

In the gate wiring-lead-out region AR2, an outermost peripheral gate trench TR2, an outermost peripheral gate electrode GE2, a gate contact GC1, a gate wiring GW1 and a gate pad GP1 are formed. Namely, the gate wiring-lead-out region AR2 is a region into which the gate wiring GW1 of the vertical MISFET of a trench gate type formed in the cell region AR1 is led out. The outermost peripheral gate electrode GE2 is formed so as to be embedded in the outermost peripheral gate trench TR2 via an outermost peripheral gate insulating film GI2 (see FIG. 20 to be described later). The outermost peripheral gate electrode GE2 is electrically coupled to the gate electrode GE1 of the vertical MISFET. The outermost peripheral gate electrode GE2 is electrically coupled to the gate wiring GW1 via the gate contact GC1. The gate wiring GW1 is electrically coupled to the gate pad GP1. The gate wiring GW1 and the gate pad GP1 are constituted of, for example, aluminum (Al).

A cell end gate trench TR3 and a cell end gate electrode GE3 may be formed in the gate wiring-lead-out region AR2. The cell end gate electrode GE3 is formed so as to be embedded in the cell end gate trench TR3 via a cell end gate insulating film GI3 (see FIG. 20 to be described later). The cell end gate electrode GE3 is electrically coupled to the gate electrode GE1 of the vertical MISFET.

Note that, in the example shown in FIG. 1, the gate wiring-lead-out region AR2 is positioned on a side closer to the outer periphery of the semiconductor substrate SUB than the cell region AR1. However, the gate wiring-lead-out region AR2 may not be positioned closer to the outer peripheral side of the semiconductor substrate SUB than the cell region AR1, but may be positioned on, for example, a side closer to the center of the semiconductor substrate SUB than the cell region AR1. At this time, the outermost peripheral gate trench TR2 is a gate trench for leading out the gate wiring, the outermost peripheral gate insulating film GI2 is a gate insulating film for leading out the gate wiring, and the outermost peripheral gate electrode GE2 is a gate electrode for leading out the gate wiring.

In addition, the source wiring SW1 may be formed from the cell region AR1 to the gate wiring-lead-out region AR2.

<Configuration of Semiconductor Device in Cell Region>

Hereinafter, in the First Embodiment, the configuration of a semiconductor device in the cell region AR1 will be explained.

As shown in FIGS. 2 and 3, the semiconductor device of the First Embodiment has the n$^-$-type drift layer 2, a p-type body layer 3, the n$^+$-type source layer 4, a gate trench TR1, a gate insulating film GI1 and the gate electrode GE1 in the cell region AR1. Furthermore, the semiconductor device of the First Embodiment has the interlayer insulating film IL1, a contact trench CT1, the source electrode SE1 and a drain electrode DE1. By the n$^-$-type drift layer 2, the p-type body layer 3, the n$^+$-type source layer 4, the gate insulating film GI1 and the gate electrode GE1, the vertical MISFET QN1 of an n-channel type and a trench gate type is formed.

The n$^-$-type drift layer 2 is formed over the n$^{++}$-type drain layer 1 in the cell region AR1. That is, the n$^-$-type drift layer 2 is formed on the upper surface side of the semiconductor substrate SUB constituted of the n$^{++}$-type drain layer 1 in the cell region AR1. The n$^-$-type drift layer 2 is an n-type semiconductor layer constituted of, for example, silicon (Si) in which an n-type impurity such as phosphorus (P) or arsenic (As) is diffused. The n-type impurity concentration in the n$^-$-type drift layer 2 is smaller than the n-type impurity concentration in the n$^{++}$-type drain layer 1, and can be set to be, for example, approximately $1\times10^{15}$ to $1\times10^{17}$ atoms/cm$^3$. Note that various n-type semiconductors other than silicon can be used as the n$^-$-type drift layer 2.

The p-type body layer 3 is formed over the n$^-$-type drift layer 2 in the cell region AR1. The p-type body layer 3 is constituted of, for example, silicon (Si) in which a p-type impurity such as boron (B) has is diffused, and is a p-type semiconductor layer of a conductivity type different from the n-type. The p-type impurity concentration in the p-type body layer 3 can be set to be, for example, approximately $1\times10^{15}$-$1\times10^{18}$ atoms/cm$^3$. Note that various p-type semiconductors other than silicon can be used as the p-type body layer 3.

The n$^+$-type source layer 4 is formed over the p-type body layer 3 in the cell region AR1. The n$^+$-type source layer 4 is an n-type semiconductor region constituted of, for example, silicon (Si) in which an n-type impurity such as phosphorus (P) or arsenic (As) is diffused. The n-type impurity concentration in the n$^+$-type source layer 4 is higher than the n-type impurity concentration in the n$^-$-type drift layer 2. Note that various n-type semiconductors other than silicon can be used as n$^+$-type source layer 4.

In the cell region AR1, the gate trench TR1 as a trench portion is formed in plural number in the n$^+$-type source layer 4, the p-type body layer 3 and the n$^-$-type drift layer 2. Each of the gate trenches TR1 penetrates through the n$^+$-type source layer 4 and the p-type body layer 3 to thereby reach the middle of the n$^-$-type drift layer 2.

In the example shown in FIGS. 2 and 3, gate trenches TR11 and TR12 are formed as two gate trenches TR1. The gate trench TR11 penetrates through the n$^+$-type source layer 4 and the p-type body layer 3 to thereby reach the middle of the n$^-$-type drift layer 2. The gate trench TR12 is disposed, in plan view, spaced apart from the gate trench TR11, and penetrates through the n$^+$-type source layer 4 and the p-type body layer 3 to thereby reach the middle of the n$^-$-type drift layer 2.

Note that, in the specification of the application, "in plan view" means the case when viewed from the direction perpendicular to the upper surface of the semiconductor substrate SUB. Furthermore, in the specification of the application, for example, gate trenches TR11 and TR12 mean the gate trench TR11 and the gate trench TR12.

As shown in FIGS. 1 to 3, two directions that intersect mutually, preferably intersect orthogonally, in the upper surface of the semiconductor substrate SUB are set to an X-axis direction and a Y-axis direction, and the direction perpendicular to the upper surface of the semiconductor substrate SUB, that is, the vertical direction is set to a Z-axis direction. At this time, preferably, the gate trenches TR11 and TR12 are disposed, in plan view, extending in the Y-axis direction respectively and spaced apart from each other in the X-axis direction. Thereby, also at any position in the Y-axis direction, the shape of cross-section perpendicular to the Y-axis direction can be made equal.

In the cell region AR1, the gate insulating film GI1 is formed on the inner wall of the gate trench TR1. The gate insulating film GI1 is constituted of, for example, a silicon oxide film or the like, and is an insulating film formed by, for example, a thermal oxidation method, a CVD (Chemical Vapor Deposition) method, or the like.

In the example shown in FIGS. 2 and 3, a gate insulating film GI11 as the gate insulating film GI1 is formed on the inner wall of the gate trench TR11. A gate insulating film GI12 as the gate insulating film GI1 is formed on the inner wall of the gate trench TR12.

In the cell region AR1, the gate electrode GE1 is formed so as to be embedded in the gate trench TR1 over the gate insulating film GI1. The gate electrode GE1 is constituted of, for example, a polysilicon film in which an n-type impurity such as phosphorus (P) or arsenic (As) is diffused at a high concentration, and is a conductor film formed by, for example, a CVD method or the like.

In the example shown in FIGS. 2 and 3, a gate electrode GE11 as the gate electrode GE1 is formed so as to be embedded in the gate trench TR11 over the gate insulating film GI11. A gate electrode GE12 as the gate electrode GE1 is formed so as to be embedded in the gate trench TR12 over the gate insulating film GI12.

In the cell region AR1, the interlayer insulating film IL1 is formed so as to cover the gate electrode GE1 and the n$^+$-type source layer 4. Since the n$^+$-type source layer 4 is formed over the p-type body layer 3, the interlayer insulating film IL1 is formed so as to cover the p-type body layer 3. For example, a silicon oxide film can be used as the interlayer insulating film IL1.

The contact trench CT1 as a trench portion is formed in the interlayer insulating film IL1 in the portion positioned, in plan view, between mutually adjacent two gate trenches TR1. The contact trench CT1, in plan view, penetrates through the interlayer insulating film IL1 and the n$^+$-type source layer 4 positioned between the mutually adjacent two gate trenches TR1 to thereby reach the middle of the p-type body layer 3.

In the example shown in FIG. 3, contact trenches CT11 and CT12 as the contact trench CT1 are formed. The contact trenches CT11 and CT12 are formed, in plan view, spaced apart from each other. The contact trench CT11, in plan view, penetrates through the interlayer insulating film IL1 and the n$^+$-type source layer 4 in the portion positioned between the gate trench TR11 and the gate trench TR12 to thereby reach the middle of the p-type body layer 3. Furthermore, the contact trench CT12, in plan view, penetrates through the interlayer insulating film IL1 and the n$^+$-type source layer 4 in the portion positioned between the contact trench CT11 and the gate trench TR12 to thereby reach the middle of the p-type body layer 3.

When the gate trenches TR11 and TR12 are disposed, in plan view, extending respectively in the Y-axis direction and spaced apart from each other in the X-axis direction, preferably, the contact trenches CT11 and CT12 are formed, in plan view, extending respectively in the Y-axis direction and spaced apart from each other in the X-axis direction. Thereby, the shape of cross-section perpendicular to the Y-axis direction can be made equal at any position in the Y-axis direction.

The n$^+$-type source layer 4 may not be formed over the p-type body layer 3 in the portion positioned, in plan view, between the contact trench CT11 and the contact trench CT12. Accordingly, the n$^+$-type source layer 4 may be in contact with the p-type body layer 3 in the portion positioned between the mutually adjacent two gate trenches TR1, and with the gate insulating film GI1. At this time, the portion that is positioned between the gate trench TR11 and the gate trench TR12, and that is in contact with the p-type body layer 3 in the portion positioned in the periphery of the gate trench TR11 and with the gate insulating film GI11, of the n$^+$-type source layer 4, is set to an n$^+$-type source layer 41. Moreover, the portion that is positioned between the gate trench TR11 and the gate trench TR12, and that is in contact with the p-type body layer 3 in the portion positioned in the periphery of the gate trench TR12 and with the gate insulating film GI12, of the n$^+$-type source layer 4, is set to an n$^+$-type source layer 42.

At this time, a vertical MISFET QN11 as the vertical MISFET QN1 is formed by the n$^-$-type drift layer 2, the p-type body layer 3 in the portion that is positioned between the gate trench TR11 and the gate trench TR12 and that is positioned in the periphery of the gate trench TR11, the n$^+$-type source layer 41, the gate insulating film GI11 and the gate electrode GE11. Furthermore, a vertical MISFET QN12 as the vertical MISFET QN1 is formed by the n$^-$-type drift layer 2, the p-type body layer 3 in the portion that is positioned between the gate trench TR11 and the gate trench TR12 and that is positioned in the periphery of the gate trench TR12, the n$^+$-type source layer 42, the gate insulating film GI12 and the gate electrode GE12.

The source electrode SE1 and the source wiring SW1 are formed inside the contact trench CT1 and over the interlayer insulating film IL1. The source electrode SE1 is an electrode formed so as to be embedded in the inside of the contact trench CT1, inside the contact trench CT1. The source wiring SW1 is an electrode formed over the source electrode SE1 and over the interlayer insulating film IL1, outside the contact trench CT1, and is electrically coupled to the source electrode SE1. The source electrode SE1 is in contact with the p-type body layer 3 in the portion positioned between the mutually adjacent two gate trenches TR1, and the n$^+$-type source layer 4. Accordingly, the source wiring SW1 is electrically coupled to the p-type body layer 3 and the n$^+$-type source layer 4 constituting the vertical MISFET QN1, via the source electrode SE1.

A stacked conductor film obtained by stacking a barrier conductor film 5 and a conductor film 6 can be used as the source electrode SE1 and the source wiring SW1. The barrier conductor film 5 is formed on the inner wall of the contact trench CT1 and over the interlayer insulating film IL1. The conductor film 6 is formed so as to be embedded in the inside of the contact trench CT1 over the barrier conductor film 5 inside the contact trench CT1, and is formed over the barrier conductor film 5 outside the contact trench CT1.

For example, a conductor film constituted of a titanium nitride (TiN) film or a titanium-tungsten (TiW) film can be used as the barrier conductor film 5. Furthermore, as the conductor film 6, for example, a conductor film constituted of an aluminum (Al) film, or one obtained by incorporating, for example, silicon (Si) or copper (Cu) in a conductor film constituted of an aluminum film can be used. Through the use of such a stacked conductor film, the p-type body layer 3 and the n$^+$-type source layer 4, and the source electrode SE1 and the source wiring SW1 can be electrically coupled in a low-resistance state.

In the example shown in FIG. 3, the source electrode SE1 and the source wiring SW1 are integrally formed inside the contact trench CT1 and over the interlayer insulating film IL1. In addition, in the example shown in FIG. 3, a source electrode SE11 as the source electrode SE1 is formed so as to be embedded in the inside of the contact trench CT11 inside the contact trench CT11, and a source electrode SE12 as the source electrode SE1 is formed so as to be embedded in the inside of the contact trench CT12 inside the contact trench CT12. The source electrode SE11 is in contact with the p-type body layer 3 in the portion positioned between the gate trench TR11 and the gate trench TR12, and the n$^+$-type source layer 41. The source electrode SE12 is in contact with the p-type body layer 3 in the portion positioned between the gate trench TR11 and the gate trench TR12, and the n$^+$-type source layer 42. Accordingly, the source wiring SW1 is electrically coupled to the p-type body layer 3 and the n$^+$-type source layer 41 constituting the vertical MISFET QN11, via the source electrode SE11. Furthermore, the source wiring SW1 is electrically coupled to the p-type body layer 3 and the n$^+$-type source layer 42 constituting the vertical MISFET QN12, via the source electrode SE12.

The drain electrode DE1 is an electrode formed on the lower surface side of the n$^{++}$-type drain layer 1. The drain electrode DE1 is electrically coupled to the n$^{++}$-type drain layer 1. For example, a conductor film constituted of an alloy containing silver (Ag), gold (Au) or the like as a main component can be used as the drain electrode DE1. The drain electrode DE1 and the n$^{++}$-type drain layer 1 can be electrically coupled in a low-resistance state by using such a conductor film.

The semiconductor device of the First Embodiment has, in plural number, a p$^+$-type semiconductor region SA1 disposed between the mutually adjacent two gate trenches TR1 in the cell region AR1. Each of the p$^+$-type semiconductor regions SA1 is formed, in plan view, inside the p-type body layer 3 in the portion positioned between the mutually adjacent two gate trenches TR1. The p$^+$-type semiconductor regions SA1 are disposed, in plan view, spaced apart from each other inside the p-type body layer 3 in the portion positioned between the mutually adjacent two gate trenches TR1. Each of the p$^+$-type semiconductor regions SA1 are constituted of, for example, silicon (Si) in which a p-type impurity such as boron (B) is diffused. Any of p-type impurity concentration in each of the p$^+$-type semiconductor regions SA1 is higher than the p-type impurity concentration in the p-type body layer 3.

Thereby, in plan view, the distribution of a depletion layer near the interface between the p-type body layer 3 in the portion positioned between the mutually adjacent two gate trenches TR1 and the n$^-$-type drift layer 2 can be adjusted. Accordingly, it is possible to decrease the intensity of an electric field in the periphery of bottom portion of the gate trench TR1, that is, to alleviate the concentration of an electric field, and to thereby enhance the breakdown voltage of the semiconductor device.

Preferably, the p-type impurity concentration in the p$^+$-type semiconductor region SA1 is approximately, for example, $1 \times 10^{16}$-$1 \times 10^{22}$ atoms/cm$^3$, and is higher than the p-type impurity concentration in the p-type body layer 3. Meanwhile, various p-type semiconductors other than silicon can be used as the p$^+$-type semiconductor region SA1.

In the case where, in plan view, the mutually adjacent two gate trenches TR1 extend respectively in the Y-axis direction and are disposed spaced apart from each other in the X-axis direction, preferably, the p$^+$-type semiconductor regions SA1 are formed, in plan view, extending respectively in the Y-axis direction and spaced apart from each other in the X-axis direction. Thereby, the shape of cross-section perpendicular to the Y-axis direction can be made equal at any position in the Y-axis direction.

Preferably, the p$^+$-type semiconductor regions SA1 are formed respectively, in plan view, in the p-type body layer 3 in the portion overlapping with each of the contact trenches CT1. For example, the p$^+$-type semiconductor region SA1 can be easily formed by forming the contact trench CT1, and then introducing a p-type impurity into the p-type body layer 3 in the portion exposed to the bottom face of the formed contact trench CT1. At this time, each of the p$^+$-type semiconductor regions SA1 contacts with each of source electrodes SE1, which is formed inside each of contact trenches CT1. Thereby, the source electrode SE1 and the p-type body layer 3 can be electrically coupled in a low-resistance state via the p$^+$-type semiconductor region SA1.

In the following, the case where two p$^+$-type semiconductor regions SA1 are formed inside the p-type body layer 3 in the portion positioned between the mutually adjacent two gate trenches TR1 will be exemplified and explained. However, as will be described later using FIG. 19, three or more p$^+$-type semiconductor regions SA1 such as five or the like may be formed inside the p-type body layer 3 in the portion positioned between the mutually adjacent two gate trenches TR1.

In the example shown in FIG. 3, p$^+$-type semiconductor regions SA11 and SA12 are formed as two p$^+$-type semiconductor regions SA1. The p$^+$-type semiconductor region SA11 is formed, in plan view, inside the p-type body layer 3 in the portion positioned between the gate trench TR11 and the gate trench TR12. The p$^+$-type semiconductor region SA12 is formed, in plan view, inside the p-type body layer 3 in the portion positioned between the p$^+$-type semiconductor region SA11 and the gate trench TR12, separated from the p$^+$-type semiconductor region SA11.

Preferably, the p$^+$-type semiconductor region SA11 is formed, in plan view, inside the p-type body layer 3 in the portion positioned on a side closer to the gate trench TR11 than the center of the gate trench TR11 and the gate trench TR12. Furthermore, the p$^+$-type semiconductor region SA12 is formed, in plan view, inside the p-type body layer 3 in the portion positioned on a side closer to the gate trench TR12 than the center of the gate trench TR11 and the gate trench TR12.

Among these, in plan view, the distribution of a depletion layer near the interface between the p-type body layer 3 in the portion positioned on a side closer to the gate trench TR11 than the center between the gate trench TR11 and the gate trench TR12, and the n$^-$-type drift layer 2 can be adjusted easily by the p$^+$-type semiconductor region SA11. Accordingly, it is possible to easily decrease the intensity of an electric field in the periphery of the bottom portion of the gate trench TR11, and to enhance the breakdown voltage of the semiconductor device.

Moreover, in plan view, the distribution of a depletion layer near the interface between the p-type body layer 3 in the portion positioned on a side closer to the gate trench TR12 than the center between the gate trench TR11 and the gate trench TR12, and the n$^-$-type drift layer 2 can be adjusted easily by the p$^+$-type semiconductor region SA12. Accordingly, it is possible to easily decrease the intensity of an electric field in the periphery of the bottom portion of the gate trench TR12, and to enhance the breakdown voltage of the semiconductor device.

Further preferably, a space DS1 between the p$^+$-type semiconductor region SA1 and the gate trench TR1 can be set to be, for example, approximately 0.5 to 1.5 µm. That is, a space DS11 between the p$^+$-type semiconductor region SA11 and the gate trench TR11 may be set to be, for example, approximately 0.5 to 1.5 µm, and a space DS12 between the p$^+$-type semiconductor region SA12 and the gate trench TR12 can be set to be, for example, approximately 0.5 to 1.5 µm. When the space DS1 is less than 0.5 µm, since the p$^+$-type semiconductor region SA1 for suppressing the concentration of an electric field in the periphery of the bottom portion of the gate trench TR1 is positioned too close to the gate trench TR1, the effect of reducing the intensity of an electric field in the surroundings at the bottom of the gate trench TR1 becomes small and ON resistance of the vertical MISFET QN1 rises. In addition, when the space DS1 exceeds 1.5 µm, the p$^+$-type semiconductor region SA1 for suppressing the concentration of an electric field in the periphery of the bottom portion of the gate trench TR1 is positioned too separated from the gate trench TR1, and thus the effect of reducing the intensity of an electric field in the surroundings at the bottom of the gate trench TR1 becomes small.

Furthermore, a width WD1 of the p$^+$-type semiconductor region SA1 in the X-axis direction can be set to be, for example, approximately 0.1 to 0.5 μm. That is, a width WD11 as the width WD1 of the p$^+$-type semiconductor region SA11 in the X-axis direction can be set to be, for example, approximately 0.1 to 0.5 μm, and a width WD12 as the width WD1 of the p$^+$-type semiconductor region SA12 in the X-axis direction can be set to be, for example, approximately 0.1 to 0.5 μm. When the width WD1 is less than 0.1 μm, there is a risk that the effect of suppressing the concentration of an electric field in the periphery of the bottom portion of the gate trench TR1 cannot be obtained sufficiently. In addition, when the width WD1 exceeds 0.5 μm, conversely, the intensity of an electric field concentrating in the periphery of the bottom portion of the p$^+$-type semiconductor region SA1 becomes large, and thus there is a risk that the breakdown voltage of the semiconductor device lowers.

Note that, a space DS2 between mutually adjacent two p$^+$-type semiconductor regions SA1 may not be the same as the space DS1 between the p$^+$-type semiconductor region SA1 and the gate trench TR1. However, preferably, the space DS2 between the mutually adjacent two p$^+$-type semiconductor regions SA1 is equal to the space DS1 between the p$^+$-type semiconductor region SA1 and the gate trench TR1. Thereby, the p-type body layer 3 in the portion positioned between the mutually adjacent two gate trenches TR1 can be separated at regular intervals by the p$^+$-type semiconductor regions SA1. Accordingly, an electric field in the periphery of the bottom portion of the gate trench TR1 is unlikely to concentrate and the effect of reducing the intensity of an electric field in the periphery of the bottom portion of the gate trench TR1 becomes large.

Preferably, the p$^+$-type semiconductor region SA11 is in contact with the source electrode SE11 formed inside the contact trench CT11, and the p$^+$-type semiconductor region SA12 is in contact with the source electrode SE12 formed inside the contact trench CT12. Thereby, the source electrode SE11 and the p-type body layer 3 can be electrically coupled in a low-resistance state via the p$^+$-type semiconductor region SA11, and the source electrode SE12 and the p-type body layer 3 can be electrically coupled in a low-resistance state via the p$^+$-type semiconductor region SA12.

Note that the p$^+$-type semiconductor region SA1 may be formed at least inside the p-type body layer 3. Accordingly, as shown in FIG. 3, the p$^+$-type semiconductor region SA1 may not be in contact with the n$^-$-type drift layer 2. Alternatively, although illustration is omitted, the p$^+$-type semiconductor region SA1 may not be in contact with the source electrode SE1. Also in these cases, the distribution of a depletion layer near the interface between the p-type body layer 3 and the n$^-$-type drift layer 2 can be adjusted by adjusting the p-type impurity concentration in the p$^+$-type semiconductor region SA1.

<First Modification of p$^+$-Type Semiconductor Region>

Figure 4:
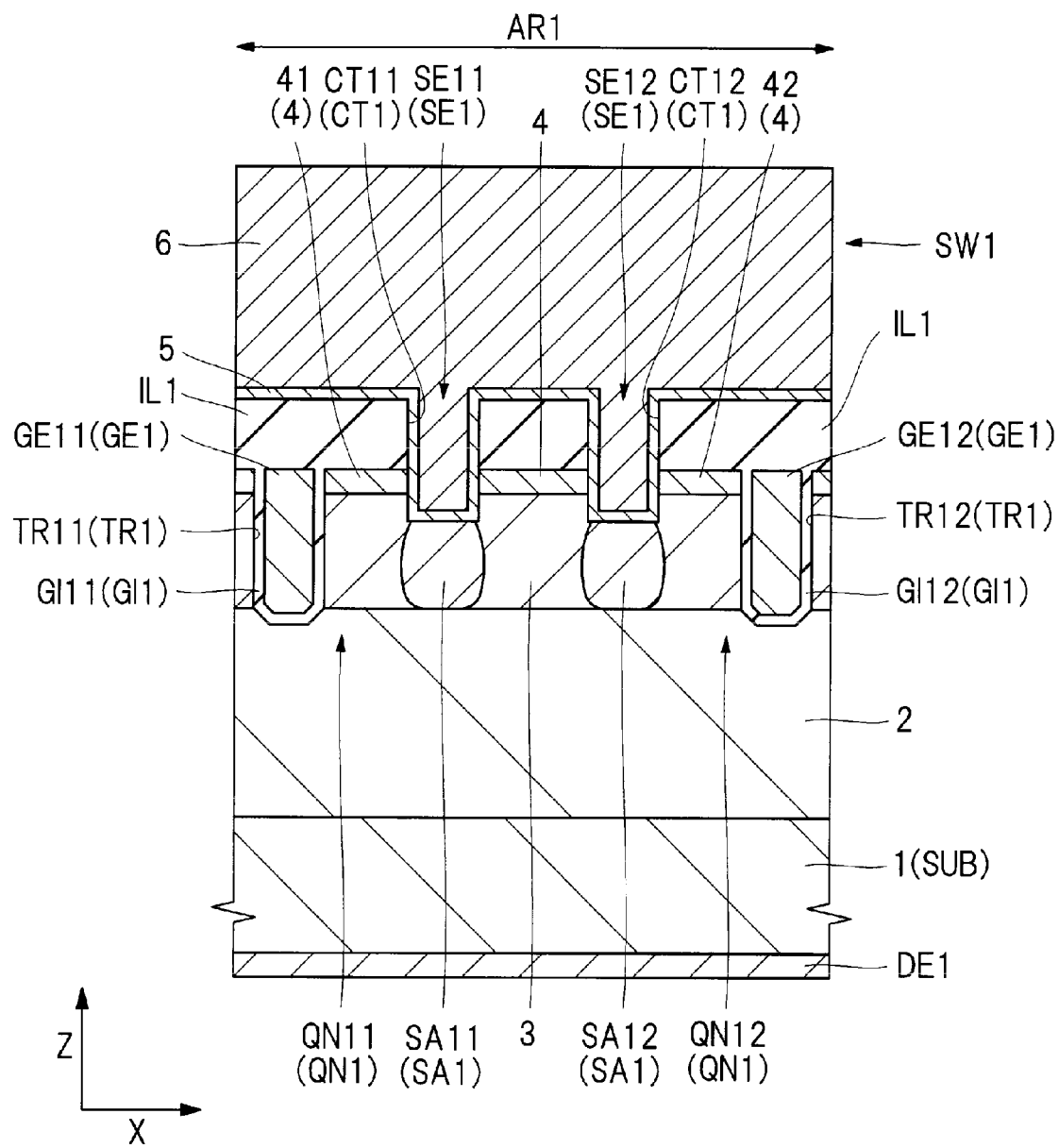
FIG. 4 is a cross-sectional view showing a first modification of the $p^+$-type semiconductor region in the semiconductor device of the First Embodiment.

FIG. 4 is a cross-sectional view showing a first modification of the p$^+$-type semiconductor region in the semiconductor device of the First Embodiment.

As shown in FIG. 4, preferably, each of the p$^+$-type semiconductor regions SA1 penetrates through the p-type body layer 3 in the portion positioned between the mutually adjacent two gate trenches TR1 to thereby reach the upper surface of the n$^-$-type drift layer 2. Accordingly, each of the p$^+$-type semiconductor regions SA1 is in contact with the n$^-$-type drift layer 2. In the example shown in FIG. 4, both of the two p$^+$-type semiconductor regions SA11 and SA12 are in contact with the n$^-$-type drift layer 2.

In the first modification, the p$^+$-type semiconductor region SA1 for suppressing the concentration of an electric field in the periphery of the bottom portion of the gate trench TR1 reaches the upper surface of the n$^-$-type drift layer 2. Consequently, the distribution of a depletion layer in the p-type body layer 3 and the n$^-$-type drift layer 2 can easily been adjusted without increasing the p-type impurity concentration in the p$^+$-type semiconductor region SA1 so much. Accordingly, it is possible to easily decrease the intensity of an electric field in the periphery of the bottom portion of the gate trench TR1, and to enhance easily the breakdown voltage of the semiconductor device.

<Second Modification of p$^+$-Type Semiconductor Region>

Figure 5:
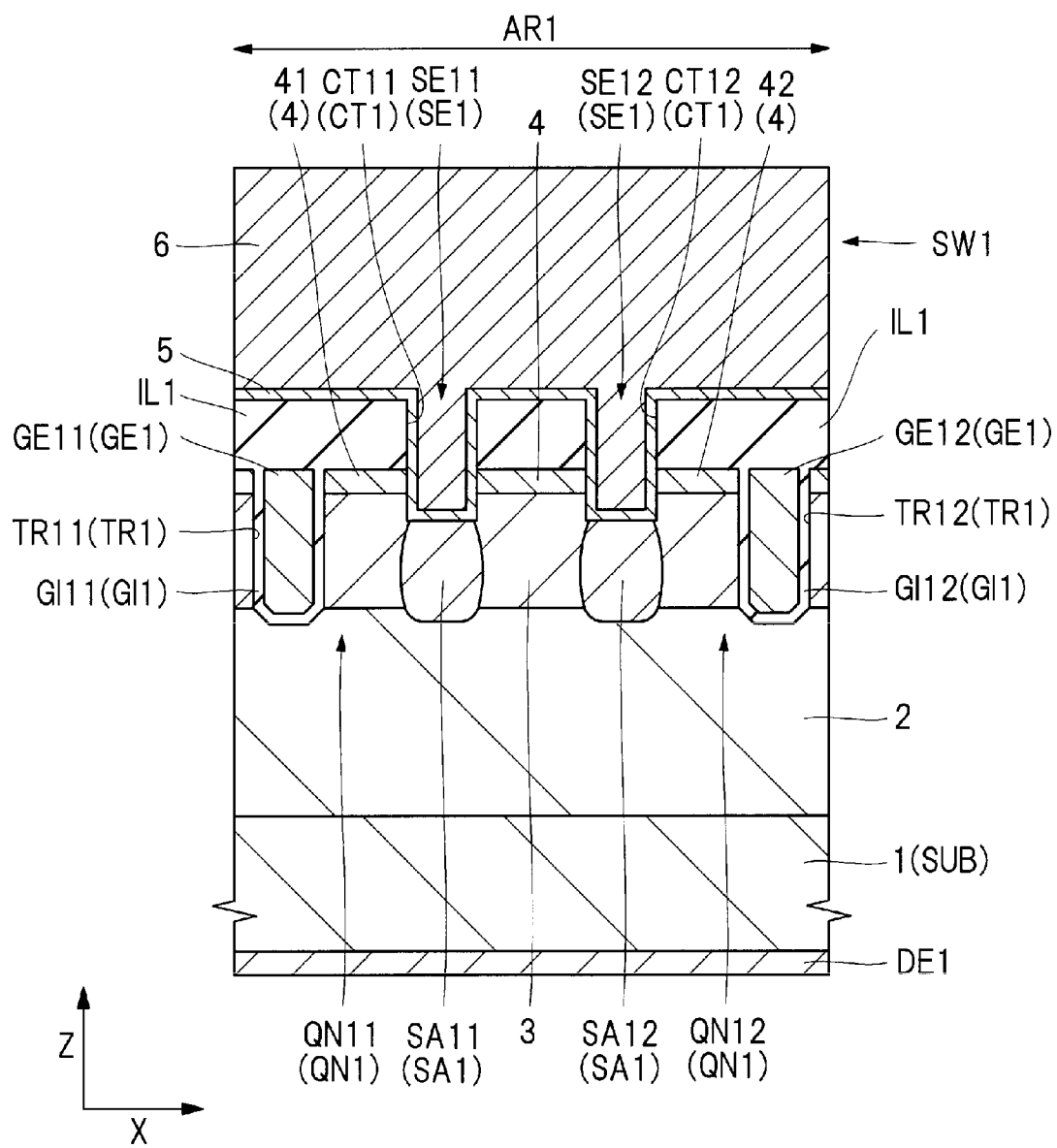
FIG. 5 is a cross-sectional view showing a second modification of the $p^+$-type semiconductor region in the semiconductor device of the First Embodiment.

FIG. 5 is a cross-sectional view showing a second modification of the p$^+$-type semiconductor region in the semiconductor device of the First Embodiment.

As shown in FIG. 5, preferably, each of the p$^+$-type semiconductor regions SA1 penetrates through the p-type body layer 3 in the portion positioned between the mutually adjacent two gate trenches TR1 to thereby reach the middle of the n$^-$-type drift layer 2. Accordingly, each of the p$^+$-type semiconductor, regions SA1 is in contact with the n$^-$-type drift layer 2. In the example shown in FIG. 5, both of the two p$^+$-type semiconductor regions SA11 and SA12 are in contact with the n$^-$-type drift layer 2.

In the second modification, the p$^+$-type semiconductor region SA1 for suppressing the concentration of an electric field in the periphery of the bottom portion of the gate trench TR1 reaches the middle of the n$^-$-type drift layer 2. Accordingly, the distribution of a depletion layer in the n$^-$-type drift layer 2 can be further adjusted easily without increasing the p-type impurity concentration in the p$^+$-type semiconductor region SA1 so much. Therefore, it is possible to decrease more easily the intensity of an electric field in the periphery of the bottom portion of the gate trench TR1, and to enhance easily the breakdown voltage of the semiconductor device.

<Third Modification of p$^+$-Type Semiconductor Region>

Figure 6:
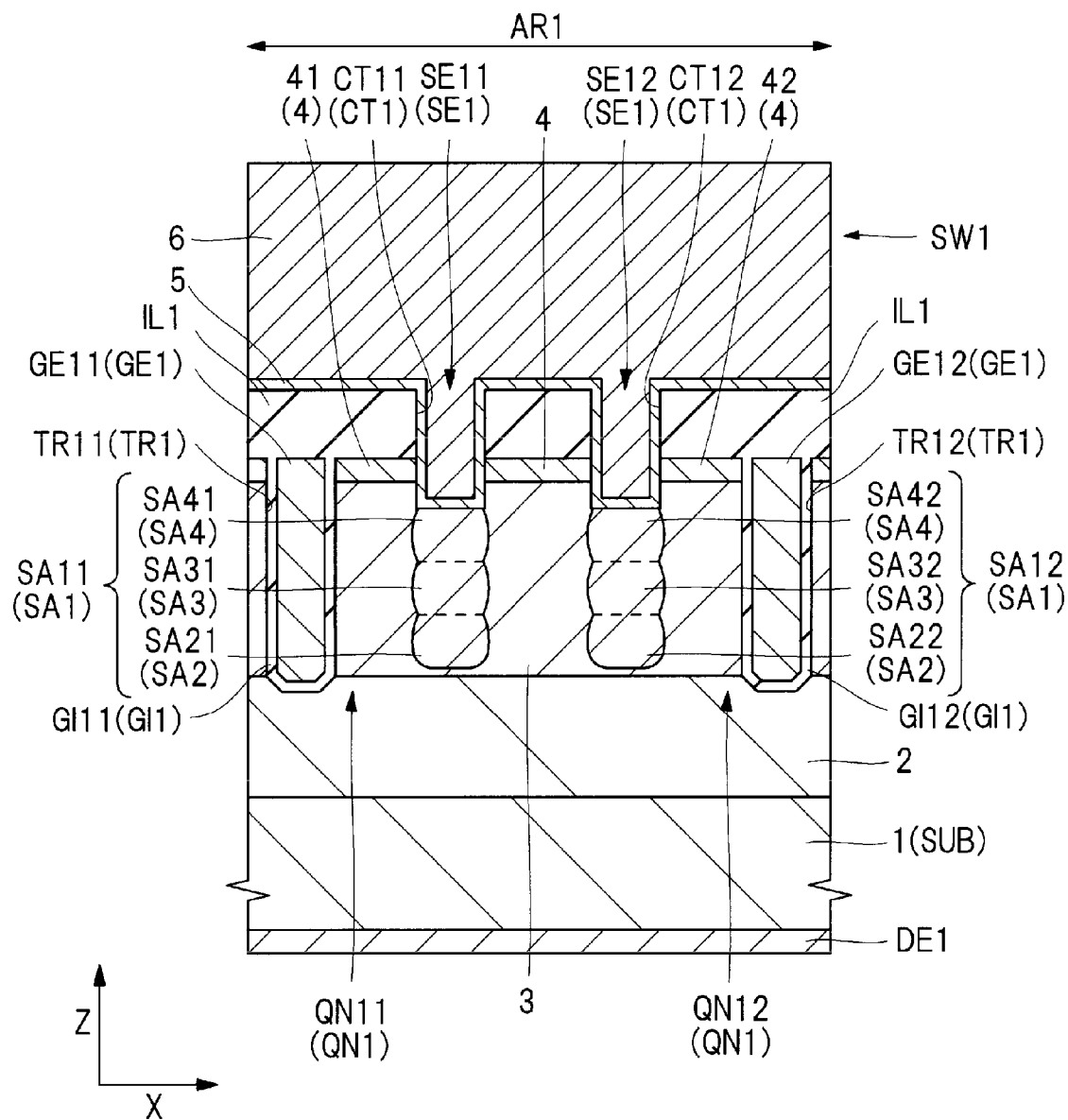
FIG. 6 is a cross-sectional view showing a third modification of the $p^+$-type semiconductor region in the semiconductor device of the First Embodiment.

FIG. 6 is a cross-sectional view showing a third modification of a p$^+$-type semiconductor region in the semiconductor device of the First Embodiment.

In the third modification, as shown in FIG. 6, each of the p$^+$-type semiconductor regions SA1 includes a plurality of p$^+$-type semiconductor regions SA2, SA3 and SA4 that are formed in contact with each other in the thickness direction of the p-type body layer 3, that is, in the vertical direction (Z-axis direction).

The p$^+$-type semiconductor region SA2 is formed inside the p-type body layer 3 in the portion positioned between the mutually adjacent two gate trenches TR1. The p$^+$-type semiconductor region SA3 is formed inside the p-type body layer 3 in the portion positioned over the p$^+$-type semiconductor region SA2 and is in contact with the p$^+$-type semiconductor region SA2. The p$^+$-type semiconductor region SA4 is formed inside the p-type body layer 3 in the portion positioned over the p$^+$-type semiconductor region SA3 and is in contact with the p$^+$-type semiconductor region SA3. Any of the p-type impurity concentration in the p$^+$-type semiconductor region SA2, the p-type impurity concentration in the p$^+$-type semiconductor region SA3 and the p-type impurity concentration in the p$^+$-type semiconductor region SA4 is higher than the p-type impurity concentration in the p-type body layer 3.

In the example shown in FIG. 6, the p$^+$-type semiconductor region SA11 as the p$^+$-type semiconductor region SA1 includes a p$^+$-type semiconductor region SA21 as the p$^+$-type semiconductor region SA2, a p$^+$-type semiconductor region SA31 as the p$^+$-type semiconductor region SA3, and a p$^+$-type semiconductor region SA41 as the p$^+$-type semiconductor region SA4. Furthermore, the p$^+$-type semiconductor region SA12 as the p$^+$-type semiconductor region SA1 includes a p$^+$-type semiconductor region SA22 as the p$^+$-type semiconductor region SA2, a p$^+$-type semiconductor region SA32 as the p$^+$-type semiconductor region SA3, and a p$^+$-type semiconductor region SA42 as the p$^+$-type semiconductor region SA4.

For example, in order to enhance the breakdown voltage, the case where the thickness of the p-type body layer 3 is, for example, relatively as thick as 1 μm or more and the depth of the gate trench TR1 is, for example, relatively as deep as 1 μm or more is considered. In the case, it is difficult to form the p$^+$-type semiconductor region SA1 having a relatively large height in the thickness direction of the p-type body layer 3, that is, in the vertical direction (Z-axis direction) by introducing a p-type impurity into the p-type body layer 3 in one ion implantation process.

In such a case, a plurality of p$^+$-type semiconductor regions SA2, SA3 and SA4 in contact with one another is formed in the thickness direction of the p-type body layer 3, that is, in the vertical direction (Z-axis direction), by performing a plurality of ion implantation processes while changing the energy of ions to be implanted. Then, the p$^+$-type semiconductor region SA1 constituted of the p$^+$-type semiconductor regions SA2, SA3 and SA4 is formed. Consequently, the p$^+$-type semiconductor region SA1 having a relatively large height can be formed.

Here, in the cross-section shown in FIG. 6, that is, the cross-section perpendicular to the Y-axis direction, the boundary line between the p$^+$-type semiconductor region SA2 and the p$^+$-type semiconductor region SA3 is defined as, for example, a line formed by linking points at which the p-type impurity concentration becomes minimal along the Z-axis direction in respective positions in the X-axis direction. At this time, the p-type impurity concentration in the p$^+$-type semiconductor region SA2 in the portion adjacent to the p$^+$-type semiconductor region SA3 is lower than the p-type impurity concentration in the portion positioned at the center of the p$^+$-type semiconductor region SA2. In addition, the p-type impurity concentration in the p$^+$-type semiconductor region SA3 in the portion adjacent to the p$^+$-type semiconductor region SA2 is lower than the p-type impurity concentration in the portion positioned at the center of the p$^+$-type semiconductor region SA3.

Furthermore, in the cross-section shown in FIG. 6, that is, in a cross-section perpendicular to the Y-axis direction, the boundary line between the p$^+$-type semiconductor region SA3 and the p$^+$-type semiconductor region SA4 can also be defined in the same way as the boundary line between the p$^+$-type semiconductor region SA2 and the p$^+$-type semiconductor region SA3.

Also in the third modification, it is possible to adjust the distribution of a depletion layer near the interface between the p-type body layer 3 and the n$^-$-type drift layer by, for example, adjusting the p-type impurity concentration in the p$^+$-type semiconductor regions SA2, SA3 and SA4. Accordingly, it is possible to decrease the intensity of an electric field in the periphery of bottom portion of the gate trench TR1, that is, to alleviate the concentration of an electric field, and to enhance the breakdown voltage of the semiconductor device.

Note that only a part of p$^+$-type semiconductor region SA1 of the p$^+$-type semiconductor regions SA1 may include the p$^+$-type semiconductor regions SA2, SA3 and SA4.

<Fourth Modification of p$^+$-Type Semiconductor Region>

Figure 7:
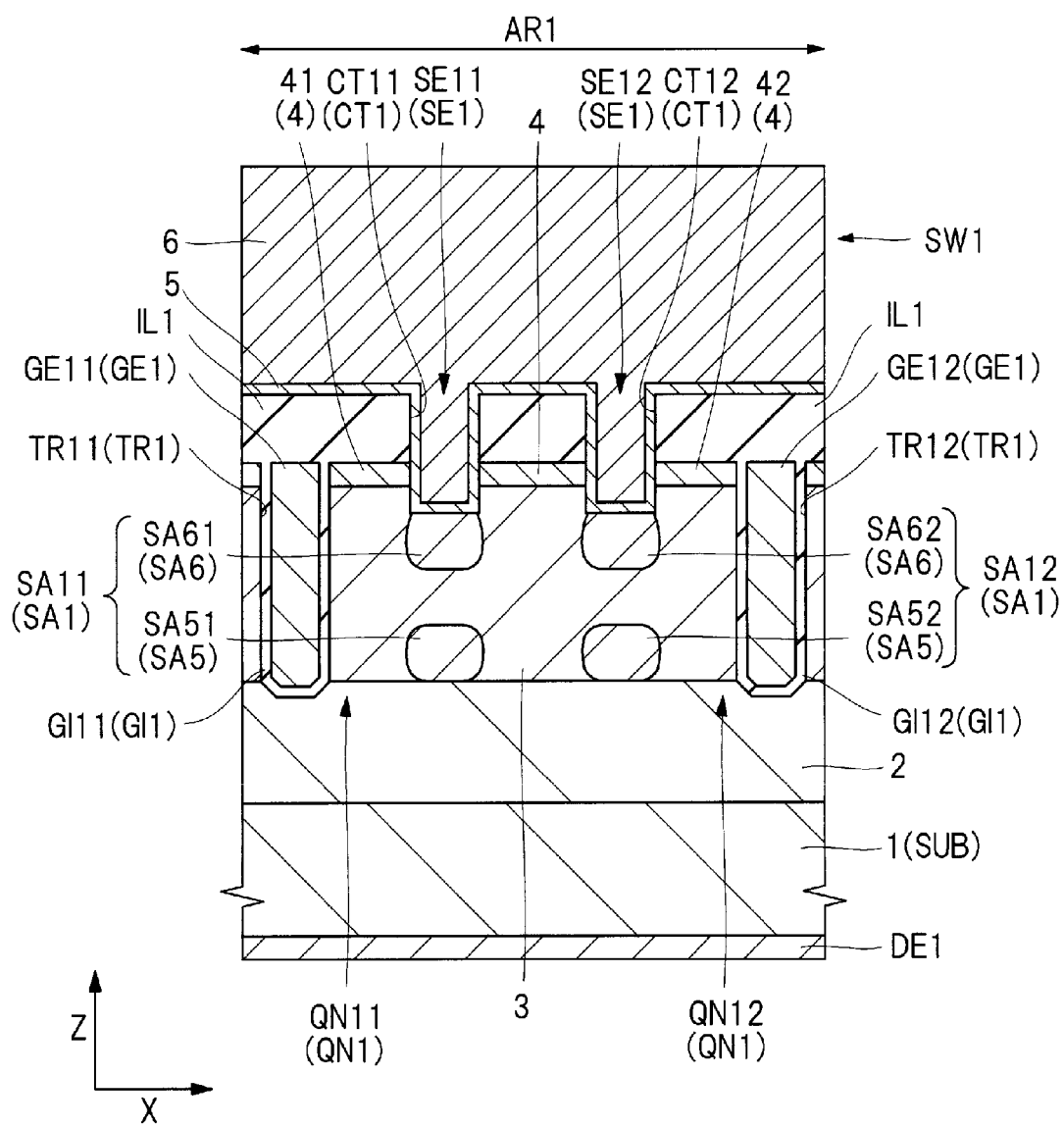
FIG. 7 is a cross-sectional view showing a fourth modification of the $p^+$-type semiconductor region in the semiconductor device of the First Embodiment.

FIG. 7 is a cross-sectional view showing a fourth modification of a p$^+$-type semiconductor region in the semiconductor device of the First Embodiment.

In the fourth modification, as shown in FIG. 7, each of the p$^+$-type semiconductor regions SA1 includes a plurality of p$^+$-type semiconductor regions SA5 and SA6 that are formed to be separated from each other in the thickness direction of the p-type body layer 3, that is, the vertical direction (Z-axis direction).

The p$^+$-type semiconductor region SA5 is formed inside the p-type body layer 3 in the portion positioned between the mutually adjacent two gate trenches TR1. The p$^+$-type semiconductor region SA6 is formed to be separated from the p$^+$-type semiconductor region SA5, inside the p-type body layer 3 in the portion positioned over the p$^+$-type semiconductor region SA5. Any of the p-type impurity concentration in the p$^+$-type semiconductor region SA5 and the p-type impurity concentration in the p$^+$-type semiconductor region SA6 is higher than the p-type impurity concentration in the p-type body layer 3.

In the example shown in FIG. 7, the p$^+$-type semiconductor region SA11 as the p$^+$-type semiconductor region SA1 includes a p$^+$-type semiconductor region SA51 as the p$^+$-type semiconductor region SA5, and a p$^+$-type semiconductor region SA61 as the p$^+$-type semiconductor region SA6. Furthermore, the p$^+$-type semiconductor region SA12 as the p$^+$-type semiconductor region SA1 includes a p$^+$-type semiconductor region SA52 as the p$^+$-type semiconductor region SA5, and a p$^+$-type semiconductor region SA62 as the p$^+$-type semiconductor region SA6.

In the fourth modification, as is the case for the third modification, for example, in order to enhance the breakdown voltage, the case where the thickness of the p-type body layer 3 is relatively as thick as 1 μm or more and the depth of the gate trench TR1 is relatively as deep as 1 μm or more is considered. In such a case, it is difficult to form the p$^+$-type semiconductor region SA1 having a relatively large height in the thickness direction of the p-type body layer 3, that is, the vertical direction (Z-axis direction) by introducing a p-type impurity into the p-type body layer 3 in the same ion implantation process.

In this case, a plurality of ion implantation processes is performed while changing the energy of ions to be implanted to thereby form a plurality of p$^+$-type semiconductor regions SA5 and SA6 in the thickness direction of the p-type body layer 3, that is, the vertical direction (Z-axis direction). Then, the p$^+$-type semiconductor region SA1 constituted of the p$^+$-type semiconductor regions SA5 and SA6 is formed. Consequently, the p$^+$-type semiconductor region SA1 having a relatively large height can be formed.

However, in the fourth modification, the p$^+$-type semiconductor regions SA5 and SA6 are separated from each other. Even in such a case, for example, the distribution of a depletion layer near the interface between the p-type body layer 3 and the n$^-$-type drift layer 2 can be adjusted by adjusting the p-type impurity concentration in the p$^+$-type semiconductor regions SA5 and SA6. Accordingly, it is possible to decrease the intensity of an electric field in the periphery of bottom portion of the gate trench TR1, that is, to alleviate the concentration of an electric field, and to enhance the breakdown voltage of the semiconductor device.

<Method for Manufacturing Semiconductor Device in Cell Region>

Next, a method for manufacturing a semiconductor device in the cell region of the First Embodiment will be explained. FIGS. 8 to 15 are principal part cross-sectional views in the manufacturing process of the semiconductor device of the First Embodiment. FIGS. 8 to 15 are cross-sectional views along the A-A line in FIG. 1, which correspond to the cross-sectional view in FIG. 3.

Figure 8:
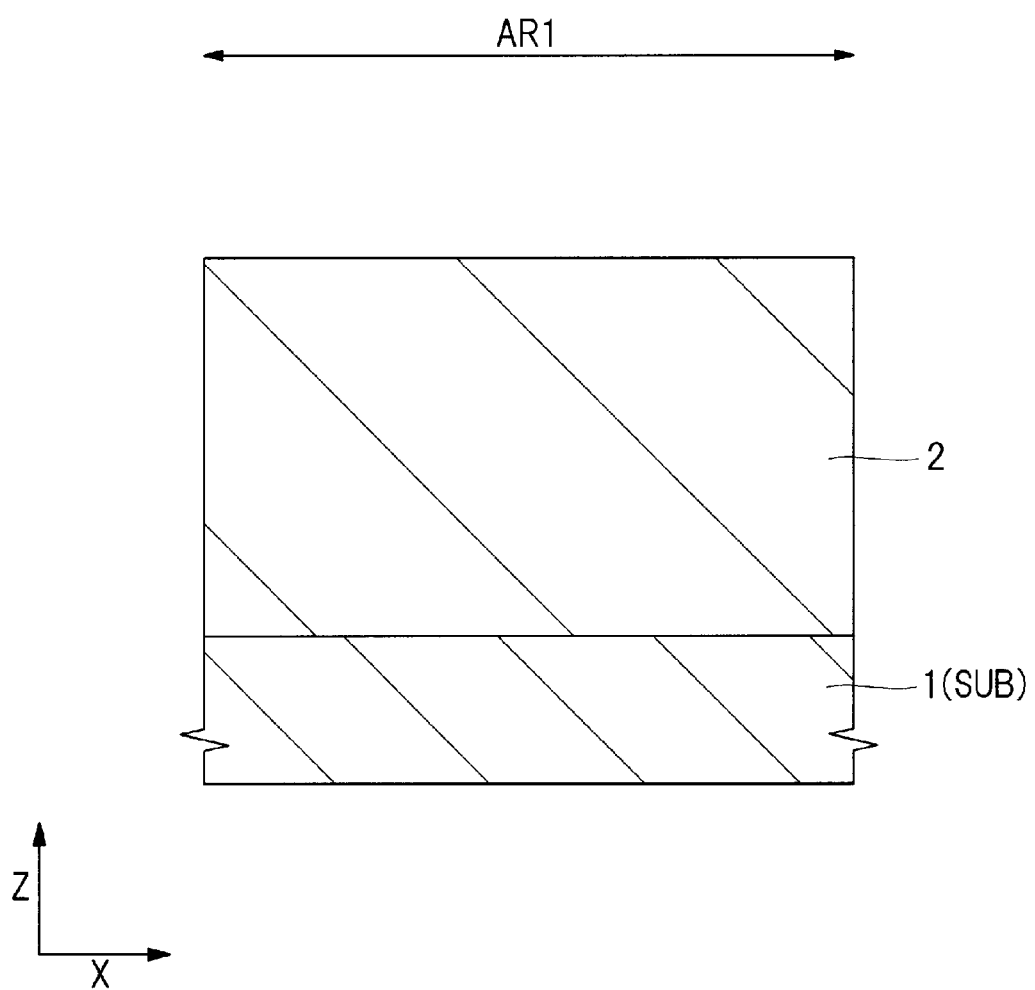
FIG. 8 is a principal part cross-sectional view in the manufacturing process of the semiconductor device of the First Embodiment.

First, as shown in FIG. 8, the n⁻-type drift layer 2 is formed on the upper surface side of the semiconductor substrate SUB. In the process for forming the n⁻-type drift layer 2, first, the semiconductor substrate SUB constituted of the n⁺⁺-type drain layer 1 is prepared, and, in the cell region AR1 of the upper surface of the semiconductor substrate SUB, the n⁻-type drift layer 2 is formed on the upper surface side of the n⁺⁺-type drain layer 1.

Specifically, the n⁻-type drift layer 2 in which an n-type impurity is introduced can be formed over the semiconductor substrate SUB constituted of the n⁺⁺-type drain layer 1 by performing epitaxial growth by, for example, a CVD method or the like. Alternatively, the n⁻-type drift layer 2 can be formed on the upper surface side of the semiconductor substrate SUB constituted of the n⁺⁺-type drain layer 1 by introducing a p-type impurity such as boron (B) into the upper layer portion of the semiconductor substrate SUB constituted of the n⁺⁺-type drain layer 1 by, for example, an ion implantation method.

The n⁺⁺-type drain layer 1 is constituted of, for example, silicon (Si) in which an n-type impurity such as phosphorus (P) or arsenic (As) is introduced, and is constituted of a semiconductor having a conductivity type of the n-type.

The n⁻-type drift layer 2 is an n-type semiconductor layer constituted of, for example, silicon in which an n-type impurity such as phosphorous or arsenic is introduced. The n-type impurity concentration in the n⁻-type drift layer 2 is lower than the n-type impurity concentration in the n⁺⁺-type drain layer 1, and can be set to be, for example, approximately $1 \times 10^{15}$-$1 \times 10^{17}$ atoms/cm³.

Figure 9:
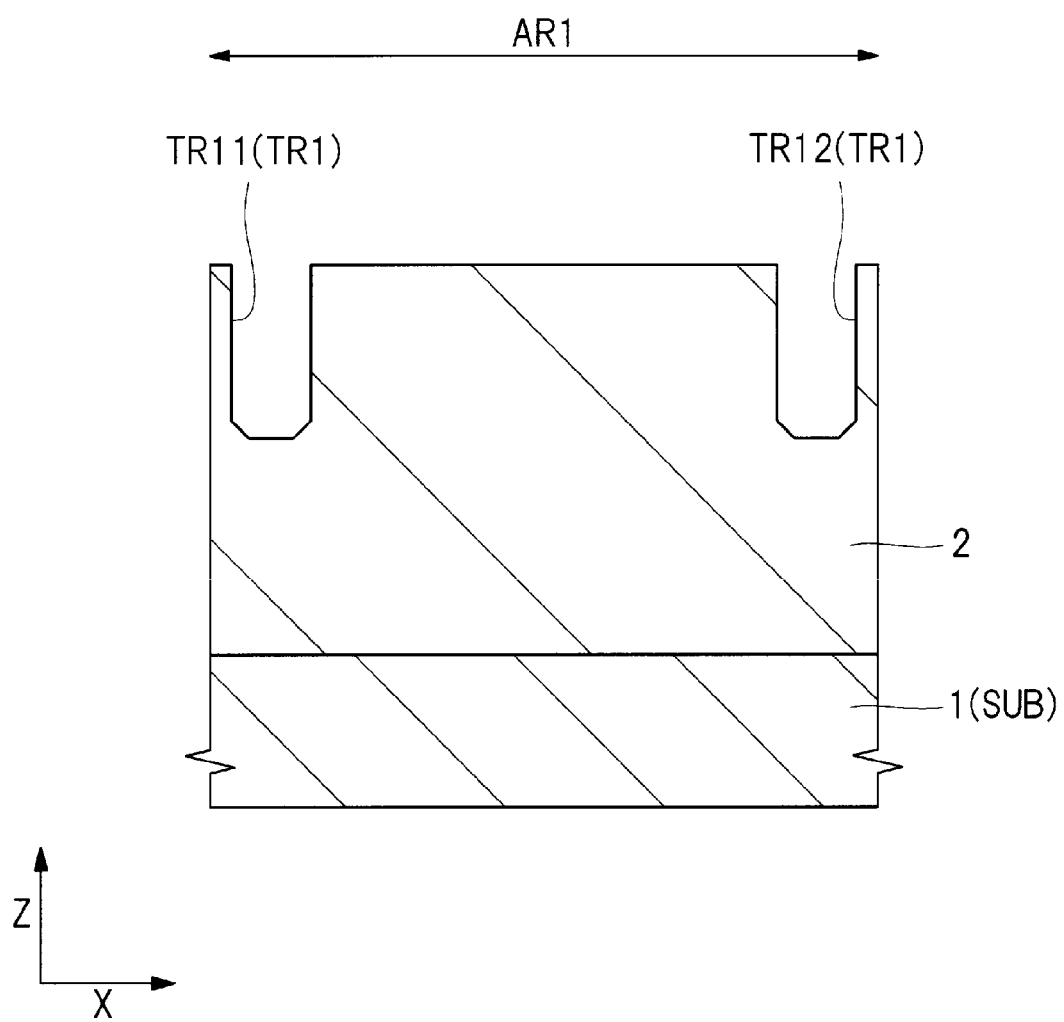
FIG. 9 is a principal part cross-sectional view in the manufacturing process of the semiconductor device of the First Embodiment.

Next, as shown in FIG. 9, the gate trench TR1 is formed. In the process for forming the gate trench TR1, the gate trench TR1 is formed in the upper surface of the n⁻-type drift layer 2 in the cell region AR1 by using a photolithographic technology and an etching technology. The gate trench TR1 reaches the middle of the n⁻-type drift layer 2 from the upper surface of the n⁻-type drift layer 2.

Specifically, first, an insulating film constituted of, for example, a silicon oxide film or the like is formed (illustration is omitted) over the n⁻-type drift layer 2. Next, a resist film constituted of a photoresist is applied over the insulating film, and a resist pattern (illustration is omitted) is formed by subjecting the applied resist film to exposure and development. Next, dry etching is performed using the formed resist pattern as a mask to thereby form a pattern constituted of the insulating film (illustration is omitted). Then, dry etching is performed using the pattern constituted of the insulating film as a mask to thereby form the gate trench TR1.

In the First Embodiment, the gate trenches TR11 and TR12 as the gate trench TR1 are formed. The gate trench TR11 reaches the middle of the n⁻-type drift layer 2 from the upper surface of the n⁻-type drift layer 2. In addition, the gate trench TR12 is disposed, in plan view, spaced apart from the gate trench TR11, and reaches the middle of the n⁻-type drift layer 2 from the upper surface of the n⁻-type drift layer 2.

Preferably, the gate trenches TR11 and TR12, in plan view, extend respectively in the Y-axis direction and are disposed spaced apart from each other in the X-axis direction. Thereby, the shape of a cross-section perpendicular to the Y-axis direction can be made equal in any position in the Y-axis direction.

Figure 10:
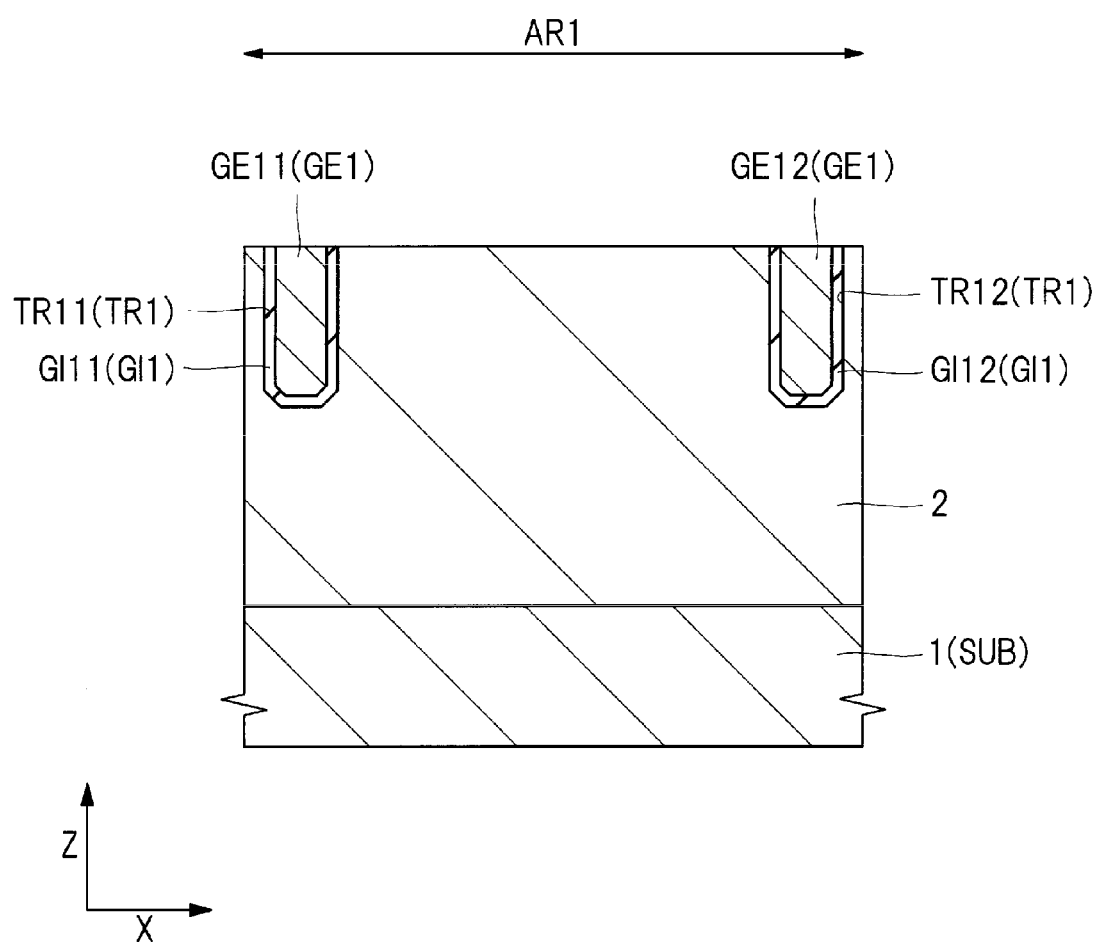
FIG. 10 is a principal part cross-sectional view in the manufacturing process of the semiconductor device of the First Embodiment.

Next, as shown in FIG. 10, the gate insulating film GI1 and the gate electrode GE1 are formed.

First, the gate insulating film GI1 is formed. In the process for forming the gate insulating film GI1, the gate insulating film GI1 is formed on the inner wall of the gate trench TR1 inside the gate trench TR1. At this time, the gate insulating film GI1 is formed over the n⁻-type drift layer 2, outside the gate trench TR1.

In the example shown in FIG. 10, the gate insulating film GI11 as the gate insulating film GI1 is formed on the inner wall of the gate trench TR11 as the gate trench TR1. In addition, the gate insulating film GI12 as the gate insulating film GI1 is formed on the inner wall of the gate trench TR12 as the gate trench TR1.

A gate insulating film constituted of, for example, a silicon oxide (SiO) film as the gate insulating film GI1 can be formed using a thermal oxidation method. Alternatively, a gate insulating film constituted of a silicon nitride oxide (SiON) film, a silicon nitride (SiN) film, or a high permittivity film having permittivity higher than the permittivity of a silicon nitride film, as the gate insulating film GI1, can be formed by, for example, a CVD method.

Next, the gate electrode GE1 is formed. In the process for forming the gate electrode GE1, the gate electrode GE1 is formed so as to be embedded in the gate trench TR1 over the gate insulating film GI1.

First, inside the gate trench TR1, for example, a polysilicon film in which an n-type impurity such as phosphorus (P) or arsenic (As) is introduced is formed using, for example, a CVD method so as to be embedded in the gate trench TR1 over the gate insulating film GI1. At this time, the above-described polysilicon film in which an n-type impurity is introduced is formed using, for example, a CVD method over the n⁻-type drift layer 2 via the gate insulating film GI1, outside the gate trench TR1.

Alternatively, it is also possible to form a polysilicon film in which no n-type impurity is introduced inside the gate trench TR1 and over the n⁻-type drift layer 2, and after that, to introduce the above-described n-type impurity into the polysilicon film by using an ion implantation method.

Then, the polysilicon film is patterned using a photolithographic technology and an etching technology. In the process for patterning the polysilicon film, the polysilicon film formed over the n⁻-type drift layer 2 via the gate insulating film GI1 is removed by, for example, dry etching, and the polysilicon film is left only inside the gate trench TR1. Thereby, the gate electrode GE1 can be formed so as to be embedded in the inside of the gate trench TR1.

Note that, in the example shown in FIG. 10, the gate insulating film GI1 in the portion formed over the n⁻-type drift layer 2 is also removed together with the polysilicon film.

Figure 11:
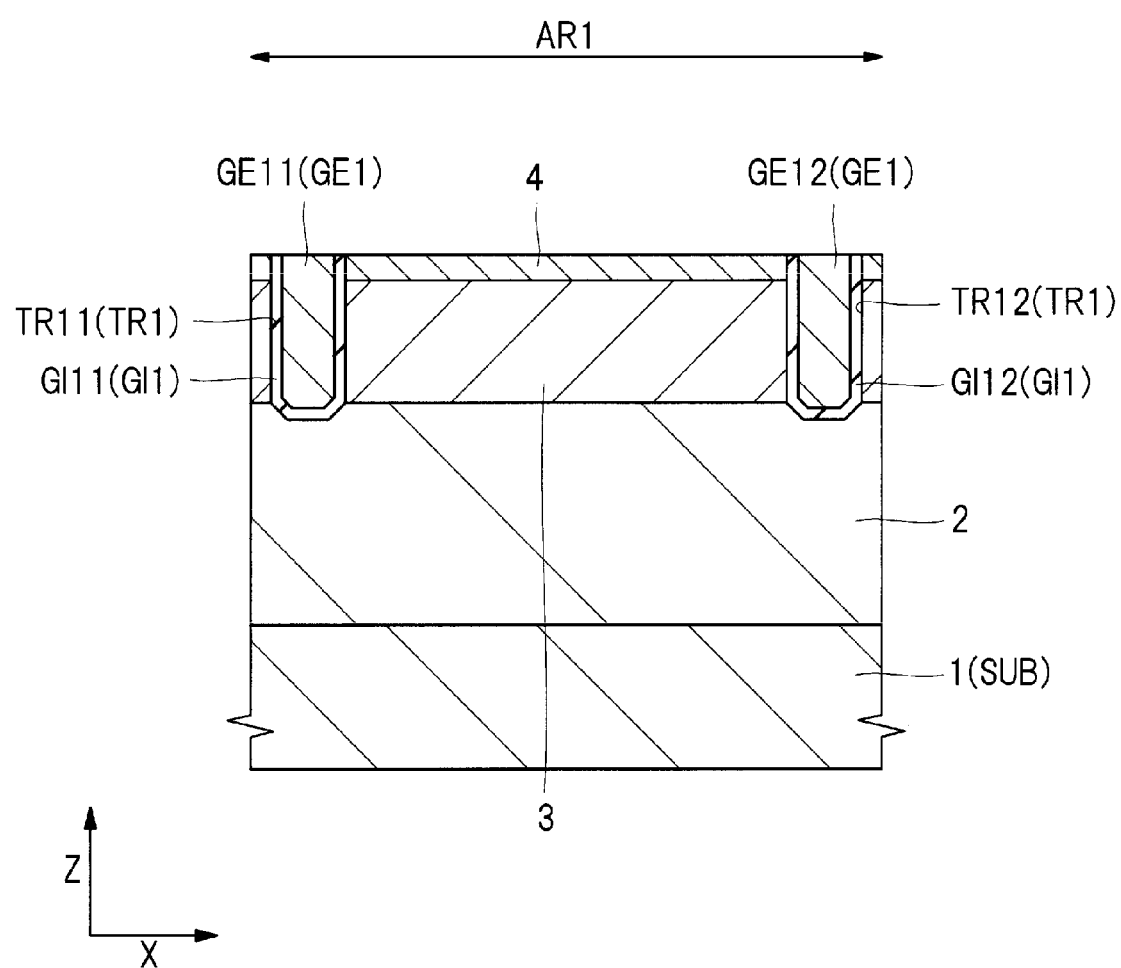
FIG. 11 is a principal part cross-sectional view in the manufacturing process of the semiconductor device of the First Embodiment.

After that, as shown in FIG. 11, the p-type body layer 3 and the n⁺-type source layer 4 are formed.

First, the p-type body layer 3 is formed. In the process for forming the p-type body layer 3, a p-type impurity such as boron (B) is introduced in the upper layer portion of the n⁻-type drift layer 2 in the cell region AR1 using, for example, an ion implantation method. Thereby, the p-type body layer 3 is formed in the upper layer portion of the n⁻-type drift layer 2 in the portion positioned between the gate trench TR11 and the gate trench TR12. The p-type impurity concentration in the p-type body layer 3 can be set to be, for example, approximately $1 \times 10^{15}$ to $1 \times 10^{18}$ atoms/cm³.

At this time, preferably, the p-type body layer 3 is formed so that the height position of the lower surface of the p-type body layer 3 is positioned higher than the height position of the lower surface of the gate trench TR1. Thereby, the gate trench TR1 has been formed so as to penetrate through the p-type body layer 3 to thereby reach the middle of the n⁻-type drift layer 2.

Next, the n⁺-type source layer 4 is formed. In the process for forming the n⁺-type source layer 4, an n-type impurity such as phosphorus (P) or arsenic (As) is introduced using, for example, an ion implantation method in the upper layer portion of the p-type body layer 3. Thereby, the n⁺-type source layer 4 is formed in the upper layer portion of the p-type body layer 3 in the portion positioned between the gate trench TR11 and the gate trench TR12. Namely, in the process for forming the n⁺-type source layer 4, the n⁺-type source layer 4 is formed over the p-type body layer 3 in the portion positioned between the gate trench TR11 and the gate trench TR12.

Note that the gate trench TR1 may be formed after forming the n⁻-type drift layer 2 and before forming the gate trench TR1, and after forming the p-type body layer 3 and the n⁺-type source layer 4.

Figure 12:
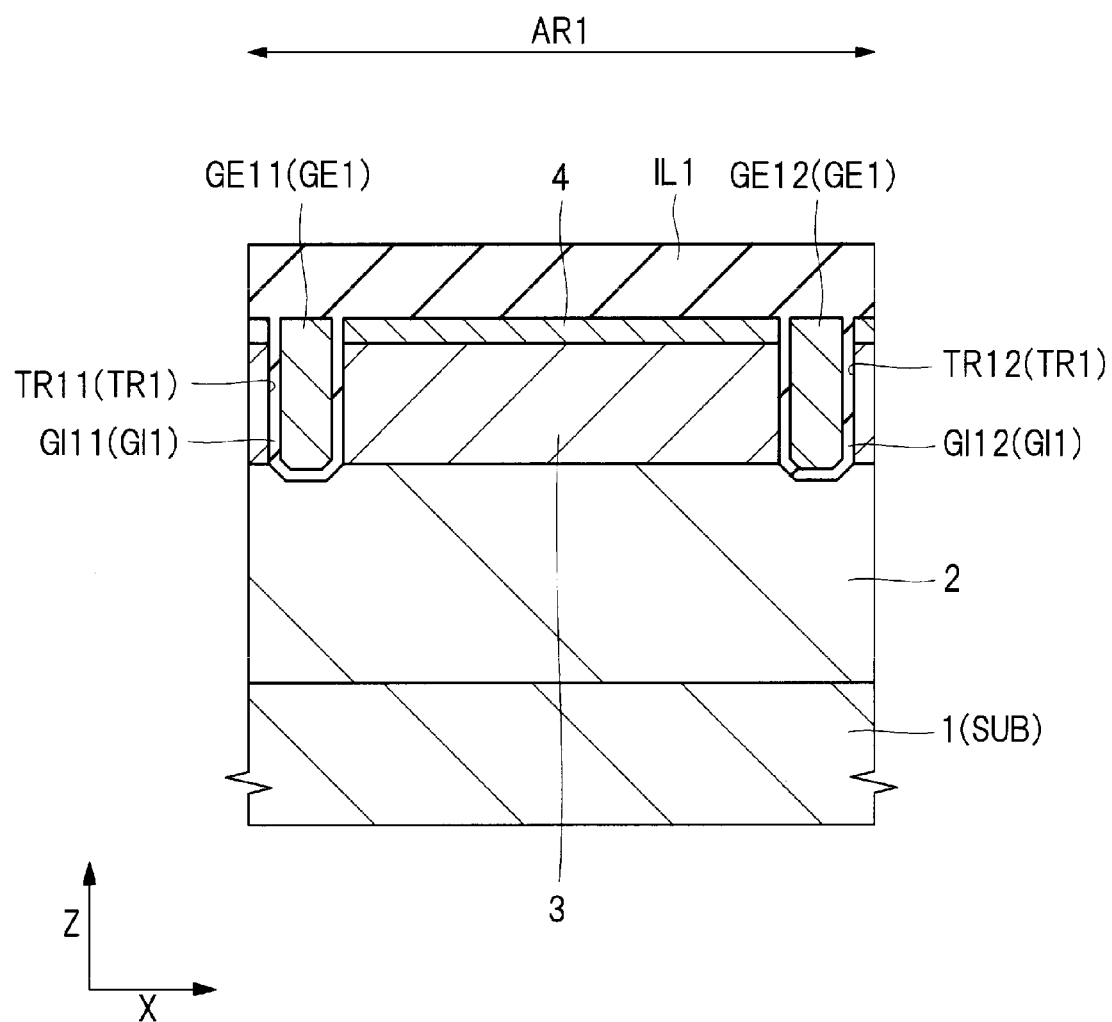
FIG. 12 is a principal part cross-sectional view in the manufacturing process of the semiconductor device of the First Embodiment.

Subsequently, as shown in FIG. 12, the interlayer insulating film IL1 is formed. In the process for forming the interlayer insulating film IL1, the interlayer insulating film IL1 constituted of, for example, a silicon oxide film is formed using, for example, a CVD method over the n⁺-type source layer 4 in the cell region AR1. Note that, in FIG. 12, the interlayer insulating film IL1 constituted of, for example, a silicon oxide film is shown integrally with the gate insulating film GI1 constituted of, for example, a silicon oxide film.

Figure 13:
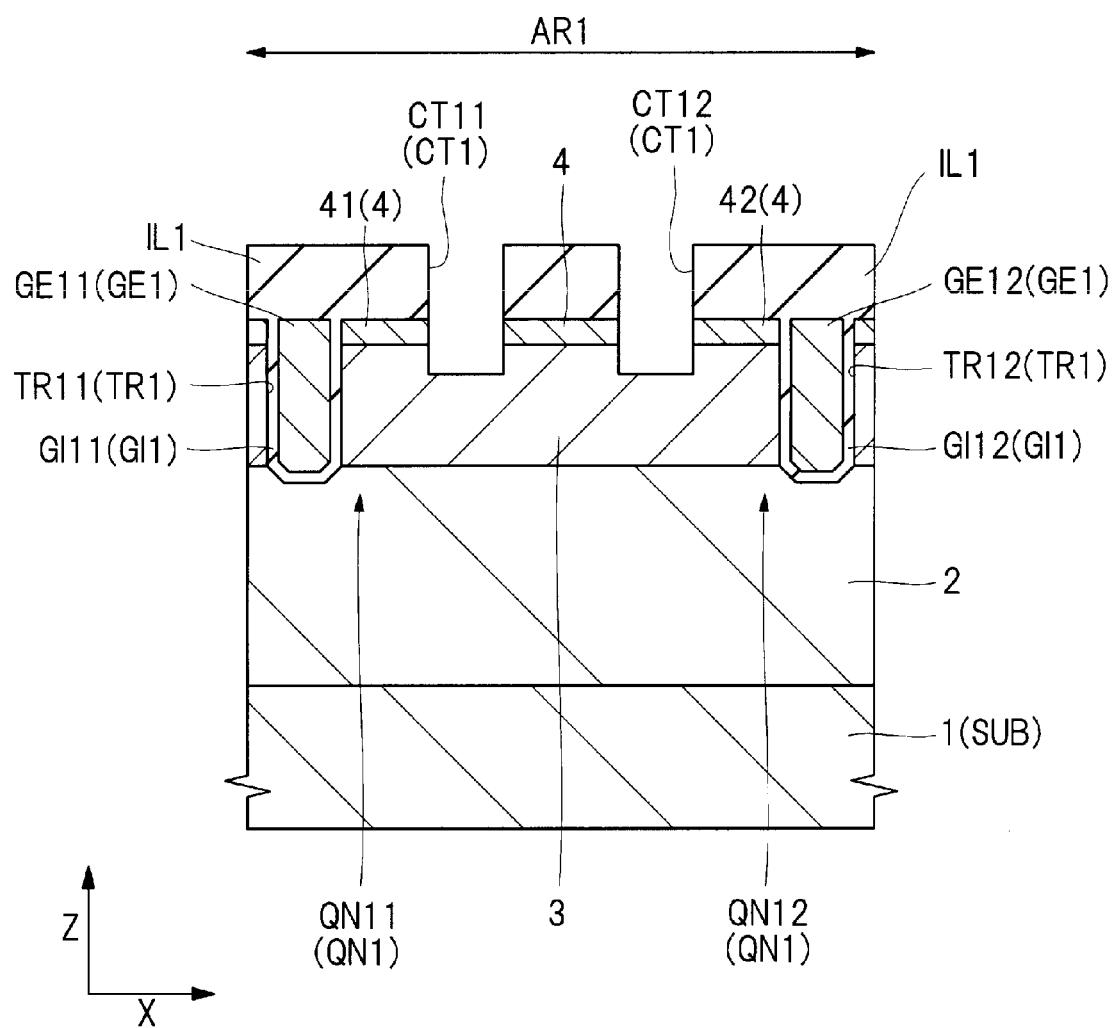
FIG. 13 is a principal part cross-sectional view in the manufacturing process of the semiconductor device of the First Embodiment.

Then, as shown in FIG. 13, the contact trench CT1 is formed. In the process for forming the contact trench CT1, the contact trench CT1 that penetrates through the interlayer insulating film IL1 and the n⁺-type source layer 4 to thereby reach the middle of the p-type body layer 3 is formed using a photolithographic technology and an etching technology.

Specifically, first, a resist pattern (illustration is omitted) is formed by applying a resist film constituted of a photoresist over the interlayer insulating film IL1 and subjecting the applied resist film to exposure and development. Next, the contact trench CT1 that penetrates through the interlayer insulating film IL1 and the n⁺-type source layer 4 to thereby reach the middle of the p-type body layer 3 is formed by performing dry etching using the formed resist pattern as a mask.

In the example shown in FIG. 13, the contact trenches CT11 and CT12 as the contact trench CT1 are formed. The contact trenches CT11 and CT12 are formed, in plan view, spaced apart from each other. The contact trench CT11 penetrates through the interlayer insulating film IL1 and the n⁺-type source layer 4 in the portion positioned, in plan view, between the gate trench TR11 and the gate trench TR12 to thereby reach the middle of the p-type body layer 3. The contact trench CT12 penetrates through the interlayer insulating film IL1 and the n⁺-type source layer 4 in the portion positioned, in plan view, between the contact trench CT11 and the gate trench TR12 to thereby reach the middle of the p-type body layer 3.

Preferably, the contact trenches CT11 and CT12, in plan view, extend respectively in the Y-axis direction and are disposed spaced apart from each other in the X-axis direction. Thereby, the shape of a cross-section perpendicular to the Y-axis direction can be made equal in any position in the Y-axis direction.

Note that, an opening that reaches the middle of the p-type body layer 3 from the upper surface of the p-type body layer 3 may be formed after forming the p-type body layer 3 and before forming the n⁺-type source layer 4. Then, the n⁺-type source layer 4 may be formed by introducing an n-type impurity such as phosphorus (P) or arsenic (As) into the upper layer portion of the p-type body layer 3 in the portion positioned, in plan view, between the opening and the gate trench TR1 by using, for example, an ion implantation method.

A portion that is positioned between the gate trench TR11 and the gate trench TR12 and that is in contact with the p-type body layer 3 in the portion positioned in the periphery of the gate trench TR11 and with the gate insulating film GI11, of the n⁺-type source layer 4, is set to be the n⁺-type source layer 41. Furthermore, a portion that is positioned between the gate trench TR11 and the gate trench TR12 and that is in contact with the p-type body layer 3 in the portion positioned in the periphery of the gate trench TR12 and with the gate insulating film GI12, of the n⁺-type source layer 4, is set to be the n⁺-type source layer 42.

At this time, the vertical MISFET QN11 as the vertical MISFET QN1 is formed by the n⁻-type drift layer 2, the p-type body layer 3 in the portion positioned between the gate trench TR11 and the gate trench TR12 and positioned in the periphery of the gate trench TR11, the n⁺-type source layer 41, the gate insulating film GI11 and the gate electrode GE11. In addition, the vertical MISFET QN12 as the vertical MISFET QN1 is formed by the n⁻-type drift layer 2, the p-type body layer 3 in the portion positioned between the gate trench TR11 and the gate trench TR12 and positioned in the periphery of the gate trench TR12, the n⁺-type source layer 42, the gate insulating film GI12 and the gate electrode GE12.

Figure 14:
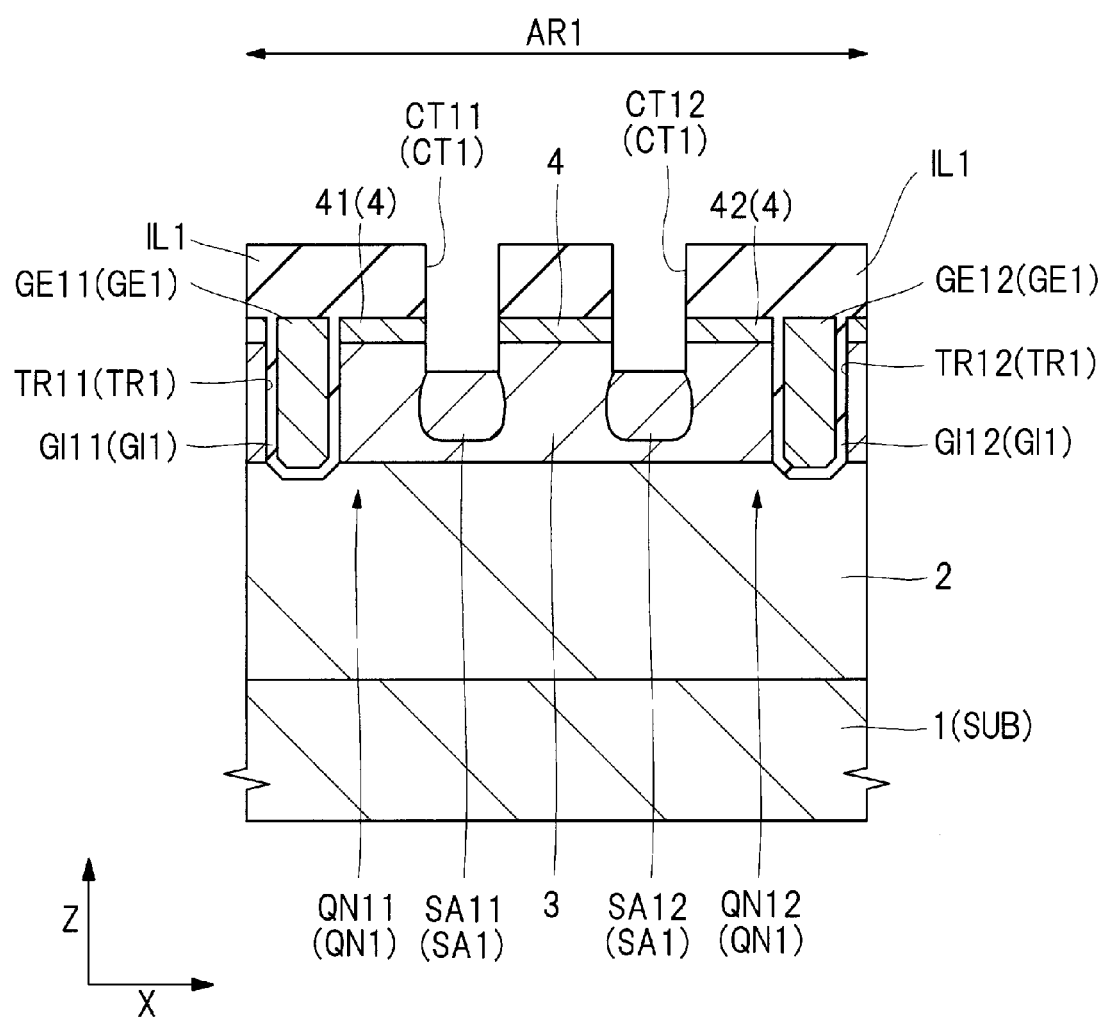
FIG. 14 is a principal part cross-sectional view in the manufacturing process of the semiconductor device of the First Embodiment.

Next, as shown in FIG. 14, the p⁺-type semiconductor region SA1 is formed. In the process for forming the p⁺-type semiconductor region SA1, a plurality of p⁺-type semiconductor regions SA1 are formed inside the p-type body layer 3 in the portion positioned between the gate trench TR11 and the gate trench TR12 by using, for example, a photolithographic technology and an ion implantation method. The p-type impurity concentration in any of the p⁺-type semiconductor regions SA1 is higher than the p-type impurity concentration in the p-type body layer 3.

Hereinafter, an example of forming the p⁺-type semiconductor regions SA11 and SA12 as two p⁺-type semiconductor regions SA1 inside the p-type body layer 3 by using the interlayer insulating film IL1 and the n⁺-type source layer 4 in which two contact trenches CT11 and CT12 are formed as a mask will be explained.

Specifically, a p-type impurity such as boron (B) is introduced by an ion implantation method through the use, as a mask, of the interlayer insulating film IL1 and the n⁺-type source layer 4 in which the contact trenches CT11 and CT12 are formed. Thereby, the p⁺-type semiconductor region SA11 is formed, in plan view, inside the p-type body layer 3 in the portion overlapping with the contact trench CT11, and the p⁺-type semiconductor region SA12 is formed, in plan view, inside the p-type body layer 3 in the portion overlapping with the contact trench CT12.

That is, the p⁺-type semiconductor region SA11 is formed inside the p-type body layer 3 in the portion positioned, in plan view, between the gate trench TR11 and the gate trench TR12. The p⁺-type semiconductor region SA12 is formed to be separated from the p⁺-type semiconductor region SA11, inside the p-type body layer 3 in the portion positioned, in plan view, between the p⁺-type semiconductor region SA11 and the gate trench TR12.

Preferably, the p-type impurity concentration in the p⁺-type semiconductor region SA1 is, for example, approximately $1\times10^{16}$ to $1\times10^{22}$ atoms/cm$^3$ and is higher than the p-type impurity concentration in the p-type body layer 3.

Note that a plurality of ion implantation processes may be performed while changing the energy of ions to be implanted. Thereby, as explained in the third modification and the fourth modification of the p$^+$-type semiconductor region, it is possible to form a plurality of p$^+$-type semiconductor regions in the thickness direction of the p-type body layer 3, that is, the vertical direction (Z-axis direction) to thereby form the p$^+$-type semiconductor region SA1 constituted of the formed plurality of p$^+$-type semiconductor regions.

Note that, after forming the p-type body layer 3 and before forming the interlayer insulating film IL1, a plurality of p$^+$-type semiconductor regions SA1 can also be formed using a photolithographic technology and an ion implantation method, in plan view, inside the p-type body layer 3 in the portion not overlapping with a region in which the contact trench CT1 is to be formed.

Figure 15:
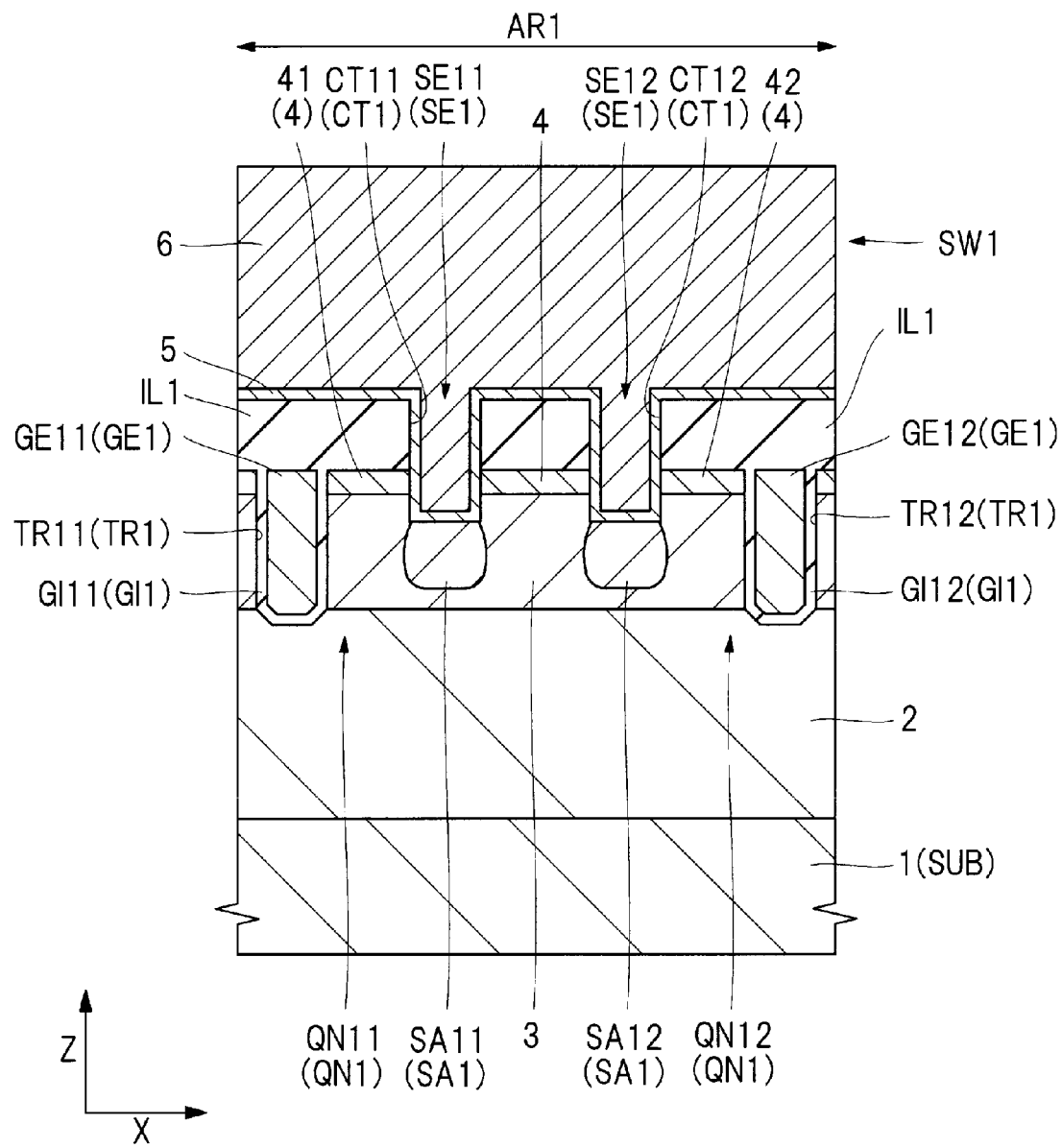
FIG. 15 is a principal part cross-sectional view in the manufacturing process of the semiconductor device of the First Embodiment.

Next, as shown in FIG. 15, the source electrode SE1 and the source wiring SW1 are formed. In the process for forming the source electrode SE1 and the source wiring SW1, the source electrode SE1 is formed inside the contact trench CT1 so as to be embedded in the inside of the contact trench CT1. In addition, the source wiring SW1 is formed over the source electrode SE1 and over the interlayer insulating film IL1, outside the contact trench CT1.

First, the barrier conductor film 5 is formed on the inner wall of the contact trench CT1 and over the interlayer insulating film IL1. As the barrier conductor film 5, for example, a conductor film constituted of a titanium nitride (TiN) film or a titanium-tungsten (TiW) film can be formed using, for example, a sputtering method or an evaporation method. The barrier conductor film 5 is a so-called conductor film having barrier properties that prevents aluminum (Al) being a material of the conductor film 6 formed over the barrier conductor film 5, from diffusing into the inside of silicon (Si).

Next, inside the contact trench CT1, the conductor film 6 is formed so as to be embedded inside the contact trench CT1 over the barrier conductor film 5 and, outside the contact trench CT1, the conductor film 6 is formed over the interlayer insulating film IL1 via the barrier conductor film 5. As the conductor film 6, for example, a conductor film constituted of an aluminum (Al) film or one obtained by incorporating, for example, silicon (Si) or copper (Cu) in a conductor film constituted of an aluminum film can be formed using, for example, a sputtering method or an evaporation method.

Next, the source electrode SE1 and the source wiring SW1 are formed by patterning the conductor film 6 and the barrier conductor film 5 using a photolithographic technology and an etching technology.

Subsequently, after forming a protective film (not shown) so as to cover the source wiring SW1, an opening is formed by the removal of the protective film over the portion serving as a source pad of the source wiring SW1 through the use of a photolithographic technology and an etching technology. In addition, a conductor film constituted of, for example, an alloy containing silver (Ag), gold (Au) or the like as a main component is formed as the drain electrode DE1 on the lower surface side of the n$^{++}$-type drain layer 1, by using, for example, a sputtering method or an evaporation method. Thereby, as shown in FIG. 3, the semiconductor device including a vertical MISFET of an n-channel type and of a trench gate type is formed.

<Regarding Electric Field in Periphery of Bottom Portion of Gate Trench>

Figure 16:
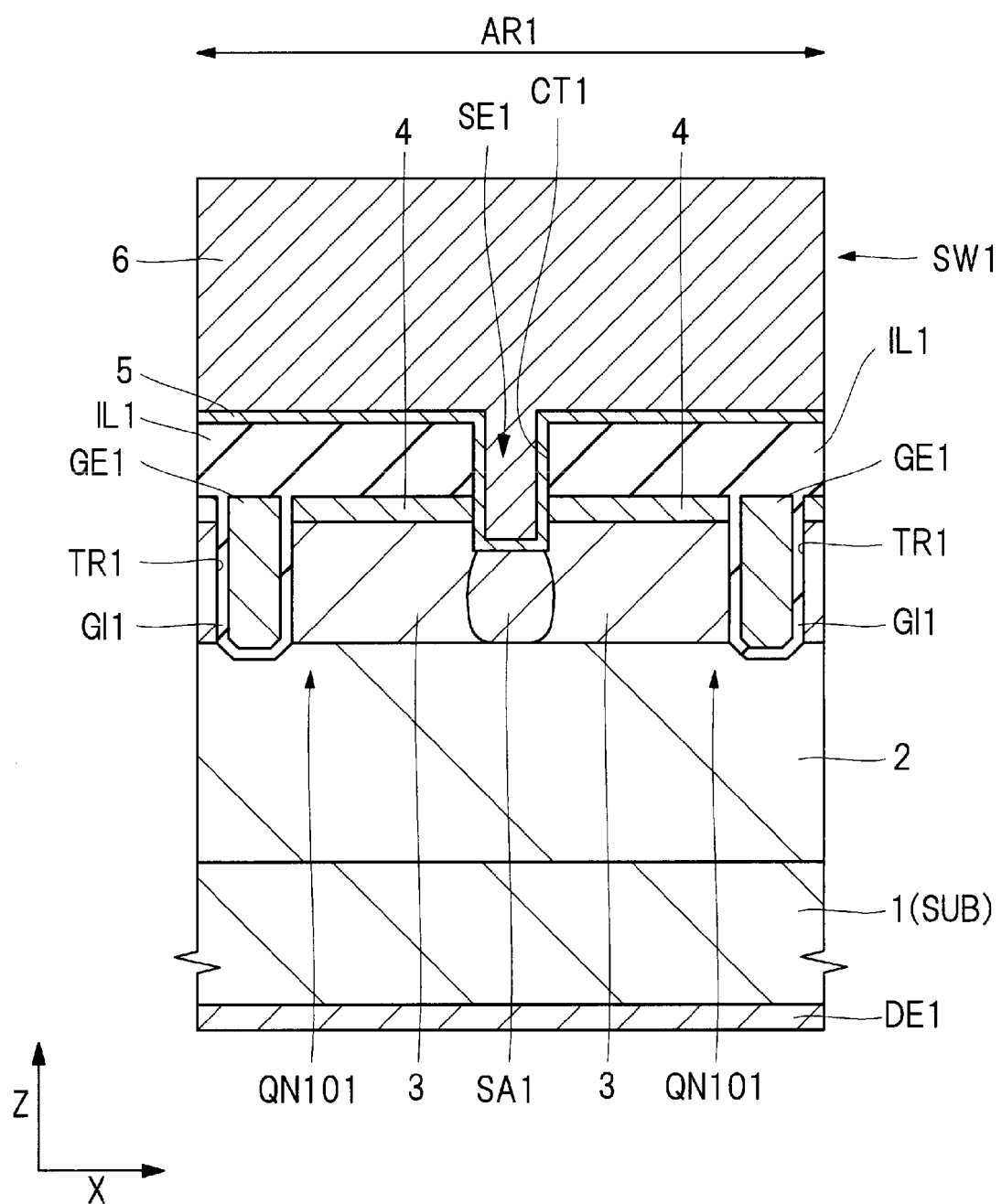
FIG. 16 is a principal part cross-sectional view of the semiconductor device in Comparative Example 1.
Figure 17:
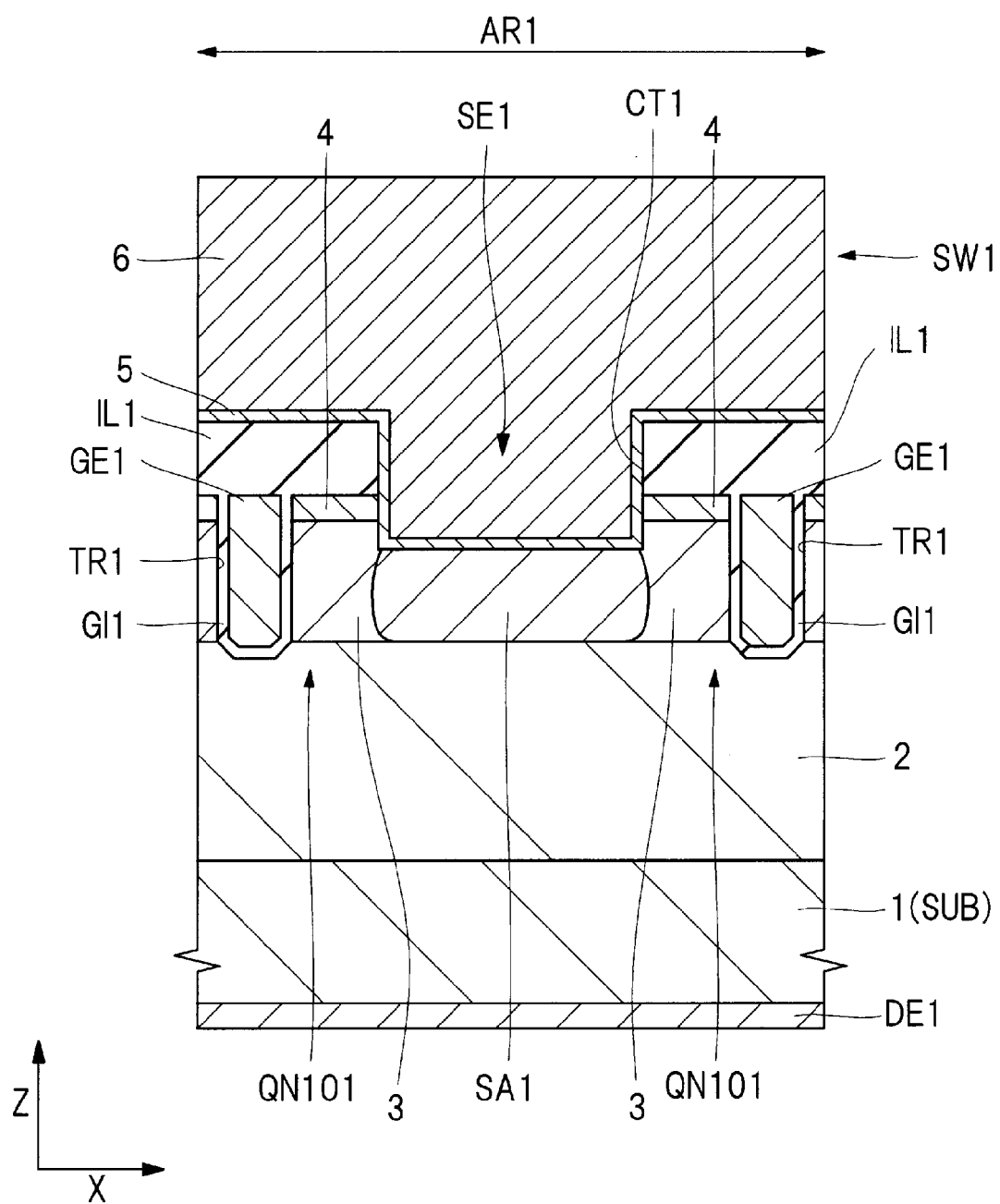
FIG. 17 is a principal part cross-sectional view of the semiconductor device in Comparative Example 2.

Next, an electric field in the periphery of the bottom portion of the gate trench TR1 will be explained while making a comparison between semiconductor devices in Comparative Example 1 and Comparative Example 2. FIG. 16 is a principal part cross-sectional view of a semiconductor device in Comparative Example 1. FIG. 17 is a principal part cross-sectional view of a semiconductor device in Comparative Example 2.

As shown in FIG. 16, in the same way as the semiconductor device of the First Embodiment, the semiconductor device in Comparative Example 1 has the semiconductor substrate SUB as the m$^{++}$-type drain layer 1, the n$^-$-type drift layer 2, the p-type body layer 3, the n$^+$-type source layer 4, the gate trench TR1, the gate insulating film GI1 and the gate electrode GE1. Furthermore, in the same way as the semiconductor device of the First Embodiment, the semiconductor device in Comparative Example 1 has the interlayer insulating film IL1, the contact trench CT1, the source electrode SE1 and the drain electrode DE1. In the semiconductor device in Comparative Example 1, a vertical MISFET QN101 is formed by the n$^-$-type drift layer 2, the p-type body layer 3, the n$^+$-type source layer 4, the gate insulating film GI1 and the gate electrode GE1.

On the other hand, unlike the semiconductor device of the First Embodiment, the semiconductor device in Comparative Example 1 does not have a plurality of p$^+$-type semiconductor region SA1 but has only one between the mutually adjacent two gate trenches TR1. The p-type impurity concentration in the p$^+$-type semiconductor region SA1 is higher than the p-type impurity concentration in the p-type body layer 3.

When causing a power MISFET to operate, in order to prevent thermal runaway by heat generation, a voltage between the drain electrode and the source electrode, and a drain current are set so as not to exceed the range of a safe operation area (SOA). Accordingly, in a power MISFET, it is desirable that the range of a safe operation area is expanded so that the voltage between the drain electrode and the source electrode can be made higher and the drain current can be made larger. For the purpose, in the semiconductor device in Comparative Example 1, a channel length is made long, and the p-type impurity concentration in the p-type body layer 3 is made low and uniform so that a parasitic bipolar transistor formed by the n$^+$-type source layer 4, the p-type body layer 3 and the n$^-$-type drift layer 2 does not operate. Alternatively, in the semiconductor device in Comparative Example 1, the channel width per unit area is made short in order to reduce a quantity of heat generation.

Among these, in order to make the channel width per unit area short, usually, the space between the mutually adjacent two gate trenches TR1 is widened. However, the intensity of an electric field in the periphery of the bottom portion of the gate trench TR1 becomes large by widening the space between the mutually adjacent two gate trenches TR1, and there is a risk that the breakdown voltage of the semiconductor device may lower.

When the space between the mutually adjacent two gate trenches TR1 is narrow, the intensity of an electric field in the periphery of the bottom portion of the gate trench TR1 can easily be made small by adjusting the positional relationship among the gate trench TR1, the p-type body layer 3 and the n$^-$-type drift layer 2. However, when the space between the mutually adjacent two gate trenches TR1 is widened, it is difficult to make the intensity of an electric field in the periphery of the bottom portion of the gate trench TR1 small by adjusting the positional relationship among the gate trench TR1, the p-type body layer 3 and n⁻-type drift layer 2. Consequently, for example, when the n-type impurity concentration in the n⁻-type drift layer 2 is made low in order to make the intensity of an electric field in the periphery of the bottom portion of the gate trench TR1 small, the electric resistance of the n⁻-type drift layer 2 becomes large. However, when the electric resistance of the n⁻-type drift layer 2 becomes large, ON resistance of the vertical MISFET QN101 increases.

That is, in the case of a semiconductor device including a vertical MISFET, the breakdown voltage is likely to decrease by the increase in the intensity of an electric field in the periphery of the bottom portion of the gate trench. On the other hand, in a semiconductor device including a vertical MISFET, the enhancement of the breakdown voltage and the reduction of ON resistance have a trade-off relation mutually. Accordingly, in a semiconductor device including a vertical MISFET, the ON resistance may increase in order to obtain a necessary breakdown voltage and thus the performance of the semiconductor device decreases.

In the semiconductor device in Comparative Example 1, when a part of the p⁺-type semiconductor region SA1 is in contact with the source electrode SE1, it is possible to couple the source electrode SE1 to the p-type body layer 3 in a state of electrically low-resistance via the p⁺-type semiconductor region SA1. Furthermore, in the semiconductor device in Comparative Example 1, by making the p-type impurity concentration in the p-type body layer 3 low, it is possible to set a parasitic bipolar transistor formed by the n⁺-type source layer 4, p-type body layer 3 and the n⁻-type drift layer 2 not to operate. The operation of such a parasitic bipolar transistor is generated, for example, when the vertical MISFET QN101 is switched from an ON state to an OFF state in the case where a load of a large inductance is coupled to a semiconductor device.

However, the semiconductor device in Comparative Example 1 has only one p⁺-type semiconductor region SA1 disposed between the mutually adjacent two gate trenches TR1. Therefore, when the space between the mutually adjacent two gate trenches TR1 is widened, the one p⁺-type semiconductor region is separated from at least one of the mutually adjacent two gate trenches TR1, and thus it is difficult to make the intensity of an electric field in the periphery of the bottom portion of the gate trench TR1 small.

Alternatively, as shown in FIG. 17 as the semiconductor device in Comparative Example 2, it is also considered that the width in the X-axis direction of the p⁺-type semiconductor region SA1 disposed between the mutually adjacent two gate trenches TR1 is widened. However, when the width in the X-axis direction of the p⁺-type semiconductor region SA1 becomes wide, conversely, the intensity of an electric field in the periphery of the p⁺-type semiconductor region SA1 becomes large, and thus the breakdown voltage of the semiconductor device may lower.

<Main Feature and Effect of the Present Embodiment>

On the other hand, the semiconductor device of the First Embodiment has, as shown in FIG. 3, the p⁺-type semiconductor region SA1 disposed between the mutually adjacent two gate trenches TR1 in plural number in the cell region AR1. The p⁺-type semiconductor regions SA1 are disposed spaced apart from each other, in plan view, in the p-type body layer 3 in the portion positioned between the mutually adjacent two gate trenches TR1. Any p-type impurity concentration in each of the p⁺-type semiconductor regions SA1 is higher than the p-type impurity concentration in the p-type body layer 3.

Thereby, in plan view, the distribution of a depletion layer near the interface between the p-type body layer 3 in the portion positioned between the mutually adjacent two gate trenches TR1, and the n⁻-type drift layer 2 can be adjusted. Consequently, even when the space between the mutually adjacent two gate trenches TR1 is widened, the intensity of an electric field in the periphery of the bottom portion of respective gate trenches TR1 can easily be made small. Accordingly, it is possible to enhance the breakdown voltage of the semiconductor device, and to enhance the performance of the semiconductor device.

Furthermore, according to the semiconductor device of the First Embodiment, it is unnecessary, for example, to make the n-type impurity concentration in the n⁻-type drift layer 2 low and to make the electric resistance of the n⁻-type drift layer 2 large, in order to make the intensity of an electric field in the periphery of the bottom portion of respective gate trenches TR1 low. Accordingly, the breakdown voltage of the semiconductor device can be enhanced without increasing the ON resistance of the vertical MISFET. That is, according to the semiconductor device of the First Embodiment, even when the space of the mutually adjacent two gate trenches TR1 is widened, the breakdown voltage of the semiconductor device can be enhanced without increasing the ON resistance of the vertical MISFET.

In addition, the channel width per unit area can be made short by widening the space between the mutually adjacent two gate trenches TR1. Accordingly, since the quantity of heat generation of the semiconductor device can be reduced, the range of the safe operation area of the semiconductor device can be widened.

Note that, also in the semiconductor device of the First Embodiment, when a part of the p⁺-type semiconductor region SA1 is in contact with the source electrode SE1, the source electrode SE1 and the p-type body layer 3 can be electrically coupled in a low-resistance state, via the p⁺-type semiconductor region SA1. Furthermore, also in the semiconductor device of the First Embodiment, it is possible to set the parasitic bipolar transistor formed by the n⁺-type source layer 4, the p-type body layer 3 and the n⁻-type drift layer 2, not to operate, by making the p-type impurity concentration in the p-type body layer 3 low.

Moreover, in the semiconductor device of the First Embodiment, it is unnecessary to widen the width in the X-axis direction of the p⁺-type semiconductor region SA1 disposed between the mutually adjacent two gate trenches TR1, as compared with the semiconductor device in Comparative Example 2. Therefore, there is no risk that the intensity of an electric field in the periphery of the p⁺-type semiconductor region SA1 becomes large.

Figure 18:
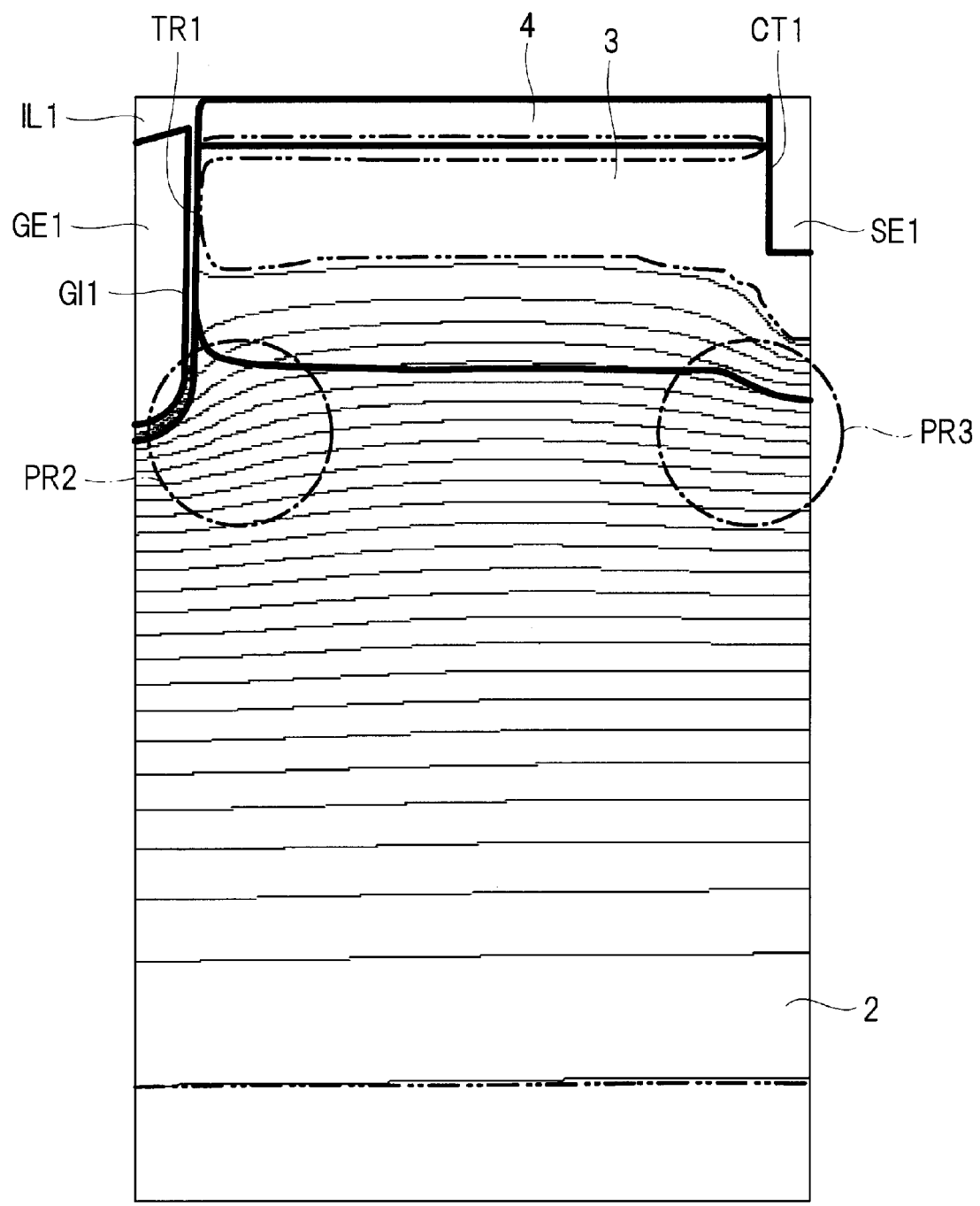
FIG. 18 is a drawing showing a simulation result of an electric potential distribution inside the semiconductor device in Comparative Example 1.
Figure 19:
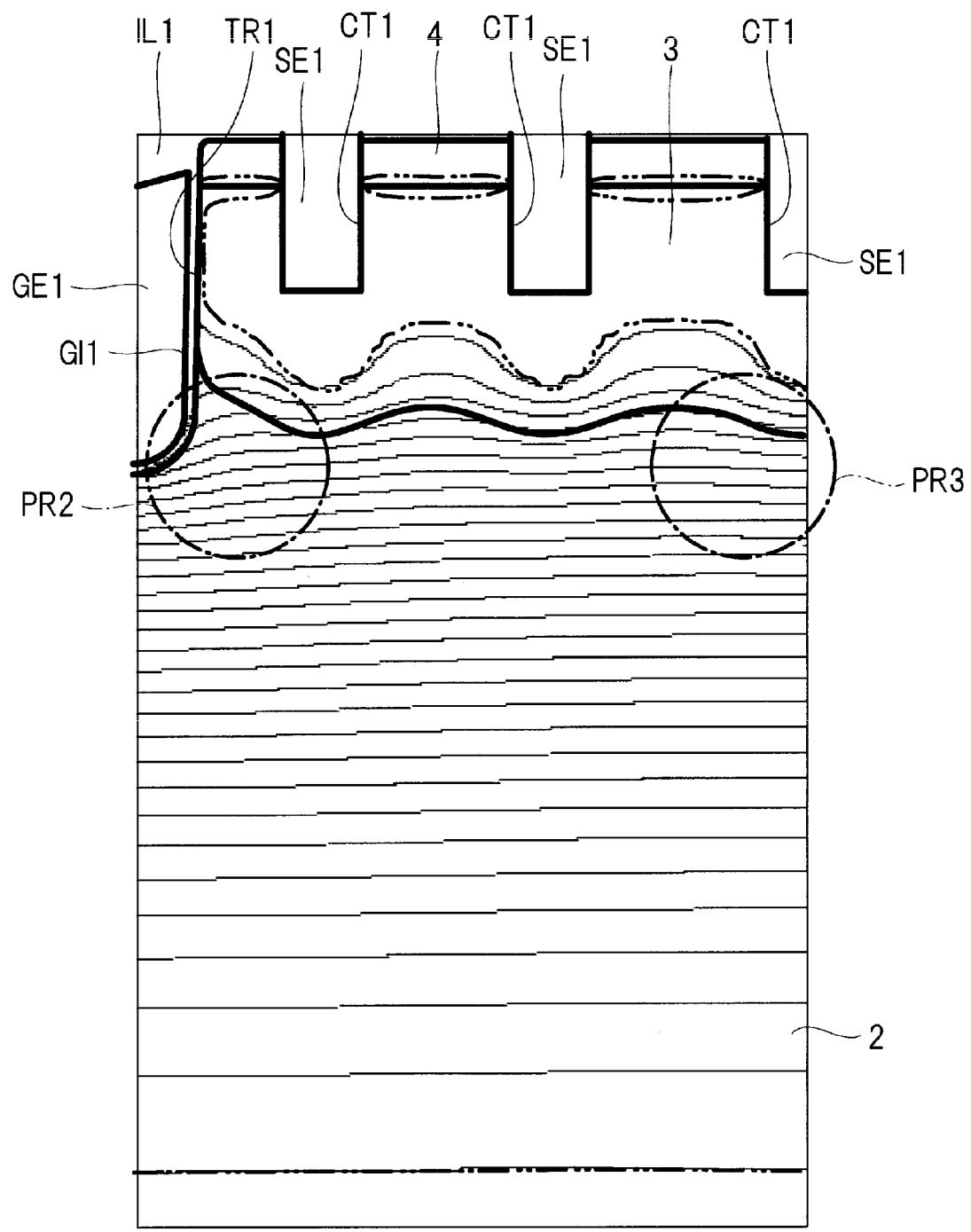
FIG. 19 is a drawing showing a simulation result of an electric potential distribution inside the semiconductor device in Embodiment Example 1.

Here, the comparison of the electric potential distribution inside the semiconductor device is made between the case of having the p⁺-type semiconductor region SA1 in plural number and the case of having one p⁺-type semiconductor region SA1. FIG. 18 is a drawing showing a simulation result of an electric potential distribution inside the semiconductor device in Comparative Example 1. FIG. 19 is a drawing showing a simulation result of an electric potential distribution inside the semiconductor device in Embodiment Example 1 as an embodiment example of the First Embodiment.

In the simulation of the electric potential distribution, the p⁺-type semiconductor region SA1 was defined as being formed, in plan view, inside the p-type body layer 3 in the portion overlapping with the contact trench CT1.

Furthermore, as described above, the n-type impurity concentration in the n⁻-type drift layer 2 was set to be, for example, approximately $1 \times 10^{15}$ to $1 \times 10^{17}$ atoms/cm³. Further, the p-type impurity concentration in the p-type body layer 3 was set to be, for example, approximately $1 \times 10^{15}$ to $1 \times 10^{18}$ atoms/cm³. Moreover, the p-type impurity concentration in the p⁺-type semiconductor region SA1 was s set to be, for example, approximately $1 \times 10^{16}$ to $1 \times 10^{22}$ atoms/cm³. In FIGS. 18 and 19, representative examples of simulation results thus obtained are shown.

Meanwhile, in FIGS. 18 and 19, in plan view, the result regarding a half portion positioned on one side from the center (the left side in FIGS. 18 and 19), of the p-type body layer 3 and the n⁻-type drift layer 2 in the portion positioned between the mutually adjacent two gate trenches TR1. In addition, in FIG. 19, the result of an example in which the semiconductor device of the First Embodiment has five p⁺-type semiconductor regions SA1 that are disposed between the mutually adjacent two gate trenches TR1 is shown. Furthermore, in FIGS. 18 and 19, the interface between the n⁻-type drift layer 2 and the p-type body layer 3, and the interface between the p-type body layer 3 and the n⁺-type source layer 4 are shown by a thick solid line, the outer periphery of the depletion layer is shown by a dashed two-dotted line, and equipotential lines are shown by a thin solid line.

In Embodiment Example 1, as compared with Comparative Example 1, in the portion PR2 surrounded by the dashed one-dotted line, that is, in the periphery of the bottom portion of the gate trench TR1, the curvature of the equipotential line becomes small and the irregular shape of the equipotential line is alleviated and becomes flat. Consequently, in the portion PR2, the concentration of the electric field is alleviated. Accordingly, the intensity of an electric field in the periphery of the bottom portion of the gate trench TR1 can be made small.

Furthermore, in the same way, in Embodiment Example 1 as compared with Comparative Example 1, the curvature of the equipotential line becomes small, and the irregular shape of the equipotential line is alleviated and becomes flat, in the portion PR3 surrounded by the dashed one-dotted line, that is, on the lower side of the contact trench CT1 positioned in the middle of the mutually adjacent two gate trenches TR1. Therefore, the concentration of the electric field is alleviated in the portion PR3. Accordingly, the intensity of an electric field in the lower portion of the contact trench CT1 positioned in the middle of the mutually adjacent two gate trenches TR1 can be made small.

Furthermore, in Embodiment Example 1, the semiconductor device has five p⁺-type semiconductor regions SA1 that are disposed between the mutually adjacent two gate trenches TR1. In the periphery at each bottom portion of these five p⁺-type semiconductor regions SA1, the depletion layer moves to the n⁻-type drift layer 2 side, that is, is pushed downward. Also according to this, in the portions PR2 and PR3, the curvature of the equipotential line becomes small, and the irregular shape of the equipotential line is alleviated and becomes flat. Therefore, the concentration of the electric field is alleviated in the portions PR2 and PR3.

Furthermore, in Embodiment Example 1, in the n⁻-type drift layer 2, the depletion layer extends to the side opposite to the p-type body layer 3 side. That is, the depletion in the n⁻-type drift layer 2 is accelerated. Thereby, the breakdown voltage of the semiconductor device can be enhanced.

Note that, in the First Embodiment, for example, the conductivity type of each of the n⁺⁺-type drain layer 1, the n⁻-type drift layer 2, the p-type body layer 3, the n⁺-type source layer 4 and the p⁺-type semiconductor region SA1 may be changed to the inverse conductivity type as a whole. In this case, a vertical MISFET of a p-channel type and a trench gate type is formed by the p⁻-type drift layer, the n-type body layer, the p⁺-type source layer, the gate insulating film and the gate electrode. Then, a semiconductor device including the vertical MISFET of a p-channel type and a trench gate type has resultantly the same effect as that of the semiconductor device of the First Embodiment, by the n⁺-type semiconductor regions having the conductivity type reverse to the conductivity type of the p⁺-type semiconductor regions SA1.

Second Embodiment

In the First Embodiment, the p⁺-type semiconductor region is disposed in plural number between the mutually adjacent two gate trenches in the cell region. In contrast, in a Second Embodiment, the p⁺-type semiconductor region is disposed in the periphery of the outermost peripheral gate trench in the gate wiring-lead-out region.

<Semiconductor Device>

In the semiconductor device of the Second Embodiment, the configuration in the portion formed in the cell region can be set to be the same as the configuration of the semiconductor device of the First Embodiment, and the explanation thereof is omitted. Note that, when the configuration in the portion formed in the cell region in the semiconductor device of the Second Embodiment is the same as the configuration of the semiconductor device of the First Embodiment, the top view of the semiconductor chip in which the semiconductor device of the Second Embodiment is formed is the same as the top view of the semiconductor chip shown in FIG. 1.

Alternatively, the configuration in the portion formed in the cell region AR1 (see FIG. 1) in the semiconductor device of the Second Embodiment may be set to be the same as the configuration of the semiconductor device in Comparative Example 1 explained in the First Embodiment.

Furthermore, in the example shown in FIG. 1, the gate wiring-lead-out region AR2 is positioned on a side closer to the outer periphery of the semiconductor substrate SUB than the cell region AR1. However, the gate wiring-lead-out region AR2 may not be positioned on a side closer to the outer periphery of the semiconductor substrate SUB than the cell region AR1, for example, but may be positioned on a side closer to the center of the semiconductor substrate SUB than the cell region AR1. At this time, the outermost peripheral gate trench TR2 is a gate trench for leading out gate wiring, the outermost peripheral gate insulating film GI2 is a gate insulating film for leading out gate wiring, and the outermost peripheral gate electrode GE2 is a gate electrode for leading out gate wiring.

<Configuration of Semiconductor Device in Gate Wiring-Lead-Out Region>

Hereinafter, the configuration of the semiconductor device in the gate wiring-lead-out region AR2 will be explained.

Figure 20:
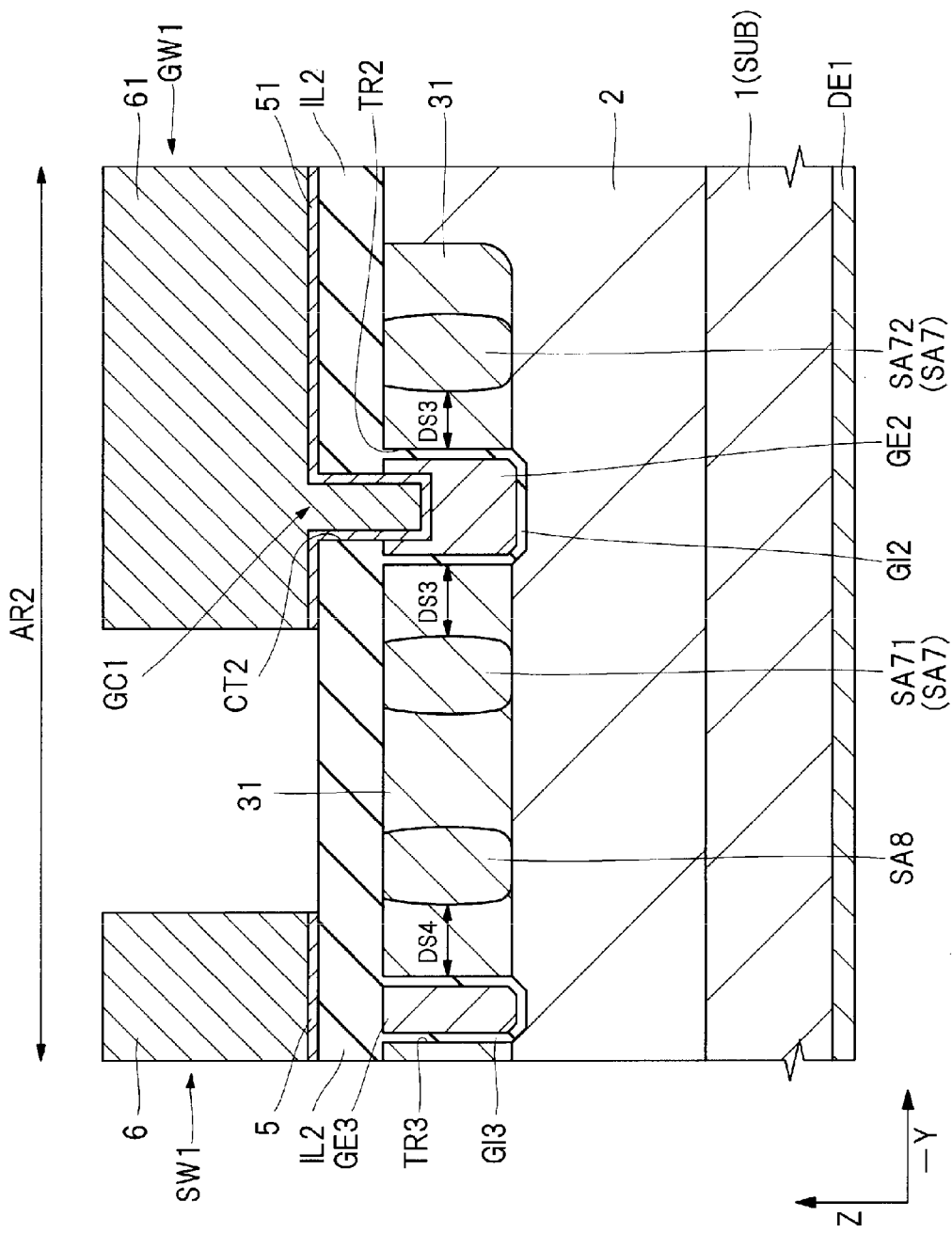
FIG. 20 is a principal part cross-sectional view of the semiconductor device of a Second Embodiment.

FIG. 20 is a principal part cross-sectional view of a semiconductor device of a Second Embodiment. FIG. 20 is a cross-sectional view along the B-B line in FIG. 1.

As shown in FIG. 20, the semiconductor device of the Second Embodiment has the n⁻-type drift layer 2, a p-type well layer 31, the outermost peripheral gate trench TR2, the outermost peripheral gate insulating film GI2 and the outermost peripheral gate electrode GE2 in the gate wiring-lead-out region AR2.

The $n^-$-type drift layer 2 is formed over the $n^{++}$-type drain layer 1 also in the gate wiring-lead-out region AR2, in the same way as in the cell region AR1. That is, the $n^-$-type drift layer 2 is formed over the $n^{++}$-type drain layer 1, in the cell region AR1 and the gate wiring-lead-out region AR2.

The p-type well layer 31 is formed in the upper layer portion of the $n^-$-type drift layer 2 in the gate wiring-lead-out region AR2. The p-type well layer 31 is formed over the $n^-$-type drift layer 2 in the portion obtained by forming the p-type well layer 31, of the gate wiring-lead-out region AR2. The p-type well layer 31 may be one constituted of a p-type semiconductor layer formed in the same layer as the p-type semiconductor layer included in the p-type body layer 3 in the cell region AR1 (see FIG. 3) that was explained in the First Embodiment. Alternatively, the p-type well layer 31 may be one constituted of a p-type semiconductor layer different from the p-type semiconductor layer included in the p-type body layer 3 in the cell region AR1. In addition, the p-type impurity concentration in the p-type well layer 31 can be made similar to the p-type impurity concentration in the p-type body layer 3 in the cell region AR1.

In the gate wiring-lead-out region AR2, the outermost peripheral gate trench TR2 as a trench portion is formed in the p-type well layer 31 and the $n^-$-type drift layer 2. The outermost peripheral gate trench TR2 penetrates through the p-type well layer 31 to thereby reach the middle of the $n^-$-type drift layer 2.

Preferably, as shown in FIG. 1, the outermost peripheral gate trench TR2 is formed continuously with the gate trench TR1 in the cell region AR1. Thereby, the outermost peripheral gate trench TR2 can be formed in the same process as the process for forming the gate trench TR1. Furthermore, at this time, the mutually adjacent two gate trenches TR1 extend respectively, in plan view, in the Y-axis direction, ant the outermost peripheral gate trench TR2 extends, in plan view, in the X-axis direction. By such disposition, each one end of two gate electrodes GE1 that are formed respectively inside the mutually adjacent two gate trenches TR1 can be electrically coupled by the outermost peripheral gate electrode GE2 formed inside the outermost peripheral gate trench TR2.

In the gate wiring-lead-out region AR2, the outermost peripheral gate insulating film GI2 is formed on the inner wall of the outermost peripheral gate trench TR2.

Preferably, the outermost peripheral gate insulating film GI2 is formed continuously with the gate insulating film GI1 in the cell region AR1, which was described in the First Embodiment. Thereby, the outermost peripheral gate insulating film GI2 can be formed by the same process as the process for forming the gate insulating film GI1. In addition, at this time, the outermost peripheral gate insulating film GI2 is constituted of an insulating film of the same kind as the insulating film included in the gate insulating film GI1.

In the gate wiring-lead-out region AR2, the outermost peripheral gate electrode GE2 is formed so as to be embedded in the outermost peripheral gate trench TR2 over the outermost peripheral gate insulating film GI2.

Preferably, as shown in FIG. 1, the outermost peripheral gate electrode GE2 is formed continuously with the gate electrode GE1 in the cell region AR1, and is electrically coupled to the gate electrode GE1. Thereby, the outermost peripheral gate electrode GE2 can be formed by the same process as the process for forming the gate electrode GE1. Furthermore, at this time, the outermost peripheral gate electrode GE2 is constituted of a conductor film of the same kind as the conductor film included in the gate electrode GE1. The outermost peripheral gate electrode GE2 electrically couples the gate electrode GE1 and the gate wiring GW1.

Note that, as shown in FIG. 20, in the gate wiring-lead-out region AR2, the cell end gate trench TR3 as a trench portion may be formed in the p-type well layer 31 and the $n^-$-type drift layer 2. The cell end gate trench TR3 penetrates through the p-type well layer 31 in the portion positioned on a side closer to the cell region AR1 than the outermost peripheral gate trench TR2 to thereby reach the middle of the $n^-$-type drift layer 2. Furthermore, in the gate wiring-lead-out region AR2, the cell end gate insulating film GI3 may be formed on the inner wall of the cell end gate trench TR3. Moreover, the cell end gate electrode GE3 may be formed so as to be embedded in the cell end gate trench TR3 over the cell end gate insulating film GI3. The cell end gate electrode GE3 electrically couples the mutually adjacent two gate electrodes GE1.

Preferably, as shown in FIG. 1, the cell end gate trench TR3 is formed continuously with the gate trench TR1 in the cell region AR1. Thereby, the cell end gate trench TR3 can be formed by the same process as the process for forming the gate trench TR1. In addition, at this time, the mutually adjacent two gate trenches TR1 extend respectively, in plan view, in the Y-axis direction, and the cell end gate trench TR3 extends, in plan view, in the X-axis direction.

Preferably, the cell end gate insulating film GI3 is formed continuously with the gate insulating film GI1 in the cell region AR1. Thereby, the cell end gate insulating film GI3 can be formed in the same process as the process for forming the gate insulating film GI1. Furthermore, at this time, the cell end gate insulating film GI3 is constituted of an insulating film of the same kind as the insulating film included in the gate insulating film GI1.

Preferably, as shown in FIG. 1, the cell end gate electrode GE3 is formed continuously with the gate electrode GE1 in the cell region AR1, and is electrically coupled to gate electrode GE1. Thereby, the cell end gate electrode GE3 can be formed in the same process as the process for forming the gate electrode GE1. Furthermore, at this time, the cell end gate electrode GE3 is constituted of a conductor film of the same kind as the conductor film included in the gate electrode GE1.

In the gate wiring-lead-out region AR2, the interlayer insulating film IL2 is formed so as to cover the outermost peripheral gate electrode GE2 and the p-type well layer 31. Preferably, the interlayer insulating film IL2 is constituted of an insulating film formed in the same layer as the insulating film included in the interlayer insulating film IL1 formed in the cell region AR1. Thereby, the interlayer insulating film IL2 can be formed by the same process as the process for forming the interlayer insulating film IL1. Furthermore, at this time, the interlayer insulating film IL2 is constituted of an insulating film of the same kind as the insulating film included in the interlayer insulating film IL1.

In the portion of the interlayer insulating film IL2 overlapping, in plan view, with the outermost peripheral gate trench TR2, the contact trench CT2 as a trench portion is formed. The contact trench CT2 penetrates through the interlayer insulating film IL2 to thereby reach the middle of the outermost peripheral gate electrode GE2. When the outermost peripheral gate trench TR2 extends, in plan view, in the X-axis direction, the contact trench CT2 extend, in plan view, in the X-axis direction.

Inside the contact trench CT2 and over the interlayer insulating film IL2, the gate contact GC1 and the gate wiring GW1 are formed. The gate contact GC1 is an electrode formed so as to be embedded in the inside of the contact trench CT2, inside the contact trench CT2. The gate wiring GW1 is an electrode formed over the gate contact GC1 and over the interlayer insulating film IL2, outside the contact trench CT2, and is electrically coupled to the gate contact GC1. The gate wiring GW1 is electrically coupled to the outermost peripheral gate electrode GE2 via the gate contact GC1.

A stacked conductor film formed by stacking a barrier conductor film 51 and a conductor film 61 can be used as the gate contact GC1 and the gate wiring GW1. The barrier conductor film 51 is formed on the inner wall of the contact trench CT2 and over the interlayer insulating film IL2. The conductor film 61 is formed, inside the contact trench CT2, so as to be embedded in the inside of the contact trench CT2 over the barrier conductor film 51, and is formed over the barrier conductor film 51, outside the contact trench CT2.

Preferably, the barrier conductor film 51 is constituted of a conductor film formed in the same layer as the conductor film included in the barrier conductor film 5 in the cell region AR1. Thereby, the barrier conductor film 51 can be formed by the process that is the same as the process for forming the barrier conductor film 5. Furthermore, at this time, the barrier conductor film 51 is constituted of the conductor film of the same kind as the conductor film included in the barrier conductor film 5. As the barrier conductor film 51, for example, a conductor film constituted of a titanium nitride (TiN) film or a titanium-tungsten (TiW) film can be used.

Preferably, the conductor film 61 formed in the gate wiring-lead-out region AR2 is constituted of a conductor film formed in the same layer as the conductor film included in the conductor film 6 in the cell region AR1. Thereby, the conductor film 61 can be formed by the same process as the process for forming the conductor film 6. Moreover, at this time, the conductor film 61 is constituted of the conductor film of the same kind as the conductor film included in the conductor film 6. As the conductor film 61, for example, a conductor film constituted of an aluminum (Al) film, or one obtained by incorporating, for example, silicon (Si) or copper (Cu) in a conductor film constituted of an aluminum film can be used.

The semiconductor device of the Second Embodiment has a $p^+$-type semiconductor region SA7 in the gate wiring-lead-out region AR2. The $p^+$-type semiconductor region SA7 is formed inside the p-type well layer 31 in the portion positioned in the periphery of the outermost peripheral gate trench TR2. The $p^+$-type semiconductor region SA7 is constituted of silicon (Si) in which a p-type impurity such as boron (B) is diffused. The p-type impurity concentration in the $p^+$-type semiconductor region SA7 is higher than the p-type impurity concentration in the p-type well layer 31.

Thereby, in plan view, the distribution of a depletion layer near the interface between the p-type well layer 31 in the portion positioned in the periphery of the outermost peripheral gate trench TR2 and the $n^-$-type drift layer 2 can be adjusted. Accordingly, it is possible to decrease the intensity of an electric field in the periphery of the bottom portion of the outermost peripheral gate trench TR2, that is, to alleviate the concentration of an electric field, and to enhance the breakdown voltage of the semiconductor device.

In the example shown in FIG. 20, a $p^+$-type semiconductor region SA71 as the $p^+$-type semiconductor region SA7 is formed, in plan view, inside the p-type well layer 31 in the portion positioned on a side closer to the center of the semiconductor substrate SUB than the outermost peripheral gate trench TR2. Thereby, in plan view, the distribution of a depletion layer near the interface between the p-type well layer 31 in the portion positioned on a side closer to the center of the semiconductor substrate SUB than the outermost peripheral gate trench TR2, and the $n^-$-type drift layer 2 can be adjusted.

Preferably, a space DS3 between the $p^+$-type semiconductor region SA7 and the outermost peripheral gate trench TR2 can be set to be, for example, approximately 0.5 to 1.5 µm. When the space DS3 is less than 0.5 µm, the $p^+$-type semiconductor region SA7 for suppressing the concentration of an electric field in the periphery of the bottom portion of the outermost peripheral gate trench TR2 is too close to the outermost peripheral gate trench TR2, the effect of reducing the intensity of an electric field in the periphery of the bottom portion of the outermost peripheral gate trench TR2 becomes small. When the space DS3 exceeds 1.5 µm, the $p^+$-type semiconductor region SA7 for suppressing the concentration of an electric field in the periphery of the bottom portion of the outermost peripheral gate trench TR2 is too separated from the outermost peripheral gate trench TR2, the effect of reducing the intensity of an electric field in the periphery of the bottom portion of the outermost peripheral gate trench TR2 becomes small.

When the gate wiring-lead-out region AR2 is positioned on a side closer to the periphery of the semiconductor substrate SUB than the cell region AR1, preferably, the $p^+$-type semiconductor region SA7 is formed, in plan view, inside the p-type well layer 31 in the portion positioned on a side closer to the periphery of the semiconductor substrate SUB than the outermost peripheral gate trench TR2. In the example shown in FIG. 20, a $p^+$-type semiconductor region SA72 as the $p^+$-type semiconductor region SA7 is formed, in plan view, inside the p-type well layer 31 in the portion positioned on a side closer to the periphery of the semiconductor substrate SUB than the outermost peripheral gate trench TR2.

The intensity of an electric field in the portion positioned on a side closer to the periphery of the semiconductor substrate SUB out of the surroundings of the bottom portion of the outermost peripheral gate trench TR2 is larger than the intensity of an electric field in the portion positioned on a side closer to the center of the semiconductor substrate SUB out of the surroundings of the bottom portion of the outermost peripheral gate trench TR2. Accordingly, as the result that the $p^+$-type semiconductor region SA72 is formed, in plan view, inside the p-type well layer 31 in the portion positioned on a side closer to the periphery of the semiconductor substrate SUB than the outermost peripheral gate trench TR2, the effect of decreasing the intensity of an electric field in the periphery of the bottom portion of the outermost peripheral gate trench TR2 becomes large. Accordingly, the breakdown voltage of the semiconductor device can be further enhanced.

Further, as shown in FIG. 20, when the cell end gate trench TR3, the cell end gate insulating film GI3 and the cell end gate electrode GE3 have been formed, a $p^+$-type semiconductor region SA8 may have been formed inside the p-type well layer 31 in the portion positioned in the periphery of the cell end gate trench TR3. The p-type impurity concentration in the $p^+$-type semiconductor region SA8 is higher than the p-type impurity concentration in the p-type well layer 31.

In the example shown in FIG. 20, the $p^+$-type semiconductor region SA71 as the $p^+$-type semiconductor region SA7 is formed, in plan view, inside the p-type well layer 31 in the portion positioned between the outermost peripheral gate trench TR2 and the cell end gate trench TR3. Further, the p$^+$-type semiconductor region SA8 is formed, in plan view, inside the p-type well layer 31 in the portion positioned between the p$^+$-type semiconductor region SA71 and the cell end gate trench TR3.

As the result of the formation of the p$^+$-type semiconductor region SA8, in plan view, the distribution of a depletion layer near the interface between the p-type well layer 31 in the portion positioned in the periphery of the cell end gate trench TR3, and the n$^-$-type drift layer 2 can be adjusted. Accordingly, it is possible to decrease the intensity of an electric field in the periphery of the bottom portion of the cell end gate trench TR3, that is, to alleviate the concentration of the electric field, and to enhance the breakdown voltage of the semiconductor device.

Preferably, a space DS4 between the p$^+$-type semiconductor region SA8 and the cell end gate trench TR3 can be set to be, for example, approximately 0.5 to 1.5 μm. When the space DS4 is less than 0.5 μm, since the p$^+$-type semiconductor region SA8 for suppressing the concentration of an electric field in the periphery of the bottom portion of the cell end gate trench TR3 is too close to the cell end gate trench TR3, the effect of reducing the intensity of an electric field in the periphery of the bottom portion of the cell end gate trench TR3 becomes small. When the space DS4 exceeds 1.5 μm, the p$^+$-type semiconductor region SA8 for suppressing the concentration of an electric field in the periphery of the bottom portion of the cell end gate trench TR3 is too separated from the cell end gate trench TR3, the effect of reducing the intensity of an electric field in the periphery of the bottom portion of the cell end gate trench TR3 becomes small.

Preferably, the p$^+$-type semiconductor region SA71 is formed, in plan view, inside the p-type well layer 31 in the portion positioned on a side closer to the outermost peripheral gate trench TR2 than the center of the outermost peripheral gate trench TR2 and the cell end gate trench TR3. Further, the p$^+$-type semiconductor region SA8 is formed, in plan view, inside the p-type well layer 31 in the portion positioned on a side closer to the cell end gate trench TR3 than the center of the outermost peripheral gate trench TR2 and the cell end gate trench TR3.

Thereby, in plan view, the distribution of a depletion layer near the interface between the p-type well layer 31 in the portion positioned on a side closer to the outermost peripheral gate trench TR2 than the center of the outermost peripheral gate trench TR2 and the cell end gate trench TR3, and the n$^-$-type drift layer 2 can be adjusted easily. Accordingly, it is possible to easily decrease the intensity of an electric field in the periphery of the bottom portion of the outermost peripheral gate trench TR2, and to enhance the breakdown voltage of the semiconductor device.

Furthermore, in plan view, the distribution of a depletion layer near the interface between the p-type well layer 31 in the portion positioned on a side closer to the cell end gate trench TR3 than the center of the outermost peripheral gate trench TR2 and the cell end gate trench TR3, and the n$^-$-type drift layer 2 can be adjusted easily. Accordingly, it is possible to easily decrease the intensity of an electric field in the periphery of the bottom portion of the cell end gate trench TR3, and to enhance the breakdown voltage of the semiconductor device.

Note that the semiconductor device of the Second Embodiment may be one that has only any one of the p$^+$-type semiconductor regions SA71, SA72 and SA8.

Moreover, in the example shown in FIG. 20, all of the p$^+$-type semiconductor regions SA71, SA72 and SA8 are in contact with the n$^-$-type drift layer 2. However, in the same way as the p$^+$-type semiconductor region SA1 shown in FIG. 3 in the First Embodiment, the p$^+$-type semiconductor region SA71, SA72 or SA8 may not be in contact with the n$^-$-type drift layer 2.

<First Modification of p$^+$-Type Semiconductor Region>

Figure 21:
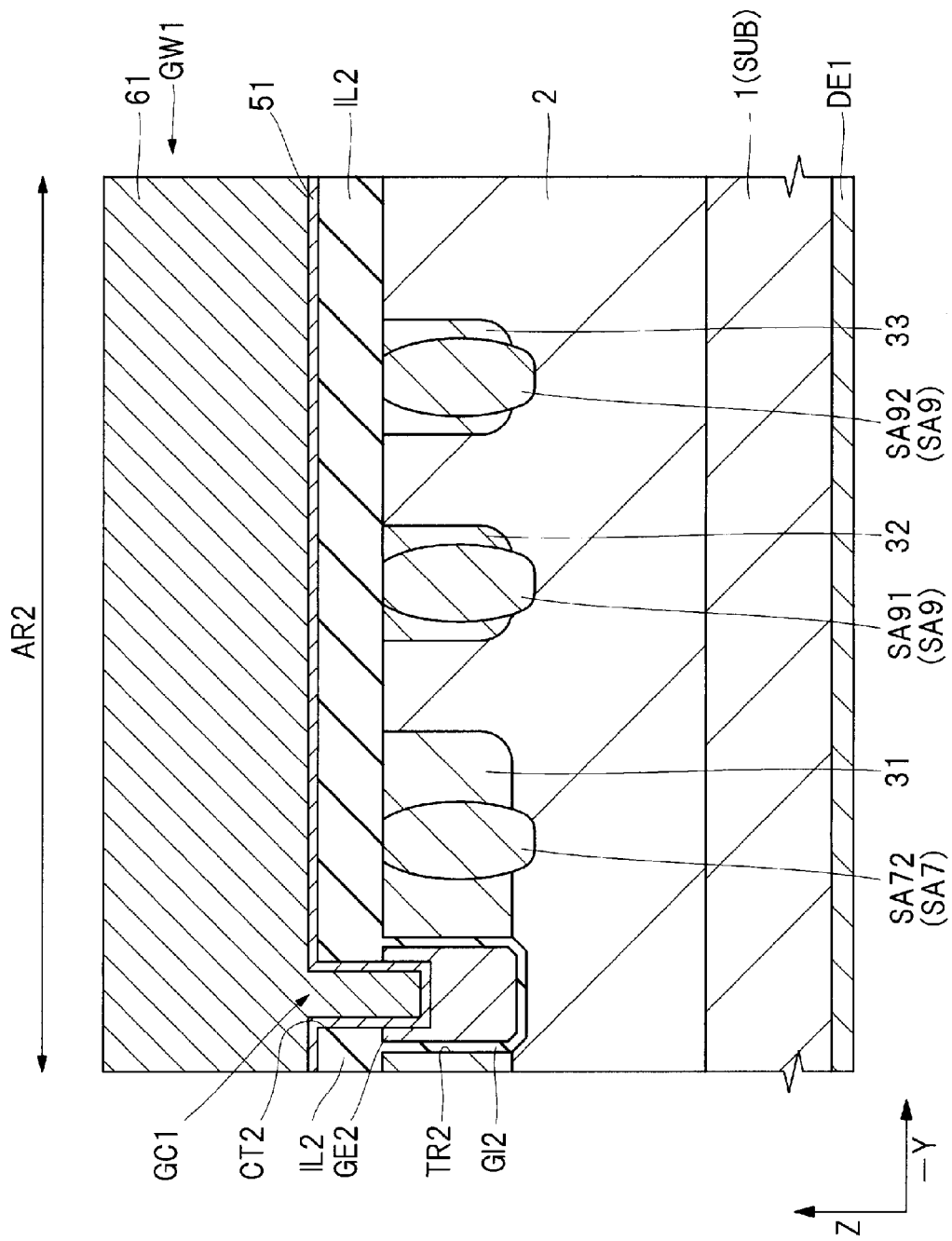
FIG. 21 is a cross-sectional view showing a first modification of the p$^+$-type semiconductor region in the semiconductor device of the Second Embodiment.

FIG. 21 is a cross-sectional view showing a first modification of a p$^+$-type semiconductor region in the semiconductor device of the Second Embodiment.

In the first modification, peripheral guard ring layers 32 and 33 each having, in plan view, a ring shape are formed in the periphery of the gate wiring-lead-out region AR2. The peripheral guard ring layers 32 and 33 are formed in the upper layer portion of the n$^-$-type drift layer 2. The peripheral guard ring layers 32 and 33 are a p-type semiconductor layer constituted of, for example, silicon (Si) in which a p-type impurity such as boron (B) is diffused. The p-type impurity concentration in both peripheral guard ring layers 32 and 33 can also be set to be the same as the p-type impurity concentration in the p-type well layer 31.

In the example shown in FIG. 21, two peripheral guard ring layers 32 and 33 are disposed to be separated from each other, in plan view, in the upper layer portion of the n$^-$-type drift layer 2 in the portion positioned on a side closer to the periphery of the semiconductor substrate SUB than the p-type well layer 31. The peripheral guard ring layer 33 is disposed on a side closer to the periphery of the semiconductor substrate SUB than the peripheral guard ring layer 32.

The semiconductor device of the first modification has a p$^+$-type semiconductor region SA9 in the gate wiring-lead-out region AR2. The p$^+$-type semiconductor region SA9 is formed inside each of the peripheral guard ring layers 32 and 33. In the example shown in FIG. 21, a p$^+$-type semiconductor region SA91 as the p$^+$-type semiconductor region SA9 is formed inside the peripheral guard ring layer 32, and a p$^+$-type semiconductor region SA92 as the p$^+$-type semiconductor region SA9 is formed inside the peripheral guard ring layer 33. The p-type impurity concentration in the p$^+$-type semiconductor region SA91 is higher than the p-type impurity concentration in the peripheral guard ring layer 32, and the p-type impurity concentration in the p$^+$-type semiconductor region SA92 is higher than the p-type impurity concentration in the peripheral guard ring layer 32.

Thereby, in plan view, the distribution of a depletion layer near the interfaces between each of the peripheral guard ring layers 32 and 33, and the n$^-$-type drift layer 2 can be adjusted. Accordingly, it is possible to decrease the intensity of an electric field in the periphery of the bottom portion of each of the peripheral guard ring layers 32 and 33, that is, to alleviate the concentration of the electric field, and to enhance the breakdown voltage of the semiconductor device.

Note that, as shown in FIG. 21, the p$^+$-type semiconductor region SA91 may penetrate through the peripheral guard ring layer 32 to thereby reach the middle of the n$^-$-type drift layer 2, and the p$^+$-type semiconductor region SA92 may penetrate through the peripheral guard ring layer 33 to thereby reach the middle of the n$^-$-type drift layer 2. Even in such a case, in plan view, the distribution of a depletion layer of the portion in contact with the n$^-$-type drift layer 2 of each of the peripheral guard ring layers 32 and 33, can be adjusted easily. Accordingly, it is possible to easily decrease the intensity of an electric field in the periphery of the bottom portion of each of the peripheral guard ring layers 32 and 33, and to enhance the breakdown voltage of the semiconductor device.

Furthermore, as shown in FIG. 21, the p$^+$-type semiconductor region SA72 as the p$^+$-type semiconductor region SA7 may penetrate through the p-type well layer 31 to thereby reach the middle of the n$^-$-type drift layer 2. In such a case, the distribution of a depletion layer furthermore in the n$^-$-type drift layer 2 can be adjusted easily, even if the p-type impurity concentration in the p$^+$-type semiconductor region SA7 is not made large. Accordingly, it is possible to reduce easily the intensity of an electric field in the periphery of the bottom portion of the outermost peripheral gate trench TR2, and to enhance the breakdown voltage of the semiconductor device.

Note that the semiconductor device of the first modification may be one that has neither the p$^+$-type semiconductor region SA7 nor the SA8, but that has only the p$^+$-type semiconductor region SA9.

<Method for Manufacturing Semiconductor Device in Gate Wiring-Lead-Out Region>

Next, a method for manufacturing a semiconductor device in the gate wiring-lead-out region of the Second Embodiment will be explained. FIGS. 22 to 26 are principal part cross-sectional views in the manufacturing process of the semiconductor device of the Second Embodiment. FIGS. 22 to 26 are cross-sectional views along the B-B line in FIG. 1, which correspond to the cross-sectional view in FIG. 20.

First, by performing the same process as the process that was explained in the First Embodiment using FIG. 8, the n$^-$-type drift layer 2 is formed on the upper surface side of the semiconductor substrate SUB in the gate wiring-lead-out region AR2 in the upper surface of the semiconductor substrate SUB.

Figure 22:
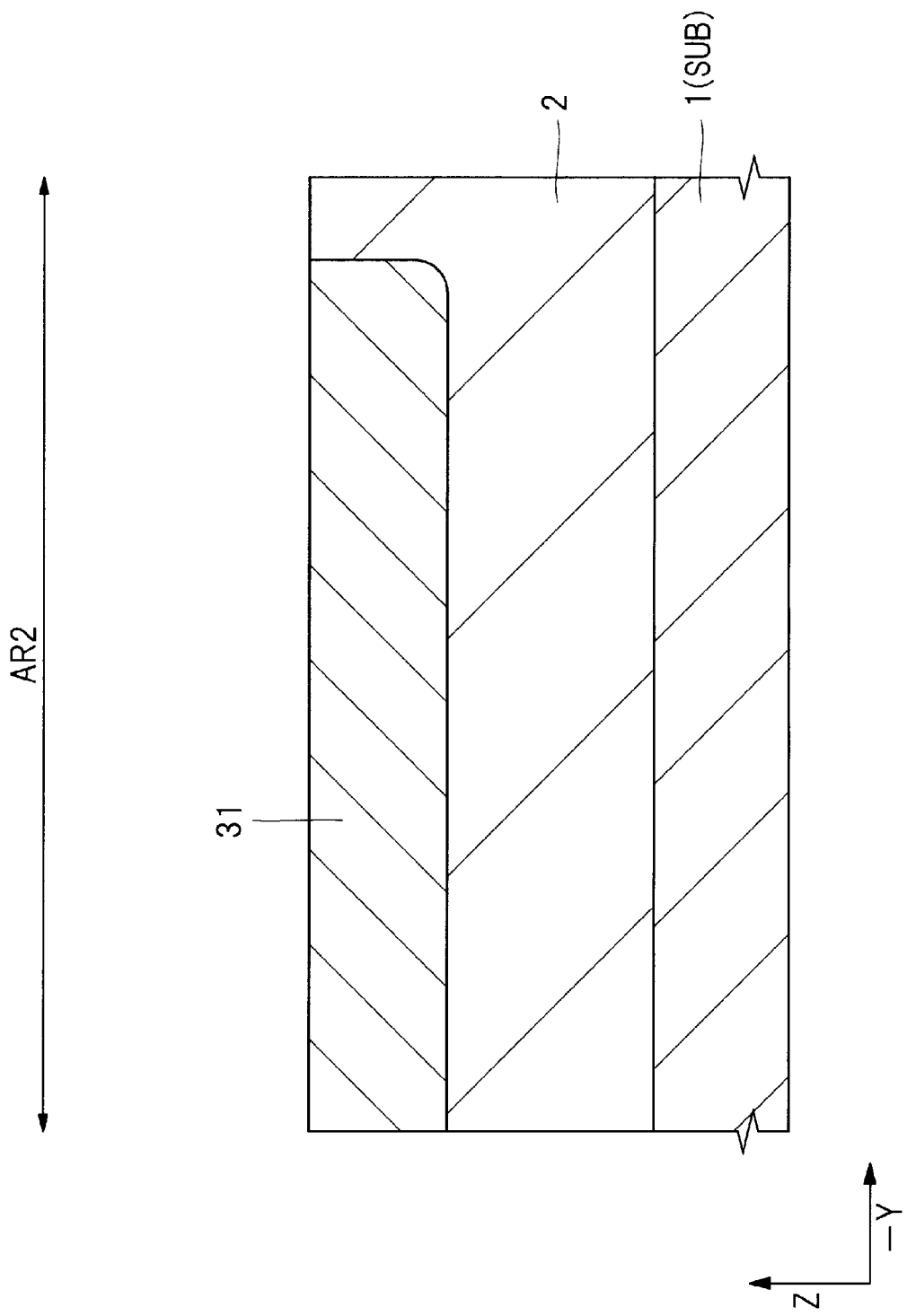
FIG. 22 is a principal part cross-sectional view in the manufacturing process of the semiconductor device of the Second Embodiment.

Next, as shown in FIG. 22, the p-type well layer 31 is formed. In the process for forming the p-type well layer 31, a p-type impurity such as boron (B) is introduced into the upper layer portion of the n$^-$-type drift layer 2 in the gate wiring-lead-out region AR2 by using, for example, an ion implantation method. Thereby, the p-type well layer 31 is formed in the upper layer portion of the n$^-$-type drift layer 2 in the gate wiring-lead-out region AR2. The p-type impurity concentration in the p-type well layer 31 can be set to be the same as the p-type impurity concentration in the p-type body layer 3, which has been explained in the First Embodiment.

Figure 23:
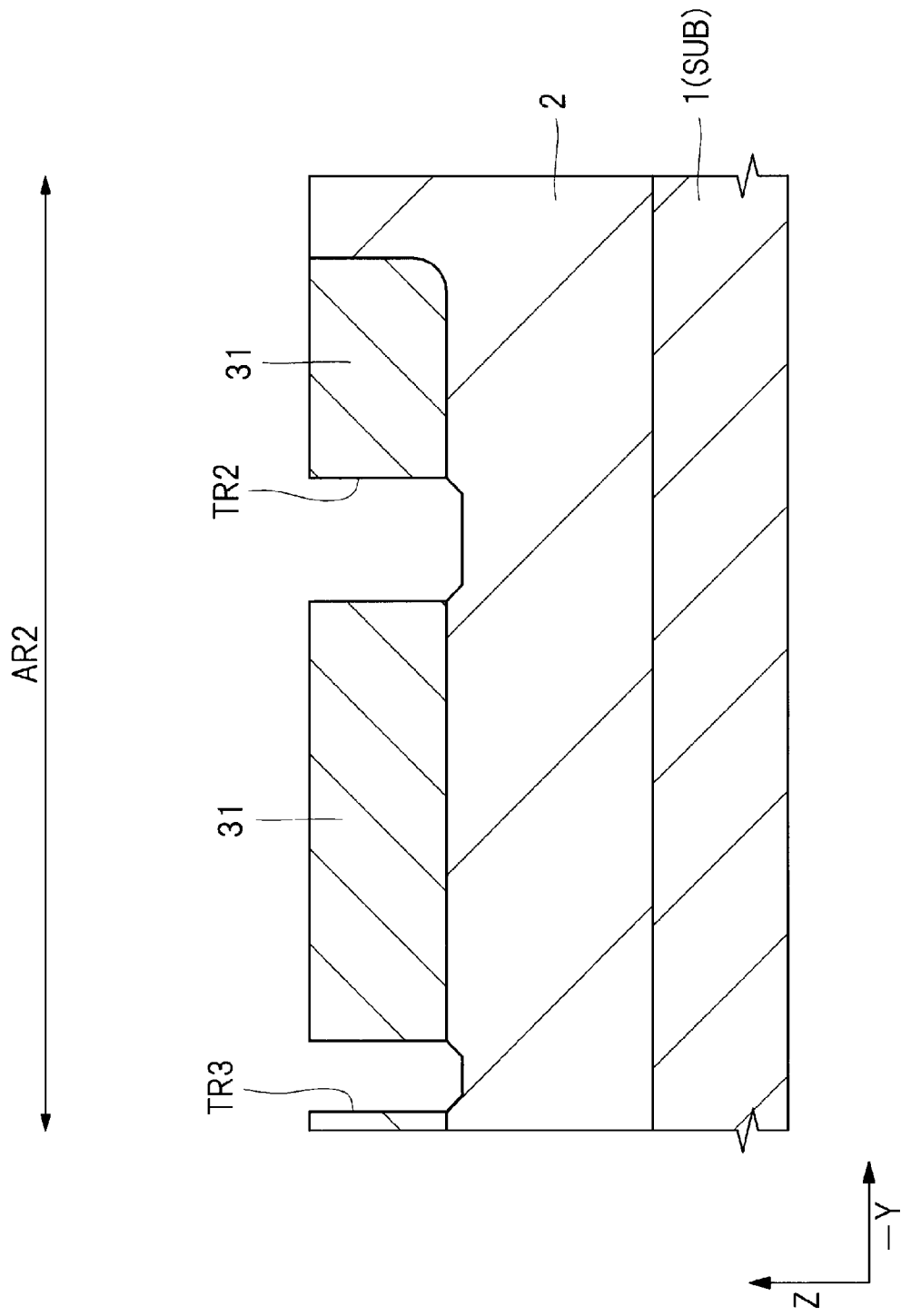
FIG. 23 is a principal part cross-sectional view in the manufacturing process of the semiconductor device of the Second Embodiment.

Next, as shown in FIG. 23, the outermost peripheral gate trench TR2 is formed. In the process for forming the outermost peripheral gate trench TR2, the outermost peripheral gate trench TR2 is formed in the upper surface of the p-type well layer 31 in the gate wiring-lead-out region AR2 by using a photolithographic technology and an etching technology. The outermost peripheral gate trench TR2 penetrates through the p-type well layer 31 to thereby reach the middle of the n$^-$-type drift layer 2. Specifically, the outermost peripheral gate trench TR2 can be formed by the same method as the method for forming the gate trench TR1 in the cell region AR1, which was explained in the First Embodiment.

Note that, as shown in FIG. 23, when forming the outermost peripheral gate trench TR2, the cell end gate trench TR3 may be formed in the upper surface of the p-type well layer 31. The cell end gate trench TR3 penetrates through the p-type well layer 31 to thereby reach the middle of the n$^-$-type drift layer 2.

Furthermore, the p-type well layer 31 may be formed by the same process as the process for forming the p-type body layer 3 in the cell region AR1. In such a case, the outermost peripheral gate trench TR2 is formed by the same process as the process for forming the gate trench TR1 and, after that, the p-type well layer 31 is formed by the same process as the process for forming the p-type body layer 3. Thereby, the number of the processes for manufacturing the semiconductor device can be reduced.

Figure 24:
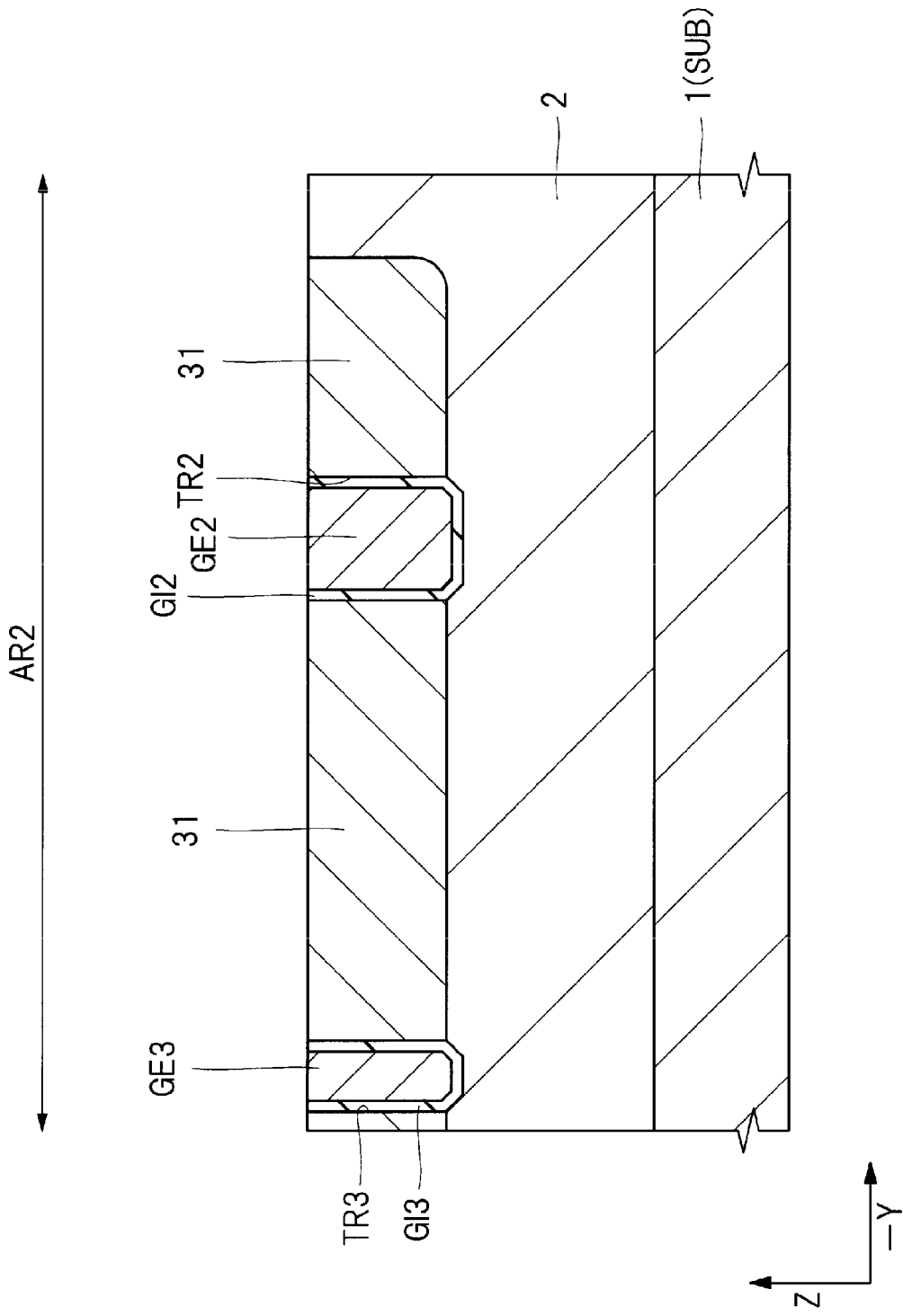
FIG. 24 is a principal part cross-sectional view in the manufacturing process of the semiconductor device of the Second Embodiment.

Next, as shown in FIG. 24, the outermost peripheral gate insulating film GI2 and the outermost peripheral gate electrode GE2 are formed.

First, the outermost peripheral gate insulating film GI2 is formed. In the process for forming the outermost peripheral gate insulating film GI2, inside the outermost peripheral gate trench TR2, the outermost peripheral gate insulating film GI2 is formed on the inner wall of the outermost peripheral gate trench TR2. At this time, the outermost peripheral gate insulating film GI2 is formed over the p-type well layer 31, outside the outermost peripheral gate trench TR2. Specifically, the outermost peripheral gate insulating film GI2 can be formed by the same method as the method for forming the gate insulating film GI1, which has been explained in the First Embodiment.

Preferably, the outermost peripheral gate insulating film GI2 can be formed by the same process as the process for forming the gate insulating film GI1 in the cell region AR1. Thereby, the number of the processes for manufacturing the semiconductor device can be reduced.

Meanwhile, when the cell end gate trench TR3 is formed upon forming the outermost peripheral gate trench TR2, as shown in FIG. 24, the cell end gate insulating film GI3 may be formed in forming the outermost peripheral gate insulating film GI2. At this time, the cell end gate insulating film GI3 is formed on the inner wall of the cell end gate trench TR3 by the same method as the method for forming the outermost peripheral gate insulating film GI2.

Next, the outermost peripheral gate electrode GE2 is formed. In the process for forming the outermost peripheral gate electrode GE2, the outermost peripheral gate electrode GE2 is formed so as to be embedded in the outermost peripheral gate trench TR2 over the outermost peripheral gate insulating film GI2. Specifically, the outermost peripheral gate electrode GE2 can be formed by the same method as the method for forming the gate electrode GE1, which has been explained in the First Embodiment.

Note that, when forming the cell end gate insulating film GI3 upon forming the outermost peripheral gate insulating film GI2, as shown in FIG. 24, the cell end gate electrode GE3 may be formed upon forming the outermost peripheral gate electrode GE2. At this time, the cell end gate electrode GE3 is formed so at to be embedded in the cell end gate trench TR3 over the cell end gate insulating film GI3 by the same method as the method for forming the outermost peripheral gate electrode GE2.

Figure 25:
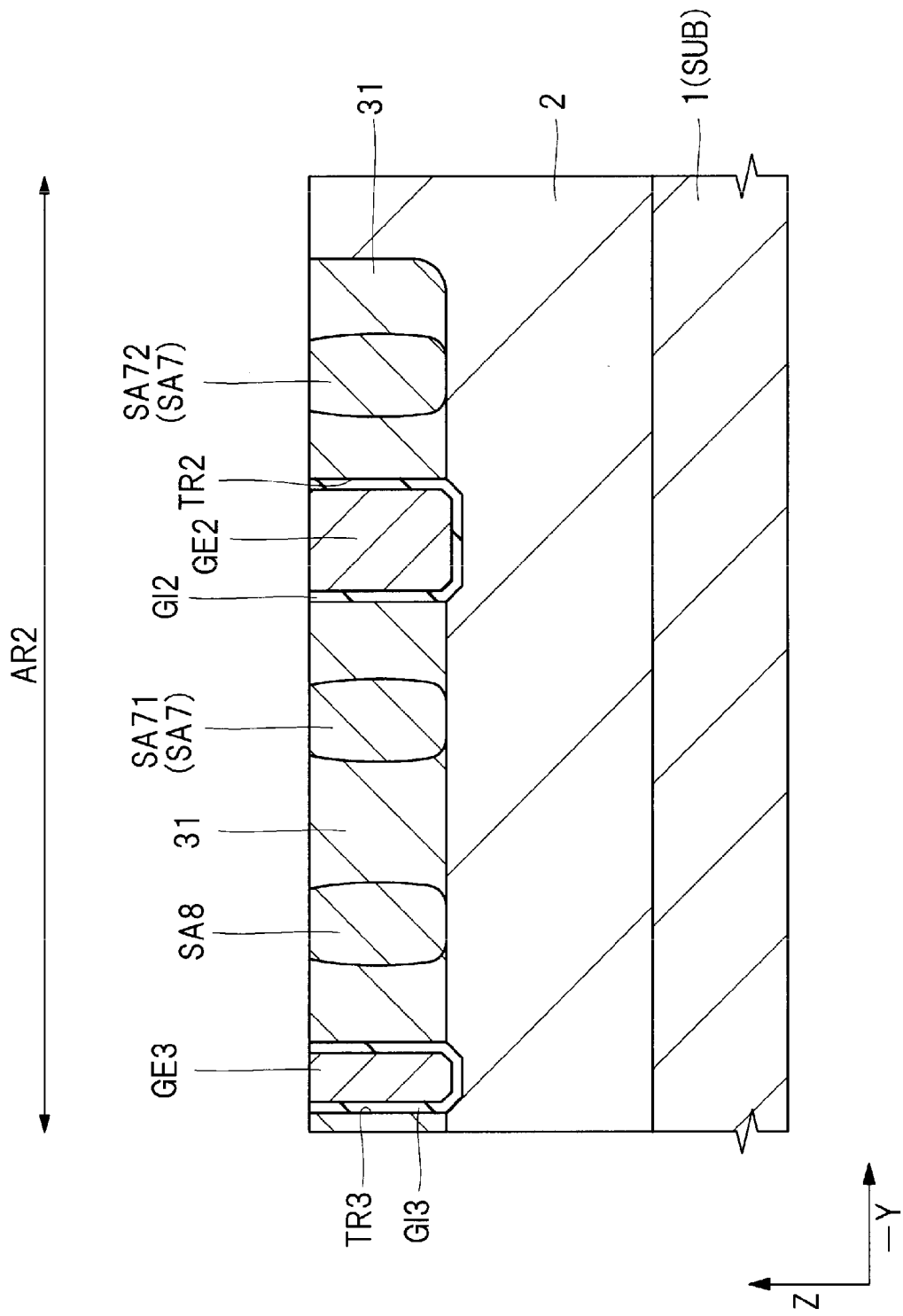
FIG. 25 is a principal part cross-sectional view in the manufacturing process of the semiconductor device of the Second Embodiment.

Next, as shown in FIG. 25, the p$^+$-type semiconductor region SA7 is formed. In the process for forming the p$^+$-type semiconductor region SA7, the p$^+$-type semiconductor region SA7 is formed inside the p-type well layer 31 in the portion positioned in the periphery of the outermost peripheral gate trench TR2 by using, for example, a photolithographic technology and an ion implantation method. The p-type impurity concentration in the p$^+$-type semiconductor region SA7 is higher than the p-type impurity concentration in the p-type well layer 31.

Specifically, a resist film constituted of a photoresist is applied over the outermost peripheral gate electrode GE2 and over the p-type well layer 31, and the applied resist film is subjected to exposure and development. Thereby, in plan view, a resist pattern (illustration is omitted) in which an opening is formed in the resist film in the portion positioned in the periphery of the outermost peripheral gate trench TR2 is formed. Next, through the use of the formed resist pattern as a mask, a p-type impurity such as boron (B) is introduced using an ion implantation method to thereby form, in plan view, the $p^+$-type semiconductor region SA7 inside the p-type well layer 31 in the portion positioned in the periphery of the outermost peripheral gate trench TR2. The p-type impurity concentration in the $p^+$-type semiconductor region SA7 can be set to be the same as the p-type impurity concentration in the $p^+$-type semiconductor region SA1.

In the example shown in FIG. 25, the $p^+$-type semiconductor region SA71 as the $p^+$-type semiconductor region SA7 is formed, in plan view, inside the p-type well layer 31 in the portion positioned on a side closer to the center of the semiconductor substrate SUB than the outermost peripheral gate trench TR2.

Furthermore, in the example shown in FIG. 25, the $p^+$-type semiconductor region SA72 as the $p^+$-type semiconductor region SA7 is formed, in plan view, inside the p-type well layer 31 in the portion positioned on a side closer to the periphery of the semiconductor substrate SUB than the outermost peripheral gate trench TR2. Thereby, the effect of decreasing the intensity of an electric field in the periphery of the bottom portion of the outermost peripheral gate trench TR2 becomes large.

When forming the cell end gate electrode GE3 in forming the outermost peripheral gate electrode GE2, as shown in FIG. 25, the $p^+$-type semiconductor region SA8 may be formed inside the p-type well layer 31 in the portion positioned in the periphery of the cell end gate trench TR3, in forming the $p^+$-type semiconductor region SA7. The p-type impurity concentration in the $p^+$-type semiconductor region SA8 is higher than the p-type impurity concentration in the p-type well layer 31.

Figure 26:
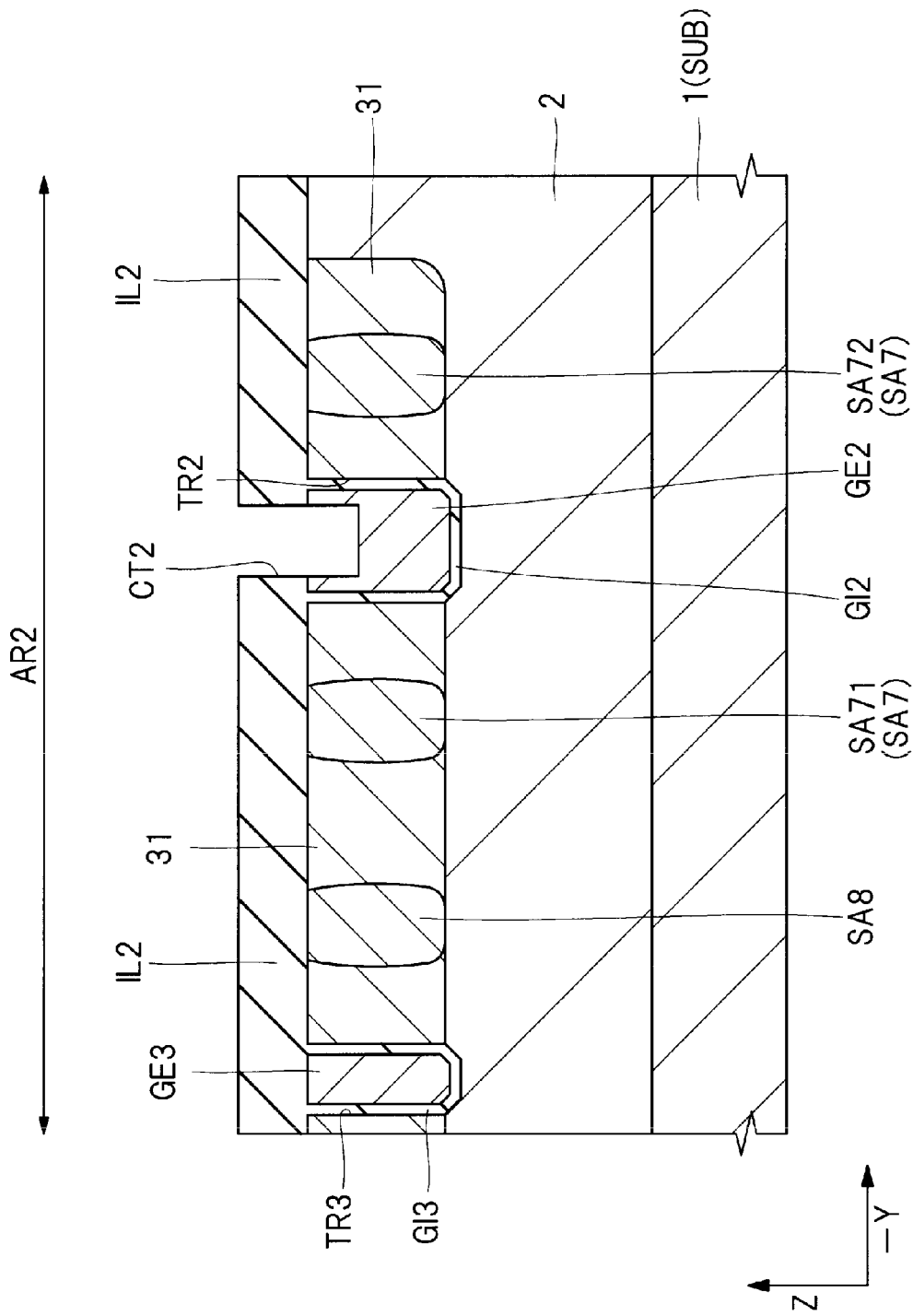
FIG. 26 is a principal part cross-sectional view in the manufacturing process of the semiconductor device of the Second Embodiment.

Next, as shown in FIG. 26, the interlayer insulating film IL2 is formed. In the process for forming the interlayer insulating film IL2, for example, the interlayer insulating film IL2 constituted of a silicon oxide film is formed so as to cover the outermost peripheral gate electrode GE2 and the p-type well layer 31 in the gate wiring-lead-out region AR2, by using, for example, a CVD method. Meanwhile, in FIG. 26, the interlayer insulating film IL2 constituted of, for example, a silicon oxide film is shown integrally with the outermost peripheral gate insulating film GI2 and the cell end gate insulating film GI3 that are constituted of, for example, a silicon oxide film.

Preferably, the interlayer insulating film IL2 is formed by the same process as the process for forming the interlayer insulating film IL1 in the cell region AR1. Thereby, the number of the processes for forming the semiconductor device can be reduced.

Next, as shown in FIG. 26, the contact trench CT2 is formed. In the process for forming the contact trench CT2, the contact trench CT2 that penetrates through the interlayer insulating film IL2 to thereby reach the upper surface of the outermost peripheral gate electrode GE2 is formed using a photolithographic technology and an etching technology.

Specifically, first, a resist film constituted of a photoresist is applied over the interlayer insulating film IL2, and a resist pattern (illustration is omitted) is formed by subjecting the applied resist film to exposure and development. Next, dry etching is performed using the formed resist pattern as a mask, to thereby form the contact trench CT2 that penetrates through the interlayer insulating film IL2 to thereby reach the upper surface of the outermost peripheral gate electrode GE2. Note that the contact trench CT2 may reaches the middle of the outermost peripheral gate electrode GE2.

Next, as shown in FIG. 20, the gate contact GC1 and the gate wiring GW1 are formed. In the process for forming the gate contact GC1 and the gate wiring GW1, inside the contact trench CT2, the gate contact GC1 is formed so as to be embedded in the inside of the contact trench CT2. Furthermore, the gate wiring GW1 is formed over the gate contact GC1 and over the interlayer insulating film IL2, outside the contact trench CT2.

First, the barrier conductor film 51 is formed on the inner wall of the contact trench CT2 and over the interlayer insulating film IL2. As the barrier conductor film 51, for example, a conductor film constituted of a titanium nitride (TiN) film or a titanium tungsten (TiW) film can be formed using, for example, a sputtering method or an evaporation method. The barrier conductor film 51 is a conductor film having so-called barrier properties, which prevents aluminum (Al) being the material of the conductor film 61 formed over the barrier conductor film 51 from diffusing into silicon (Si).

Note that the barrier conductor film 51 can be formed by the same process as the process for forming the barrier conductor film 5 in the cell region AR1. Thereby, the number of the processes for manufacturing the semiconductor device can be reduced.

Next, the conductor film 61 is formed so as to be embedded in the inside of the contact trench CT2 over the barrier conductor film 51, inside the contact trench CT2, and the conductor film 61 is formed over the interlayer insulating film IL2 via the barrier conductor film 51, outside the contact trench CT2. For example, a conductor film constituted of an aluminum (Al) film, or one formed by incorporating, for example, silicon (Si) or copper (Cu) in a conductor film constituted of an aluminum film can be formed as the conductor film 61 using, for example, a sputtering method or an evaporation method.

Note that the conductor film 61 can be formed by the same process as the process for forming the conductor film 6 in the cell region AR1. Thereby, the number of the processes for manufacturing the semiconductor device can be reduced.

Next, the conductor film 61 and the barrier conductor film 51 are patterned using a photolithographic technology and an etching technology to thereby form the gate contact GC1 and the gate wiring GW1.

After that, a conductor film constituted of, for example, an alloy containing silver (Ag), gold (Au) or the like as a main component is formed as the drain electrode DE1, on the lower surface side of the $n^{++}$-type drain layer 1, by using, for example, a sputtering method or an evaporation method. Thereby, the semiconductor device shown in FIG. 20 is formed.

<Major Feature and Effect of the Embodiment>

Even when the breakdown voltage is secured in the cell region AR1, there is a risk that the intensity of an electric field in the periphery of the bottom portion of the outermost peripheral gate trench TR2 becomes large in the gate wiring-lead-out region AR2 and the breakdown voltage of the semiconductor device lowers.

That is, in semiconductor devices including a vertical MISFET, the breakdown voltage lowers easily by the increase in the intensity of an electric field in the periphery of the bottom portion of the outermost peripheral gate trench TR2. On the other hand, in semiconductor devices including a vertical MISFET, the enhancement of a breakdown voltage and the reduction of ON resistance have a trade-off relation mutually. Accordingly, in semiconductor devices including a vertical MISFET, ON resistance may increase in order to obtain a necessary breakdown voltage, and the performance of the semiconductor device lowers.

On the other hand, as shown in FIG. 20, the semiconductor device of the Second Embodiment has the p$^+$-type semiconductor region SA7 disposed in the periphery of the outermost peripheral gate trench TR2 in the gate wiring-lead-out region AR2. The p$^+$-type semiconductor region SA7 is formed, in plan view, in the p-type well layer 31 in the portion positioned in the periphery of the outermost peripheral gate trench TR2. The p-type impurity concentration in the p$^+$-type semiconductor region SA7 is higher than the p-type impurity concentration in the p-type well layer 31.

Thereby, in plan view, the distribution of a depletion layer near the interface between the p-type well layer 31 in the portion positioned in the periphery of the outermost peripheral gate trench TR2 and the n$^-$-type drift layer 2 can be adjusted. Consequently, the intensity of an electric field in the periphery of the bottom portion of the outermost peripheral gate trench TR2 can easily be made small. Accordingly, the breakdown voltage of the semiconductor device can be enhanced and thus the performance of the semiconductor device can be enhanced.

Furthermore, according to the semiconductor device of the Second Embodiment, it is unnecessary, for example, to lower the n-type impurity concentration in the n$^-$-type drift layer 2 and to increase the electric resistance of the n$^-$-type drift layer 2, for the purpose of making the intensity of an electric field in the periphery of the bottom portion of the outermost peripheral gate trench TR2 small. Accordingly, the breakdown voltage of the semiconductor device can be enhanced without increasing the ON resistance of the vertical MISFET.

Moreover, the intensity of an electric field in a portion positioned on a peripheral side of the semiconductor substrate SUB is larger than the intensity of an electric field in a portion positioned on the central side of the semiconductor substrate SUB. Accordingly, when the gate wiring-lead-out region AR2 is positioned on a side closer to the periphery of the semiconductor substrate SUB than the cell region AR1, the effect of improving the breakdown voltage becomes larger by the semiconductor device of the Second Embodiment.

Note that the semiconductor device of the Second Embodiment may have the p$^+$-type semiconductor region SA1 in plural number disposed between the mutually adjacent two gate trenches TR1 in the cell region AR1 in the same way as the semiconductor device of the First Embodiment. Thereby, as is the case for the First Embodiment, even when the space between the mutually adjacent two gate trenches TR1 is widened, the intensity of an electric field in the periphery of the bottom portion of respective gate trenches TR1 can easily be made small. Accordingly, it is possible to enhance the breakdown voltage of the semiconductor device and to enhance the performance of the semiconductor device.

In addition, in the Second Embodiment, for example, the conductivity type of each of the n$^{++}$-type drain layer 1, the n$^-$-type drift layer 2, the p-type well layer 31, the peripheral guard ring layers 32 and 33, and the p$^+$-type semiconductor regions SA7, SA8 and SA9 may be changed to the inverse conductivity type as a whole. In this case, the semiconductor device resultantly has the same effect as the semiconductor device of the Second Embodiment by each of the n$^+$-type semiconductor regions having the inverse conductivity type relative to the conductivity type of each of the p$^+$-type semiconductor regions SA7, SA8 and SA9.

Hereinbefore, the invention achieved by the present inventor has been explained specifically based on the embodiments, but it is needless to say that the present invention is not limited to the above-described embodiments but may be changed variously within the scope not departing from the gist thereof.

For example, in the embodiment, the case where the semiconductor substrate SUB is constituted of an n-type semiconductor as the same conductivity type as the conductivity type of the n$^-$-type drift layer 2 was explained. However, the semiconductor substrate SUB is not limited to the case where it is constituted of an n-type semiconductor as the same conductivity type as the conductivity type of the n$^-$-type drift layer 2. Accordingly, the semiconductor substrate SUB may be one constituted of a p-type semiconductor as a conductivity type different from the conductivity type of the n$^-$-type drift layer 2. That is, the above-described embodiment is applicable to semiconductor devices including an Insulated Gate Bipolar Transistor (IGBT).

What is claimed is:
1. A semiconductor device, comprising:
a semiconductor substrate;
a first semiconductor layer of a first conductivity type, which is formed on a first main surface side of the semiconductor substrate;
a second semiconductor layer of a second conductivity type, which is formed over the first semiconductor layer and which is different from the first conductivity type;
a first trench portion which penetrates through the second semiconductor layer to thereby reach the first semiconductor layer;
a second trench portion, in plan view, which is disposed spaced apart from the first trench portion, and which penetrates through the second semiconductor layer to thereby reach the first semiconductor layer;
a first gate insulating film formed on an inner wall of the first trench portion;
a second gate insulating film formed on an inner wall of the second trench portion;
a first gate electrode formed so as to be embedded in the first trench portion over the first gate insulating film;
a second gate electrode formed so as to be embedded in the second trench portion over the second gate insulating film;
a first semiconductor region of the first conductivity type, which is in contact with the second semiconductor layer in a portion positioned between the first trench portion and the second trench portion and in contact with the first gate insulating film;
a second semiconductor region of the first conductivity type, which is in contact with the second semiconductor layer in a portion positioned between the first trench portion and the second trench portion and in contact with the second gate insulating film;
a third semiconductor region of the second conductivity type, which is formed in the second semiconductor layer in a portion positioned between the first trench portion and the second trench portion; and
a fourth semiconductor region of the second conductivity type, the whole fourth semiconductor region is formed separated from the third semiconductor region in the second semiconductor layer and the whole fourth semiconductor region is formed in a portion of the second semiconductor layer positioned between the third semiconductor region and the second trench portion, wherein a first transistor is formed by the first semiconductor layer, the second semiconductor layer in a portion positioned between the first trench portion and the second trench portion, the first gate insulating film, the first gate electrode, and the first semiconductor region, wherein a second transistor is formed by the first semiconductor layer, the second semiconductor layer in a portion positioned between the first trench portion and the second trench portion, the second gate insulating film, the second gate electrode, and the second semiconductor region, and wherein both an impurity concentration of the second conductivity type in the third semiconductor region and an impurity concentration of the second conductivity type in the fourth semiconductor region are greater than an impurity concentration of the second conductivity type in the second semiconductor layer.

2. The semiconductor device according to claim 1, wherein both the third semiconductor region and the fourth semiconductor region are in contact with the first semiconductor layer.

3. The semiconductor device according to claim 1, comprising:
a first electrode that is in contact with the second semiconductor layer in a portion positioned between the first trench portion and the second trench portion and with the first semiconductor region; and
a second electrode in contact with the second semiconductor layer in a portion positioned between the first electrode and the second trench portion and with the second semiconductor region,
wherein:
the third semiconductor region is in contact with the first electrode; and
the fourth semiconductor region is in contact with the second electrode.

4. The semiconductor device according to claim 1, wherein:
the third semiconductor region includes:
a fifth semiconductor region of the second conductivity type, which is formed in the second semiconductor layer in a portion positioned between the first trench portion and the second trench portion; and
a sixth semiconductor region of the second conductivity type, which is formed in the second semiconductor layer in a portion positioned over the fifth semiconductor region and which is in contact with the fifth semiconductor region,
the fourth semiconductor region includes:
a seventh semiconductor region of the second conductivity type, which is formed in the second semiconductor layer in a portion positioned between the third semiconductor region and the second trench portion; and
an eighth semiconductor region of the second conductivity type, which is formed in the second semiconductor layer in a portion positioned over the seventh semiconductor region and which is in contact with the seventh semiconductor, and
any of an impurity concentration of the second conductivity type in the fifth semiconductor region, an impurity concentration of the second conductivity type in the sixth semiconductor region, an impurity concentration of the second conductivity type in the seventh semiconductor region, and an impurity concentration of the second conductivity type in the eighth semiconductor region is higher than an impurity concentration of the second conductivity type in the second semiconductor layer.

5. The semiconductor device according to claim 1, wherein:
the third semiconductor region includes:
a fifth semiconductor region of the second conductivity type, which is formed in the second semiconductor layer in a portion positioned between the first trench portion and the second trench portion; and
a sixth semiconductor region of the second conductivity type, which is formed to be separated from the fifth semiconductor region in the second semiconductor layer in a portion positioned over the fifth semiconductor region,
the fourth semiconductor region includes:
a seventh semiconductor region of the second conductivity type, which is formed in the second semiconductor layer in a portion positioned between the third semiconductor region and the second trench portion; and
an eighth semiconductor region of the second conductivity type, which is formed to be separated from the seventh semiconductor region in the second semiconductor layer in a portion positioned over the seventh semiconductor region, and
any of an impurity concentration of the second conductivity type in the fifth semiconductor region, an impurity concentration of the second conductivity type in the sixth semiconductor region, an impurity concentration of the second conductivity type in the seventh semiconductor region, and an impurity concentration of the second conductivity type in the eighth semiconductor region is higher than an impurity concentration of the second conductivity type in the second semiconductor layer.

6. The semiconductor device according to claim 1, wherein:
in plan view, the third semiconductor region is formed in the second semiconductor layer in a portion positioned on a side closer to the first trench portion than a middle of the first trench portion and the second trench portion; and
in plan view, the fourth semiconductor region is formed in the second semiconductor layer in a portion positioned on a side closer to the second trench portion than a middle of the first trench portion and the second trench portion.

7. The semiconductor device according to claim 1, wherein the first semiconductor layer is formed on the first main surface side of the semiconductor substrate in a first region and a second region of the first main surface of the semiconductor substrate;
wherein the second semiconductor layer is formed over the first semiconductor layer in the first region;
wherein the semiconductor device further includes:
in the second region, a third semiconductor layer of the second conductivity type that is formed over the first semiconductor layer;
a third trench portion that penetrates through the third semiconductor layer to thereby reach the first semiconductor layer;
a third gate insulating film formed on an inner wall of the third trench portion;
a third gate electrode formed so as to be embedded in the third trench portion over the third gate insulating film;

a ninth semiconductor region of the second conductivity type that is formed in the third semiconductor layer in a portion positioned in the periphery of the third trench portion;
an interlayer insulating film formed so as to cover the third gate electrode and the third semiconductor layer;
a fourth trench portion that penetrates through the interlayer insulating film to thereby reach the third gate electrode; and
a third electrode formed inside the fourth trench portion and over the interlayer insulating film, and that is electrically coupled to the third gate electrode;
wherein the third gate electrode is electrically coupled to the first gate electrode and the second gate electrode; and
wherein an impurity concentration of the second conductivity type in the ninth semiconductor region is higher than an impurity concentration of the second conductivity type in the third semiconductor layer.

8. The semiconductor device according to claim 7,
wherein the second region is positioned on a side closer to an outer periphery of the semiconductor substrate than the first region.

9. The semiconductor device according to claim 8,
wherein the ninth semiconductor region is formed in the third semiconductor layer in a portion positioned on a side closer to an outer periphery of the semiconductor substrate than the third trench portion.

10. The semiconductor device according to claim 8,
wherein the first trench portion and the second trench portion extend respectively, in plan view, in a first direction;
wherein the third trench portion and the fourth trench portion extend respectively, in plan view, in a second direction intersecting with the first direction;
wherein the semiconductor device further includes:
   a fifth trench portion that extends, in plan view, in the second direction in the second region, and that penetrates through the third semiconductor layer in a portion positioned on a side closer to the first region than the third trench portion to thereby reach the first semiconductor layer;
   a fourth gate insulating film formed on an inner wall of the fifth trench portion; and
   a fourth gate electrode formed so as to be embedded in the fifth trench portion over the fourth gate insulating film;
wherein the fourth gate electrode is electrically coupled to the first gate electrode and the second gate electrode; and
wherein the ninth semiconductor region is formed in the third semiconductor layer in a portion positioned between the third trench portion and the fifth trench portion.

11. The semiconductor device according to claim 10,
wherein:
the device has a tenth semiconductor region of the second conductivity type that is formed in the third semiconductor layer in a portion positioned between the ninth semiconductor region and the fifth trench portion; and
an impurity concentration of the second conductivity type in the tenth semiconductor region is higher than an impurity concentration of the second conductivity type in the third semiconductor layer.

12. The semiconductor device according to claim 1,
wherein:
the semiconductor substrate includes a semiconductor of the first conductivity type; and
the semiconductor device further has a drain electrode that is electrically coupled to the semiconductor substrate.

13. A semiconductor device, comprising:
a semiconductor substrate;
a first semiconductor layer of a first conductivity type that is formed, in a first region and a second region of a first main surface of the semiconductor substrate, on the first main surface side of the semiconductor substrate;
a second semiconductor layer of a second conductivity type different from the first conductivity type, formed over the first semiconductor layer in the first region;
a first trench portion that penetrates through the second semiconductor layer to thereby reach the first semiconductor layer;
a first gate insulating film formed on an inner wall of the first trench portion;
a first gate electrode formed so as to be embedded in the first trench portion over the first gate insulating film;
a first semiconductor region of the first conductivity type that is in contact with the second semiconductor layer in a portion positioned in a periphery of the first trench portion and with the first gate insulating film;
a third semiconductor layer of the second conductivity type that is formed in an upper layer portion of the first semiconductor layer in the second region;
a second trench portion that penetrates through the third semiconductor layer to thereby reach the first semiconductor layer;
a second gate insulating film formed on an inner wall of the second trench portion;
a second gate electrode formed so as to be embedded in the second trench portion over the second gate insulating film;
a second semiconductor region of the second conductivity type that is formed in the third semiconductor layer in a portion positioned in a periphery of the second trench portion;
an interlayer insulating film formed so as to cover the second gate electrode and the third semiconductor layer;
a third trench portion that penetrates through the interlayer insulating film to thereby reach the second gate electrode; and
a first electrode that is formed inside the third trench portion and over the interlayer insulating film, and that is electrically coupled to the second gate electrode,
wherein:
a first transistor is formed by the first semiconductor layer, the second semiconductor layer in a portion positioned in a periphery of the first trench portion, the first gate insulating film, the first gate electrode and the first semiconductor region;
the second gate electrode is electrically coupled to the first gate electrode; and
an impurity concentration of the second conductivity type in the second semiconductor region is higher than an impurity concentration of the second conductivity type in the third semiconductor layer.

14. The semiconductor device according to claim 13,
wherein the second region is positioned on a side closer to a periphery of the semiconductor substrate than the first region.

15. The semiconductor device according to claim 14,
wherein the second semiconductor region is formed in the third semiconductor layer in a portion positioned on a side closer to an outer periphery of the semiconductor substrate than the second trench portion.

16. The semiconductor device according to claim 14,
wherein:
the first trench portion extends, in plan view, in a first direction;
the second trench portion and the third trench portion extend respectively, in plan view, in a second direction intersecting with the first direction;
the semiconductor device furthermore has:
- a fourth trench portion that, in plan view, extends in the second direction, and that penetrates through the third semiconductor layer in a portion positioned on a side closer to the first region than the second trench portion to thereby reach the first semiconductor layer, in the second region;
- a third gate insulating film formed on an inner wall of the fourth trench portion; and
- a third gate electrode formed so as to be embed in the fourth trench portion over the third gate insulating film;

the third gate electrode is electrically coupled to the first gate electrode; and
the second semiconductor region is formed in the third semiconductor layer in a portion positioned between the second trench portion and the fourth trench portion.

17. The semiconductor device according to claim 16, further comprising:
a third semiconductor region of the second conductivity type that is formed in the third semiconductor layer in a portion positioned between the second semiconductor region and the fourth trench portion,
wherein an impurity concentration of the second conductivity type in the third semiconductor region is higher than an impurity concentration of the second conductivity type of the third semiconductor layer.

18. The semiconductor device according to claim 14, further comprising:
a fourth semiconductor layer of the second conductivity type that is formed in an upper layer portion of the third semiconductor layer in a portion positioned on a side closer to an outer periphery of the semiconductor substrate than the second semiconductor region in the second region; and
a fourth semiconductor region of the second conductivity type that is formed in the fourth semiconductor layer;
wherein an impurity concentration of the second conductivity type in the fourth semiconductor region is higher than an impurity concentration of the second conductivity type in the fourth semiconductor layer.

19. The semiconductor device according to claim 1,
wherein the first trench portion and the second trench portion extend respectively, in plan view, in a first direction,
wherein a distance between the third semiconductor region and the first trench portion is 0.5 to 1.5 µm in a second direction perpendicular to the first direction, and
wherein a distance between the fourth semiconductor region and the second trench portion is 0.5 to 1.5 µm in a second direction perpendicular to the first direction.

* * * * *